US011088143B2

(12) United States Patent
Kim et al.

(10) Patent No.: US 11,088,143 B2
(45) Date of Patent: Aug. 10, 2021

(54) SEMICONDUCTOR AND MANUFACTURING METHOD OF THE SAME

(71) Applicant: Samsung Electronics Co., Ltd., Suwon-si (KR)

(72) Inventors: Hyosub Kim, Seoul (KR); Keunnam Kim, Yongin-si (KR); Dongoh Kim, Daegu (KR); Bongsoo Kim, Yongin-si (KR); Euna Kim, Seoul (KR); Chansic Yoon, Anyang-si (KR); Kiseok Lee, Hwaseong-si (KR); Hyeonok Jung, Daejeon (KR); Sunghee Han, Hwaseong-si (KR); Yoosang Hwang, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/896,470

(22) Filed: Jun. 9, 2020

(65) Prior Publication Data

US 2021/0066305 A1 Mar. 4, 2021

(30) Foreign Application Priority Data

Aug. 29, 2019 (KR) .......................... 10-2019-0106645

(51) Int. Cl.
*H01L 27/108* (2006.01)
*H01L 23/528* (2006.01)

(52) U.S. Cl.
CPC .... *H01L 27/10814* (2013.01); *H01L 23/5283* (2013.01); *H01L 27/10888* (2013.01)

(58) Field of Classification Search
CPC ......... H01L 27/10814; H01L 27/10888; H01L 23/5283; H01L 27/10876; H01L 27/10823
See application file for complete search history.

(56) References Cited

U.S. PATENT DOCUMENTS

| 8,309,460 | B2 | 11/2012 | Kim et al. |
| 8,969,936 | B2 | 3/2015 | Lee et al. |
| 9,230,612 | B2 | 1/2016 | Park |
| 9,379,114 | B2 | 6/2016 | Jeong et al. |
| 9,425,200 | B2* | 8/2016 | Hwang ............... H01L 27/2436 |
| 9,478,548 | B2 | 10/2016 | Lee et al. |
| 9,634,012 | B2 | 4/2017 | Park et al. |
| 9,831,172 | B2 | 11/2017 | Kim et al. |
| 2018/0350611 | A1 | 12/2018 | Kim et al. |

FOREIGN PATENT DOCUMENTS

| KR | 10-2016-0016171 A | 2/2016 |
| KR | 10-2016-0073700 A | 6/2016 |

* cited by examiner

*Primary Examiner* — David Vu

(74) *Attorney, Agent, or Firm* — Muir Patent Law, PLLC

(57) ABSTRACT

A semiconductor device includes: an active region defined by a device isolation layer formed in a substrate; a word line configured to cross the active region, the word line extending in a first direction and being formed in the substrate; a bit line extending in a second direction perpendicular to the first direction on the word line; a first contact connecting the bit line to the active region; a first mask for forming the active region, the first mask being formed on the active region; and a second mask of which a height of a top surface thereof is greater than a height of a top surface of the active region, the second mask covering the word line, wherein the active region has a bar shape that extends to form an acute angle with respect to the first direction.

16 Claims, 63 Drawing Sheets

I-I'

I-I'

II-II'

I-I'

I-I'

II-II'

I-I'

SEMICONDUCTOR AND MANUFACTURING METHOD OF THE SAME

CROSS-REFERENCE TO RELATED APPLICATION

This application claims the benefit of Korean Patent Application No. 10-2019-0106645, filed on Aug. 29, 2019, in the Korean Intellectual Property Office, the disclosure of which is incorporated herein in its entirety by reference.

BACKGROUND

The inventive concept provides a semiconductor device and a manufacturing method of the same, and more particularly, a semiconductor device including self-aligned contacts in an active region and a manufacturing method of the semiconductor device.

As the degree of integration of semiconductor devices increases, the design rules for components of the semiconductor devices decrease. Accordingly, in a highly scaled semiconductor device, a contact forming process for connecting a plurality of wiring lines to the active region also becomes increasingly complicated and difficult. For example, a decrease in a space for the contact causes an increase in misalignment between the contact and the active region, and accordingly, a decrease in mass production margin occurs.

SUMMARY

The disclosed embodiments provide a semiconductor device with reduced misalignment between contacts and an active region, and a manufacturing method of the same.

According to an aspect of the inventive concept, a semiconductor device includes: an active region defined by a device isolation layer formed in a substrate; a word line configured to cross the active region, the word line extending in a first direction and being formed in the substrate; a bit line extending in a second direction perpendicular to the first direction on the word line; a first contact connecting the bit line to the active region; a first mask for forming the active region, the first mask being formed on the active region; and a second mask of which a height of a top surface thereof is greater than a height of a top surface of the active region, the second mask covering the word line, wherein the active region has a bar shape that extends to form an acute angle with respect to the first direction.

In addition, according to aspects of the inventive concept, a semiconductor device includes: an active region defined by a device isolation layer formed in a substrate; a word line configured to cross the active region, the word line including a buried structure extending in a first direction; a bit line extending in a second direction perpendicular to the first direction on the word line; a capacitor on a top portion of the bit line; a first contact connecting the bit line to the active region; a second contact connecting the capacitor to the active region; a first mask for forming the active region, the first mask having at least a portion thereof remain on the active region; and a second mask of which a height of a top surface thereof is greater than a top surface of the active region, the second mask covering the word line, wherein the active region has a shape extending in an oblique direction with respect to the first direction, and the first contact has a shape in which a width in the oblique direction narrows toward a bottom portion of the first contact.

Further, according to aspects of the inventive concept, there a manufacturing method of a semiconductor device includes: defining an active region by forming a device isolation layer on a substrate by using a first mask; forming a trench in the substrate crossing the active region and extending in a first direction, and by applying an insulating layer to form a conductive layer filling a bottom portion of the trench, forming a buried word line; forming a second mask filling a top portion of the trench on the word line; by using the first mask and the second mask, recessing the device isolation layer such that side surfaces of a top portion of the active region are exposed; forming a mask pattern exposing the first mask of a portion corresponding to the center of the active region, and by using the mask pattern, forming a contact hole by removing the exposed first mask and a top portion of the active region under the first mask; forming a stop insulating layer and a gap fill insulating layer on an entire surface of the substrate, and by removing a portion of the gap fill insulating layer, forming a buffer insulating layer filling a space between two first masks adjacent to each other in the first direction; forming a first contact by filling the contact hole with a conductive layer; and forming a bit line extending in a second direction perpendicular to the first direction on the word line, the bit line being connected to the first contact, wherein the active region has a shape extending in an oblique direction with respect to the first direction, and wherein the first contact is self-aligned to the active region by the first mask and the second mask that are arranged around the contact hole.

BRIEF DESCRIPTION OF THE DRAWINGS

Embodiments of the inventive concept will be more clearly understood from the following detailed description taken in conjunction with the accompanying drawings in which:

FIGS. 4A-4C, 5A-5C, 6A-16A, 6B-16B, 6C-16C, and 6D-16D are plan views and cross-sectional views illustrating a process of manufacturing the semiconductor device of FIG. 1A;

DETAILED DESCRIPTION OF THE EMBODIMENTS

Figure 1A:
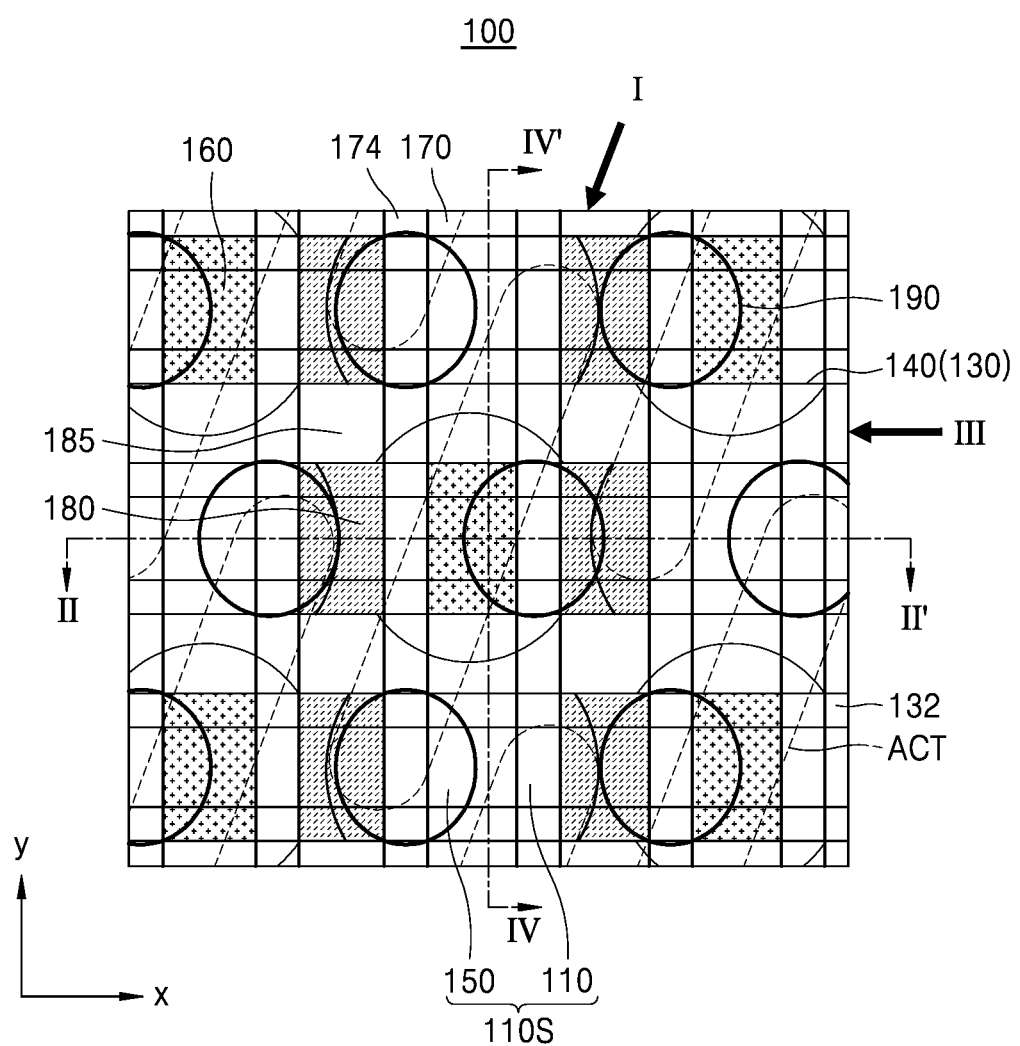
FIGS. 1A through 1D are plan views and cross-sectional views of a semiconductor device, according to an embodiment of the inventive concept.

Hereinafter, embodiments of the inventive concept will be described in detail with reference to the accompanying drawings. Identical reference numerals are used for the same constituent elements in the drawings, and duplicate descriptions thereof are omitted.

Figure 1B:
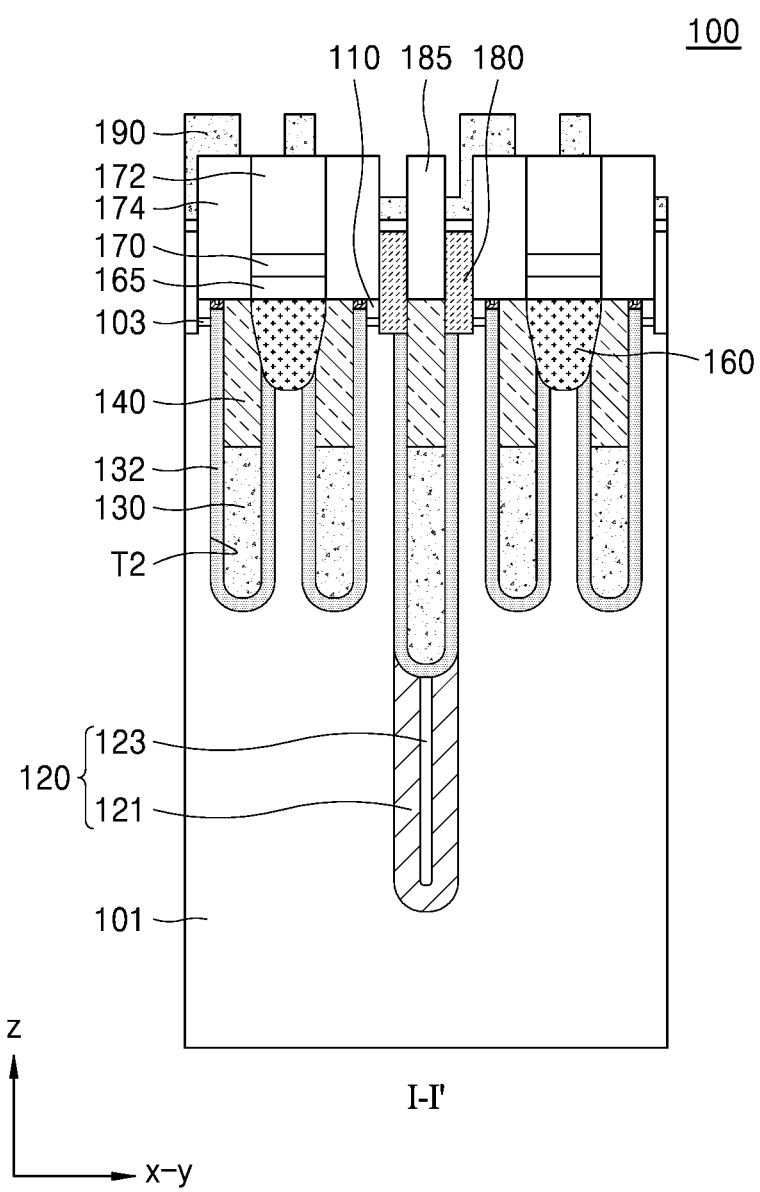
Figure 1C:
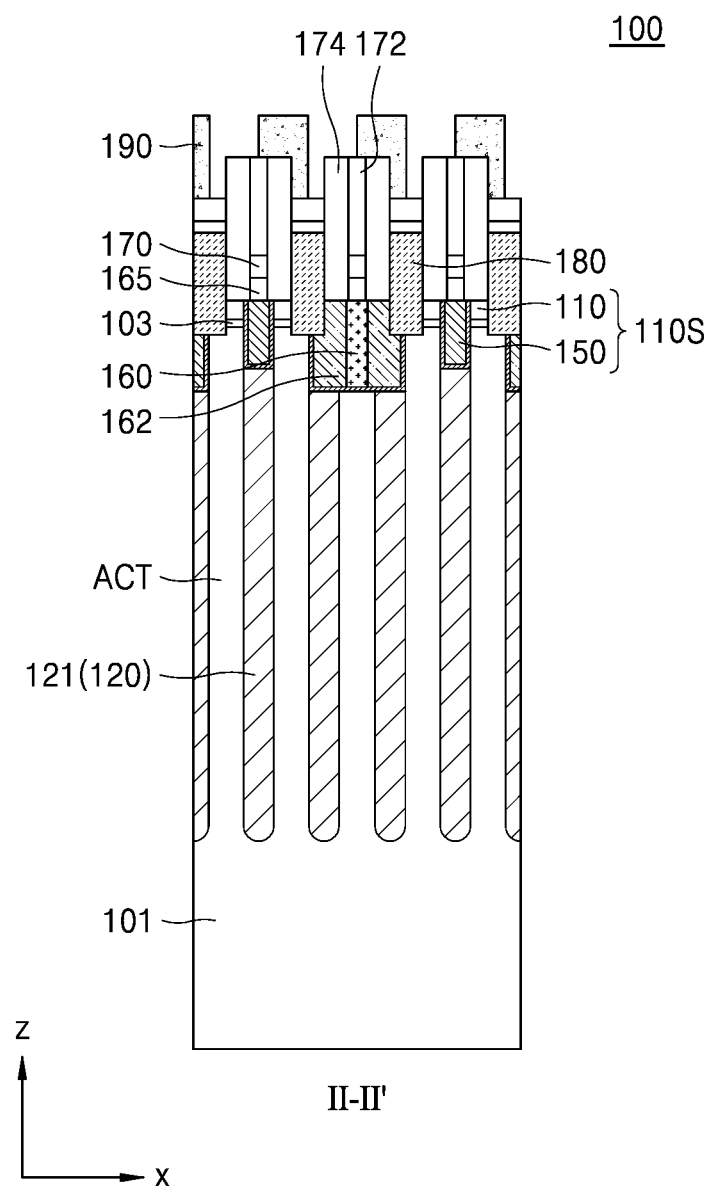
Figure 1D:
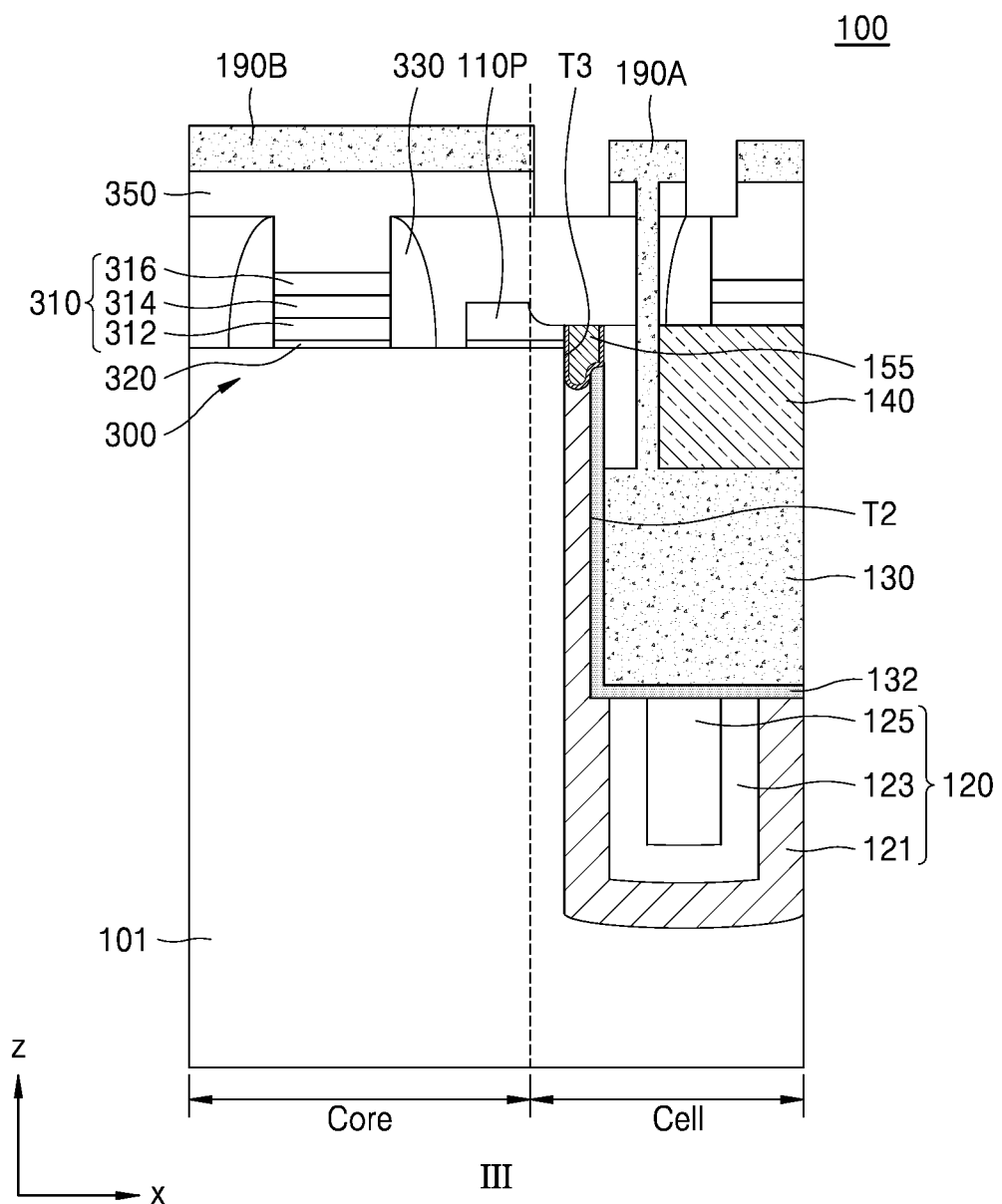

FIGS. 1A through 1D are plan views and cross-sectional views of a semiconductor device 100, according to an embodiment of the inventive concept. The semiconductor device may be, for example, a semiconductor chip including an integrated circuit formed on a die, where the various figures show only a representative portion of the semiconductor device. Here, FIG. 1B is a cross-sectional view centering on the device isolation region 120 between two active regions ACT in a direction I in which an active region ACT extends in the semiconductor device 100 of FIG. 1A, FIG. 1C is a cross-sectional view of II-II' section in FIG. 1A, and FIG. 1D is a cross-sectional view of a boundary portion between a cell region and a core region in a direction III in which a word line extends in the semiconductor device 100 of FIG. 1A.

Figure 4A:
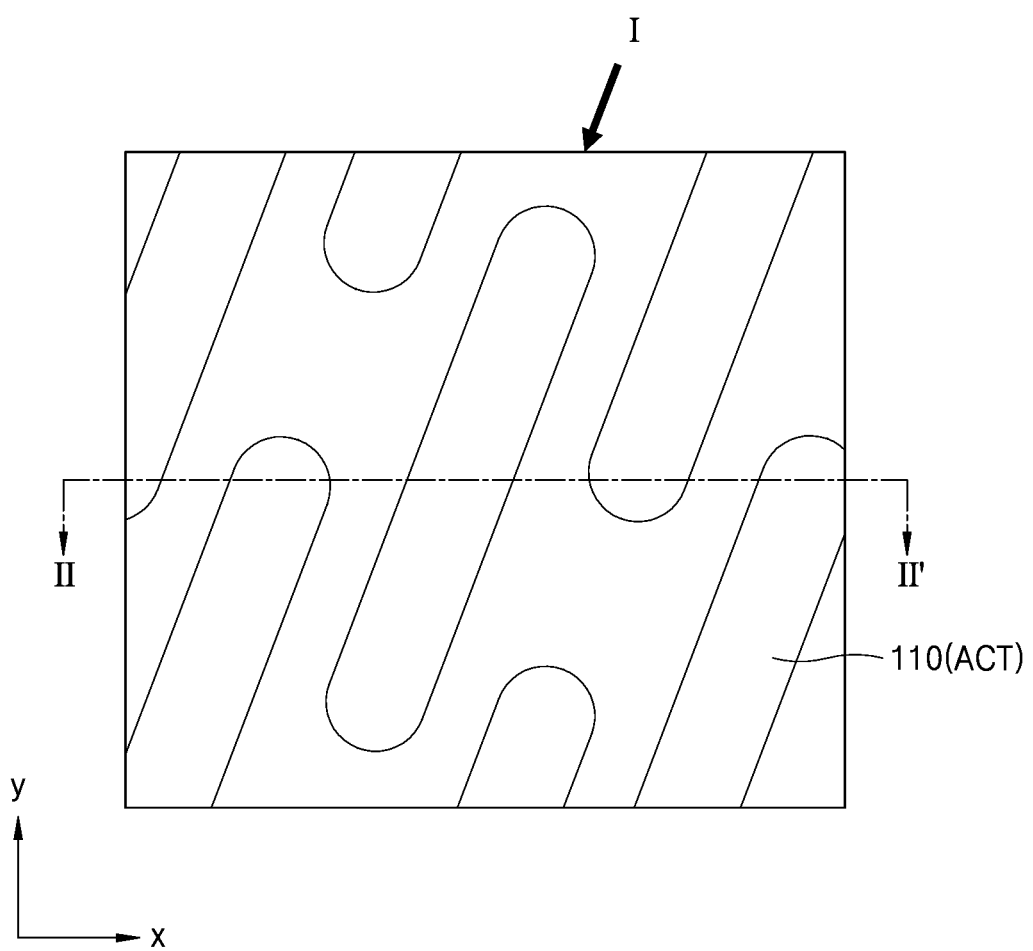

Referring to FIGS. 1A through 1D, the semiconductor device 100 of the present example embodiment may include a plurality of active regions ACT defined by a device isolation layer 120 in a substrate 101. As illustrated in FIG. 4A, the active region ACT may have a bar shape that extends in an oblique line direction (x-y direction) with respect to a first direction (x direction) or a second direction (y direction) in a top-down view of a top surface of the semiconductor device 100. It should be noted that FIGS. 1B and 4B (and other "B" figures) actually spans two active regions having a device isolation layer 20 therebetween, which would include an entire second active region along line I-I' in FIG. 1A, 4A, etc. (if the figure were continued and line I-I' were extended to include a second active region).

The device isolation layer 120 may be formed by forming a trench in a top portion of the substrate 101 and filling the trench with an insulating layer. As illustrated in FIGS. 1B through 1D, according to a width in the first direction (x direction), the device isolation layer 120 may include a first structure including only a first insulating layer 121, a second structure including the first insulating layer 121 and a second insulating layer 123, and a third structure including the first insulating layer 121, the second insulating layer 123, and a third insulating layer 125. At least one of the first insulating layer 121, the second insulating layer 123, and the third insulating layer 125 may include, or be formed of, a different material from each of the other two insulating layers. For example, the first insulating layer 121 and the third insulating layer 125 may include or may be an oxide layer, while the second insulating layer 123 includes or is a nitride layer. However, the materials of the first insulating layer 121, the second insulating layer 123, and the third insulating layer 125 are not limited thereto.

For reference, the device isolation layer 120 may be formed wide and deep between the active regions ACT in the oblique direction (x-y direction) in which the active region ACT extends. In addition, the device isolation layer 120 may also be formed wide and deep at a boundary between the cell region Cell and the core region Core. The device isolation layer 120 may be formed to have various widths and depths in the core region Core. For example, the device isolation layer 120 between the active regions ACT in the oblique direction (x-y direction) may have the second structure, and be formed wider and deeper than the first structure. In the semiconductor device 100 of the present example embodiment, the core region Core may be a ferry region. The core region Core may mean a region between cell regions Cell, and the ferry region may mean a region outside the cell regions Cell (e.g., so that it is not between any two cell regions Cell but is outside an outer boundary that surrounds a plurality of cell regions Cell). However, in general, a region other than a cell region may be described as a core region or a core/ferry region. In semiconductor devices 100 and 100a through 100d of the present example embodiment and subsequent example embodiments, the term 'core region Core' may be collectively used.

On the active region ACT, at least a portion of a first mask 110 that is used to form the active region ACT may remain. For example, in FIGS. 1B and 1C, a portion of the first mask 110 may remain on a top surface of the active region ACT of a portion where a second contact 180 is connected to the active region ACT. The first mask 110 is described in more detail with reference to FIGS. 2 through 16D.

The semiconductor device 100 of the present example embodiment may include a plurality of word lines 130 extending parallel to each other in the first direction (x direction) across the active region ACT. The word line 130 may be arranged at equal intervals in the second direction (y direction) and may be formed in a structure buried in the substrate 101. For example, the word line 130 may be formed in a shape to fill a bottom portion of the trench formed in the substrate 101, and a top surface of the word line 130 may be lower than the top surface of the active region ACT. On the other hand, as illustrated in FIG. 1B or 1D, the word line 130 having a relatively wide width on the device isolation layer 120 may be formed deeper than the word line 130 of other portions.

The gate insulating layer 132 may be between the word line 130 and the active region ACT. In addition, impurity ions may be implanted into the active region ACT on both sides of the word line 130, and source/drain regions may be formed. Accordingly, the word lines 130 and the source/drain regions on both sides of the word lines 130 may form a buried cell array transistor (BCAT). In some embodiments, the word line 130 may include at least one of Ti, TiN, Ta, TaN, W, WN, TiSiN, and WSiN. However, the material of the word line 130 is not limited thereto. The gate insulating layer 132 may include at least one of a silicon oxide layer, a silicon nitride layer, a silicon oxynitride layer, an oxide/nitride/oxide (ONO) layer, and a high dielectric layer having a higher dielectric constant than the silicon oxide layer. The gate insulating layer 132 is not limited thereto.

A second mask 140 may be on the word line 130 in the trench. The gate insulating layer 132 may also be between the second mask 140 and the active region ACT. As illustrated in FIG. 1B, a height of a top surface of the second mask 140 may be equal to or greater than a height of a top surface of the active region ACT. For example, the height of the top surface of the second mask 140 may be substantially the same as a height of the top surface of the first mask 110 on the active region ACT. Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise. However, in some embodiments, the top surface of the second mask 140 may be lower than the top surface of the first mask 110. The second mask 140 is described in more detail with reference to FIGS. 2 through 16D.

The semiconductor device 100 according to the present example embodiment may include a plurality of bit lines 170 extending parallel to each other in the second direction (y direction) perpendicular to the word line 130 on the word line 130. The plurality of bit lines 170 may be arranged at equal intervals in the first direction (x direction). Since FIG. 1B is a cross-section taken in an oblique direction (x-y direction) in which the active region ACT extends, a width of the bit line 170 in FIG. 1B is illustrated as greater than a width of the bit line 170 in FIG. 1C.

A cap insulating layer 172 may be on the bit line 170, and a bit line spacer 174 may be on both sides of the bit line 170 in the first direction (x direction). The bit line spacer 174 may extend in the second direction (y direction) like the bit line 170. Although the bit line spacer 174 is illustrated as one layer in FIGS. 1B and 1C, the bit line spacer 174 may include a multilayer having at least two layers. In some embodiments, the multilayer of the bit line spacer 174 may include at least one air gap.

The semiconductor device 100 according to the present example embodiment may include a first contact 160 electrically connecting the bit line 170 to the active region ACT. The first contact 160 may be under the bit line 170. As illustrated in FIG. 1B, a width of the first contact 160 in the diagonal direction (x-y direction) may narrow toward a bottom side thereof. In addition, as illustrated in FIG. 1C, a width of the first contact 160 in the first direction (x direction) may be substantially the same as that on the bottom side and a top side thereof. The first contact 160 may be formed in a shape in which the first contact 160 is self-aligned to the active region ACT by using the first mask 110 and the second mask 140. The shape and a forming method of the first mask 110 are described in more detail with reference to FIGS. 2 through 16D.

A pass conductive layer 165 may be between the bit line 170 and the first contact 160. The pass conductive layer 165 may extend in the second direction (y direction) like the bit line 170 and may electrically connect the bit line 170 to the first contact 160. Protective insulating layers 162 may be on both (e.g., opposite) side surfaces of the first contact 160 in the first direction (x direction). The first contact 160 may be electrically insulated from the second contact 180 via the protective insulating layer 162 and may also be insulated from the active region ACT. Here, the second contact 180 may be a contact connecting a capacitor (not illustrated) to the active region ACT. For reference, the first contact 160 may be generally referred to as a direct contact (DC), and the second contact 180 may be referred to as a buried contact (BC). The pass conductive layer 165 may extend in they direction while covering the first contact 160, and may be integrally formed with the first contact 160 or may be formed as a layer separate from the first contact 160. The active region ACT having a bar shape may be included in a cell region CELL, and a core region CORE may surround the cell region CELL. In addition, a transistor in the core region CORE may comprise a gate electrode layer corresponding to the pass conductive layer 165.

Figure 2:
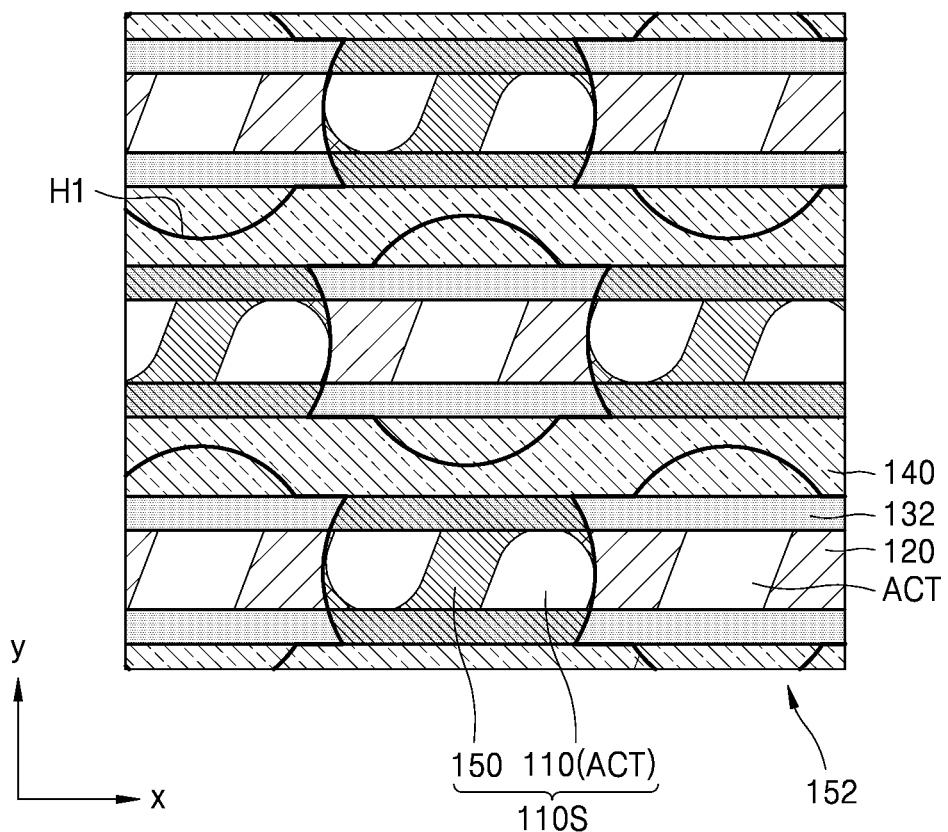
FIG. 2 is a plan view illustrating a concept of self-alignment of a first contact in a semiconductor device of FIG. 1A.

The semiconductor device 100 according to the present example embodiment may include a buffer insulating layer 150 that is alternately arranged with the first contact 160 in the first direction (x direction) and the second direction (y direction). For example, as illustrated in FIG. 2, in the first direction (x direction), the first contact 160 and the buffer insulating layer 150 may be alternately arranged, and in addition, in the second direction (y direction), the first contact 160 and the buffer insulating layer 150 may be alternately arranged. In FIG. 2, a portion where the active region ACT is exposed may be a portion where the first contact 160 is arranged.

The buffer insulating layer 150 may be on the device isolation layer 120, and the first mask 110 may remain on the active region ACT on both sides of a top portion of the buffer insulating layer 150 in the first direction (x direction). The buffer insulating layer 150 and the first mask 110 may constitute a first mask structure 110S. Accordingly, the first mask structure 110S may be alternately arranged with the first contact 160 in the first direction (x direction) similarly to the buffer insulating layer 150, and in addition, in the second direction (y direction), may be alternately arranged with the first contact 160. As illustrated in FIGS. 1A and 1C, in the first direction (x direction), the second contact 180 may be arranged between the first contact 160 and the buffer insulating layer 150 or between the first contact 160 and the first mask structure 110S. In addition, in the second direction (y direction), the word line 130 may be arranged between the first contact 160 and the buffer insulating layer 150 or between the first contact 160 and the first mask structure 110S.

The second contact 180 may be on both sides of the first contact 160 in the first direction (x direction) and penetrate the first mask 110 and a protective insulating layer 162 to be connected to the active region ACT. A fence insulating layer 185 may be between the second contacts 180 in the second direction (y direction). As illustrated in FIG. 1B, the fence insulating layer 185 may be on the word line 130.

The second contact 180 may be connected to a capacitor (not illustrated) via a landing pad 190 that is arranged upward. Accordingly, the capacitor may be electrically connected to the active region ACT via the second contact 180 and the landing pad 190. In FIG. 1A, the landing pad 190 may be indicated by a small circle. In general, when the capacitor is directly connected to the active region ACT via the second contact 180, a region where the second contact 180 contacts the capacitor or the active region ACT may be very small. Accordingly, the landing pad 190 of conductivity may be introduced to enlarge a contact region between the second contact 180 and the active region ACT or the second contact 180 and the capacitor. For example, the landing pad 190 may be between the capacitor and the second contact 180, and based on the landing pad 190, a contact region between the second contact 180 and the active region ACT may be enlarged. In addition, the second contact 180 may have an effect such as an enlargement of a contact region by contacting the capacitor via the landing pad 190.

In the semiconductor device 100 according to the present example embodiment, the first contact 160 may be at the center portion of the active region ACT, and the second contact 180 may be at both (e.g., opposite) ends of the active region ACT. As the second contact 180 is arranged at both ends of the active region ACT, a landing pad 190 may be adjacent to each of both ends of the active region ACT to partially overlap the second contact 180.

The word line 130 may be formed in a structure where the word line 130 is buried in the substrate 101 of the semiconductor device 100 and may be arranged across the active region ACT between the first contact 160 and the second contact 180. As illustrated in FIG. 1A, two word lines 130 may be arranged to cross one active region ACT, and by having the active region ACT arranged in a shape to extend in the oblique direction (x-y direction), the word line 130 and the active region ACT may have an acute angle of less than about 90°.

In addition, in the semiconductor device 100 according to the present example embodiment, a protrusion insulating layer 110P may be formed on the core region Core, and a gap fill insulating layer 155 may be formed on a boundary between the core region Core and the cell region Cell. The protrusion insulating layer 110P may be derived from the first mask 110, and the gap fill insulating layer 155 may be formed when the buffer insulating layer 150 is formed. Accordingly, the protrusion insulating layer 110P may include the same material as the first mask 110, and the gap fill insulating layer 155 may include the same material as the buffer insulating layer 150. A detailed structure of the protrusion insulating layer 110P and the gap fill insulating layer 155 is described in more detail in a process of forming corresponding structures.

In the semiconductor device 100 according to the present example embodiment, the first contact 160 connecting the bit line 170 to the active region ACT may be formed in a shape that is self-aligned to the active region ACT by using the first mask 110 and the second mask 140. Accordingly, the first contact 160 may reduce misalignment with the active region ACT, and thus, may accurately contact the center portion of the active region ACT. As a result, the semiconductor device 100 according to the present example embodiment may greatly contribute to an increase in a mass production margin based on the reduced misalignment of the first contact 160. In addition, a gap fill insulating layer 150 may be formed between the first masks 110 adjacent to each other in the first direction (x direction) and may be formed together with the first mask 110 to constitute the first mask structure 110S. Accordingly, it may be stated that the first mask structure 110S, instead of the first mask 110, together with the second mask 140, is used for self-alignment of the first contact 160.

In the semiconductor device 100 according to the present example embodiment, a mask pattern (refer to 270 in FIGS. 12A through 12D) including a material that is easily removed in an ashing process may be formed, and by using the mask pattern 270, contact holes (refer to H1 through H4 in FIGS. 2 through 3C) for the first contact 160 may be formed in various forms. In addition, based on shapes of the contact holes H1 through H4, the first contact 160 may be easily formed in various forms, while the misalignment of the first contact 160 is reduced by sufficiently securing a critical dimension (CD), for example, the width of the first contact 160 in the first direction (x direction). Further, after the mask pattern 270 is removed, in the process of forming the gap fill insulating layer 150 and the first mask structure 110S, by forming a spacer (refer to 157S in FIG. 18B) on a side surface of the first mask structure 110S, the width of the first contact 160 in the first direction (x direction) may be adjusted.

FIG. 2 is a plan view illustrating a concept of self-alignment of the first contact 160 in the semiconductor device 100 of FIG. 1A. Descriptions are given with reference to FIGS. 1A through 1C together, and the descriptions already given with reference to FIGS. 1A through 1C are briefly provided or omitted.

Referring to FIG. 2, in the semiconductor device 100 according to the present example embodiment, the first contact 160 may be formed to be self-aligned to the active region ACT by using the first mask 110 and the second mask 140. FIG. 2 illustrates the contact hole H1 surrounded by the first mask 110 and the second mask 140 before the first contact 160 is formed. The active region ACT and the device isolation layer 120 may be exposed at a bottom of the contact hole H1. The first contact 160 may be formed by filling the contact hole H1 with a conductive material such as polysilicon.

More specifically, the contact hole H1 may be surrounded by the first mask 110 in the first direction (x direction) and may be surrounded by the second mask 140 in the second direction (y direction). In addition, the contact hole H1 may have a structure that narrows toward the bottom portion thereof in the second direction (y direction) or the oblique direction (x-y direction). Thus, the contact hole H1 may have a shape similar to a circular shape at a top portion thereof, but may be shaped like a straight strip extending in the first direction (x direction) at the bottom portion thereof.

The second mask 140 and the gate insulating layer 132 may be exposed between the circle and the straight strip.

The first mask 110 and the second mask 140 may function as an etch stop layer in a planarization process of forming the first contact 160. As described above, two adjacent first masks 110 and the gap fill insulating layer 150 may constitute the first mask structure 110S, and the misalignment of the first contact 160 and a function as an etch stop layer of the first contact 160 may be described by using the first mask structure 110S instead of the first mask 110. Here, the gap fill insulating layer 150 may fill a space between two first masks 110 in the first direction (x direction), and in addition, in the second direction (y direction), may fill a space between the first mask 110 and the second mask 140. In the semiconductor device 100 according to the present example embodiment, the first contact 160 may be formed to be self-aligned to the active region ACT by using the first mask structure 110S and the second mask 140, and accordingly, the misalignment of the first contact 160 with the active region ACT may be reduced.

Figure 3A:
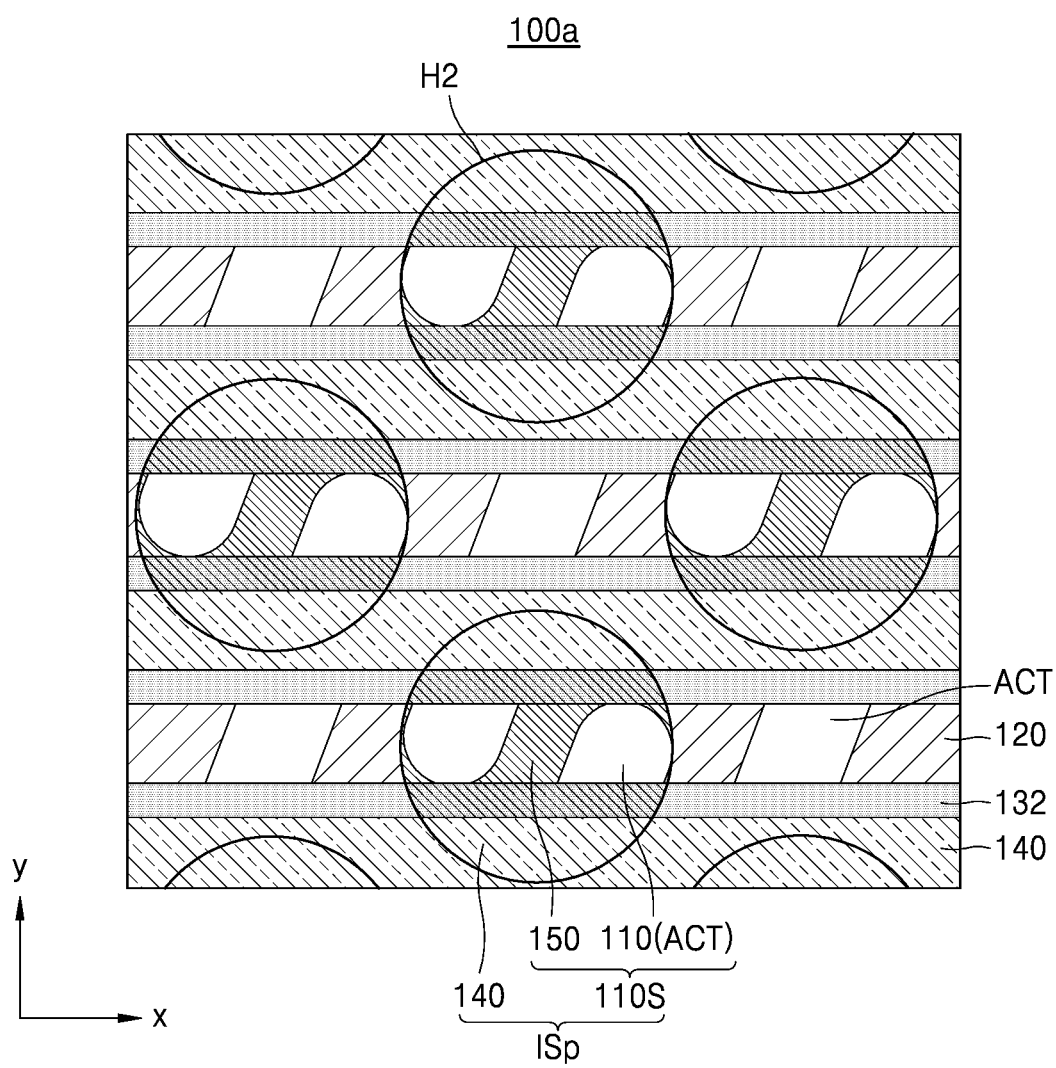
FIGS. 3A through 3C are plan views of a semiconductor device, according to embodiments of the inventive concept.
Figure 3B:
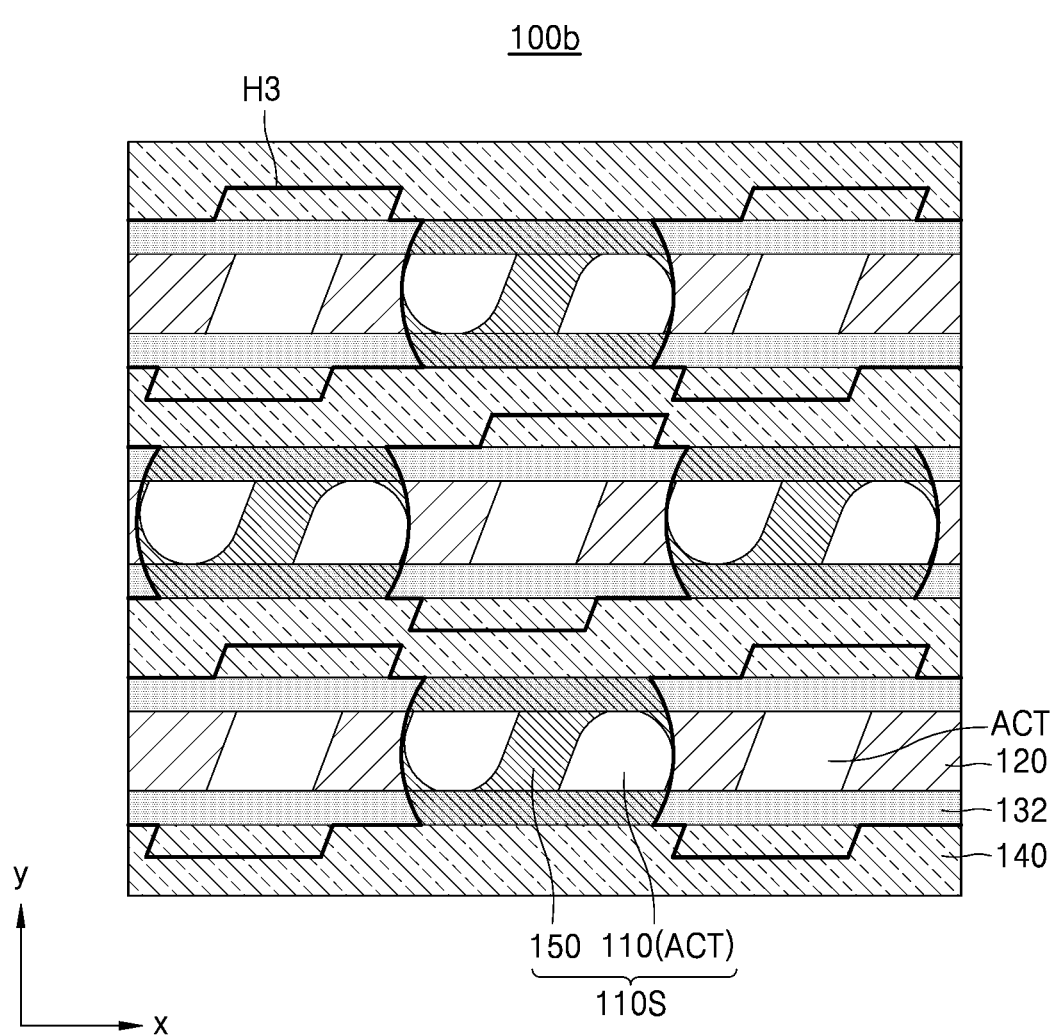
Figure 3C:
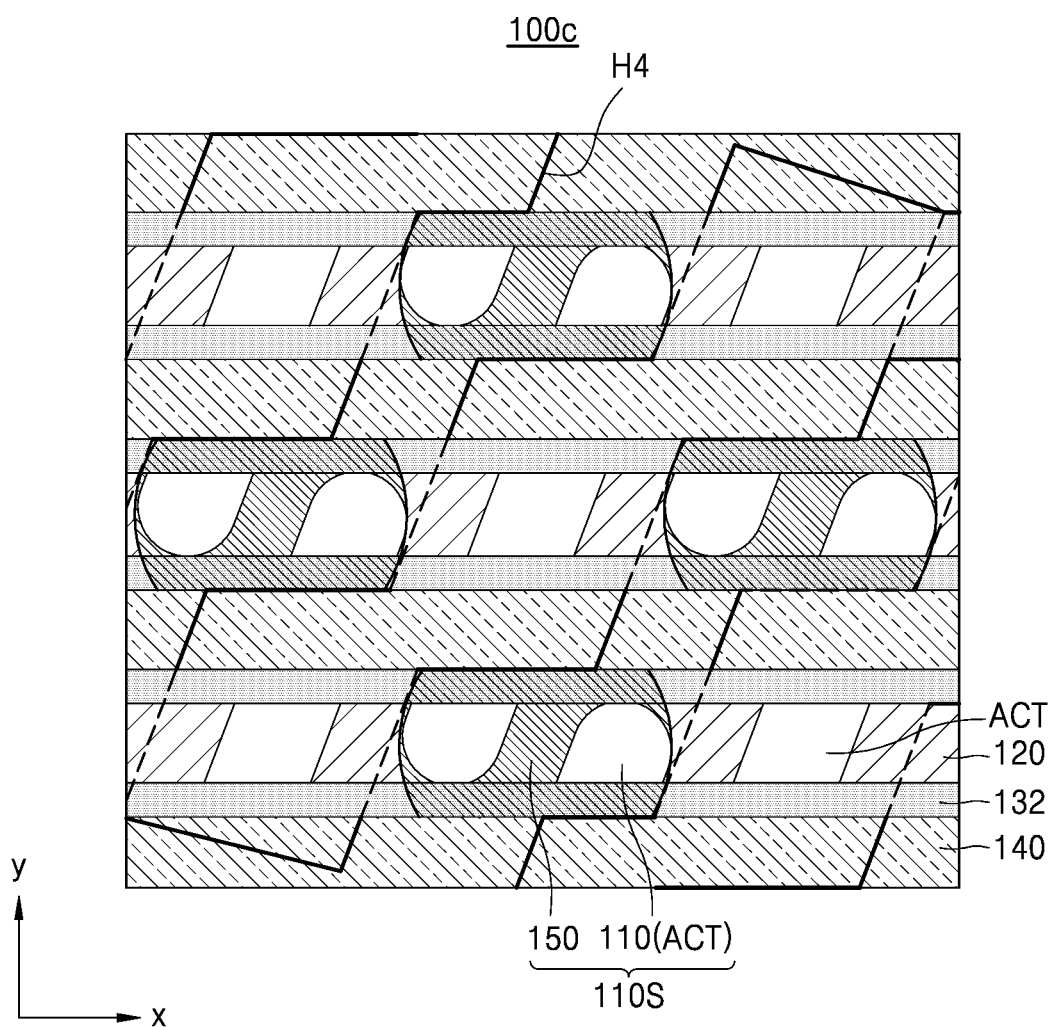

FIGS. 3A through 3C are plan views of semiconductor devices 100a, 100b, and 100c, according to example embodiments, which correspond to FIG. 2. Descriptions are given with reference to FIGS. 1A through 2 together, and the descriptions already given with reference to FIGS. 1A through 2 are briefly provided or omitted.

Referring to FIG. 3A, in the semiconductor device 100a of the present example embodiment, the contact hole H2 for the first contact 160 may be formed in a pillar type. For reference, the contact hole H1 and the first contact 160 corresponding thereto in the semiconductor device 100 of FIG. 2 may be formed in a contact type. In the case of the contact type, a top surface of the contact hole H1 may have a circular or elliptical shape, and the first contact 160 may be formed by filling the contact hole H1. The term 'contact type' may be attributed to the basic structure of general contacts.

On the other hand, the pillar type may be formed such that an insulating layer structure ISp including the first mask structure 110S and the second mask 140 is formed in a circular or elliptical pillar, and portions other than the insulating layer structure ISp are exposed as the contact holes H2. The pillar-type structure may also be formed by filling the contact hole H2 with a conductive material and forming the first contact 160. As illustrated in FIG. 3A, the contact holes H2 may have a structure in which the contact holes H2 are entirely connected to each other, but in a process of forming the pass conductive layer 165 on the first contact 160, the first contacts 160 adjacent to each other in the diagonal direction (x-y direction) may be apart from each other.

When the contact hole H1 of the contact type and the contact hole H2 of the pillar type are compared with each other, the shapes may be similar in the first direction (x direction) but different in the second direction (y direction). When viewed from the top, the contact hole H1 of the contact type may have a convex shape to the outside in both directions of the second direction (y direction). On the other hand, the pillar-shaped contact hole H2 may have a concave shape inwardly in both ways of the second direction (y direction). In addition, the contact holes H1 of the contact type may be formed in a structure in which they are apart from each other, while the pillar-type contact holes H2 may be formed in a structure in which they are connected to each other.

In the semiconductor device 100a according to the present example embodiment, the first contact 160 may also be formed to be self-aligned to the active region ACT by using the first mask structure 110S and the second mask 140, and accordingly, the misalignment of the first contact 160 with the active region ACT may be reduced.

Referring to FIG. 3B, in the semiconductor device 100b of the present example embodiment, the contact hole H3 for the first contact 160 may be formed in a parallelogram type. The contact hole H3 may be surrounded by the first mask structure 110S in both ways of the first direction (x direction). In addition, the contact hole H3 may be surrounded by the second mask 140 in both ways of the second direction (y direction) or the diagonal direction (x-y direction), and may partially extend into the second mask 140. An outer line of the contact hole H3 extending into the second mask 140 may have a straight line shape. The contact hole H3 may extend in the oblique direction (x-y direction), and a shape of the top surface of the contact hole H3 may be similar to the parallelogram. A portion of the contact hole H3 extending into the second mask 140 may overlap a portion of the word line 130 under the second mask 140.

In the semiconductor device 100b according to the present example embodiment, the first contact 160 may also be formed to be self-aligned to the active region ACT by using the first mask structure 110S and the second mask 140, and accordingly, the misalignment of the first contact 160 with the active region ACT may be reduced.

Referring to FIG. 3C, in the semiconductor device 100c of the present example embodiment, the contact hole H4 for the first contact 160 may be formed in a line type. The contact hole H4 may form a line while passing through the second mask 140 in a form of a stairway in an oblique direction, and the contact hole H4 constituting one line and the contact hole H4 constituting another adjacent line may be apart from each other by the first mask structure 110S and the second mask 140. A portion of the contact hole H3 passing through the second mask 140 may entirely overlap the word line 130 under the second mask 140. The contact holes H4 constituting one line have a structure connected to each other, but in a process of forming a pass conductive layer 165 on the first contact 160, the first contacts 160 adjacent to each other in the diagonal direction (x-y direction) may be apart from each other.

In the semiconductor device 100c according to the present example embodiment, the first contact 160 may also be formed to be self-aligned to the active region ACT by using the first mask structure 110S and the second mask 140, and accordingly, the misalignment of the first contact 160 with the active region ACT may be reduced.

FIGS. 4A through 16D are plan views and cross-sectional views illustrating a process of manufacturing the semiconductor device 100 of FIG. 1A. Here, the drawings with b in the drawing numbers are cross-sectional views centering on the device isolation region 120 between two act regions ACT in a direction I in which the active region ACT extends, in the corresponding drawings with a in the drawing numbers, the drawings with c in the drawing numbers are cross-sectional views of the portions of the corresponding drawings with a in the drawing numbers, and the drawings with d in the drawing numbers are cross-sectional views, in which boundaries between the cell regions Cell and the core regions Core are cut in the direction III in which the word line extends, in the corresponding drawings with a in the drawing numbers.

Figure 4B:
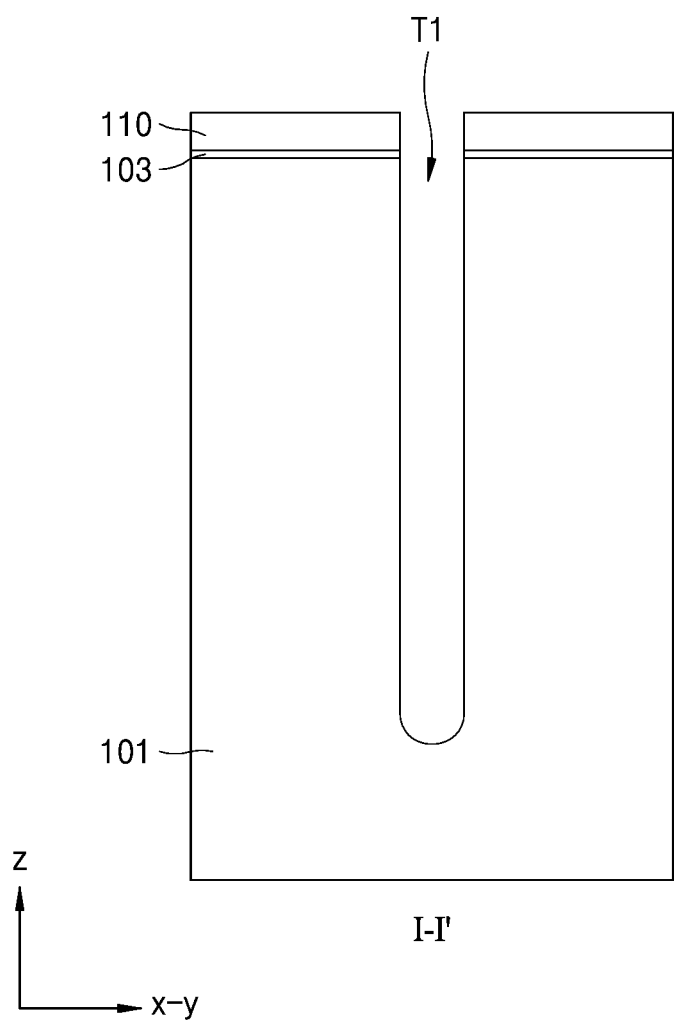
Figure 4C:
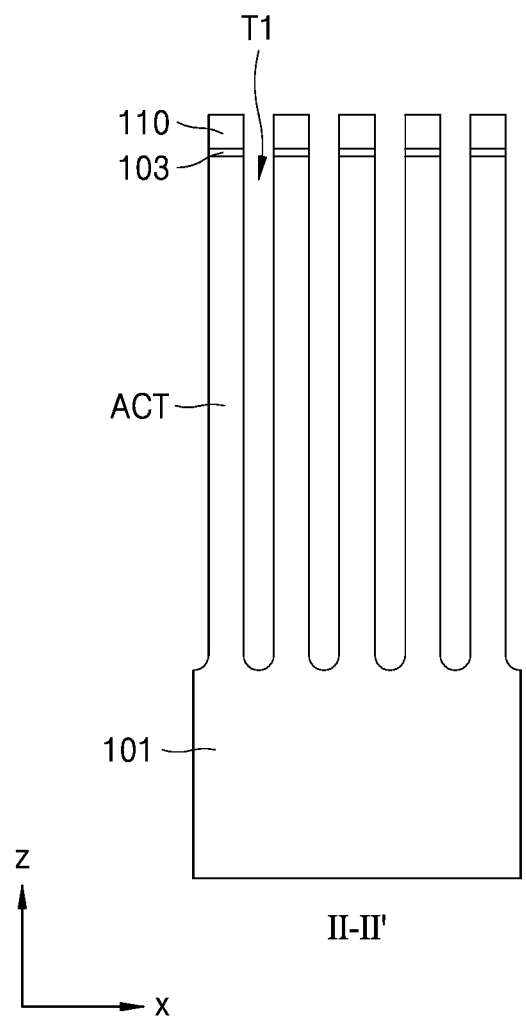

Referring to FIGS. 4A through 4C, the first mask 110 may be formed on the substrate 101 in a photo process, and a first trench T1 may be formed by using the first mask 110. As discussed previously, the first trench T1 shown in FIG. 4B is actually located between two active regions ACT in the X-Y direction, and not in the center of the actual I-I' line depicted in FIG. 4A. In the cell region Cell, the first mask 110 may have a bar shape extending in the oblique direction (x-y direction). The shape of the first mask 110 may correspond to a planar shape of the active region ACT. In addition, although not illustrated, the shape of the first mask 110 in the core region Core outside the cell region Cell may be different from the bar shape of the first mask 110 in the cell region Cell.

Before the first mask 110 is formed, a protective insulating layer 103 may be formed on a top surface of the substrate 101. The protective insulating layer 103 may protect the substrate 101 or the active region ACT from foreign substances or the like of the outside. In addition, the protective insulating layer 103 may function as an etch stop layer in a subsequent etching process on a material layer of another family. For example, in the semiconductor device 100 according to the present embodiment, the protective insulating layer 103 may include an oxide layer-based material. However, the material of the protective insulating layer 103 is not limited thereto. The first mask 110 may be formed on the protective insulating layer 103, and the first trench T1 may be formed in the substrate 101 in a shape penetrating the protective insulating layer 103.

The first mask 110 may include an insulating material. For example, the first mask 110 may include a material such as SiN, SiO, SiON, SiOC, and metal oxide, or a combination thereof. In the semiconductor device 100 according to the present embodiment, the first mask 110 may include, for example, a nitride-based material. However, the material of the first mask 110 is not limited thereto.

As illustrated in FIGS. 4B and 4C, the first trench T1 may be formed more deeply between the active regions ACT adjacent to each other in the diagonal direction (x-y direction) than between the active regions ACT adjacent to each other in the first direction (x direction). In addition, as illustrated in FIG. 6D, the first trench T1 may be formed wide and deep in the outer portion of the cell region Cell, which is a boundary portion of the core region Core (e.g., wider and deeper than the first trench in an inner portion of the cell region Cell). Although not illustrated, the first trench T1 having various widths and depths may be formed in the core region Core. The first trench T1 may be described below as a plurality of first trenches T1, when viewed from a cross-section. For example, different first trenches T1 as shown in a cross-section may have different respective widths and heights.

In FIGS. 4B and 4C, a width of the first trench T1 may have a constant shape at a top portion and a bottom portion thereof, but the width of the first trench T1 may narrow toward the bottom portion thereof in an etching process. Thus, sidewalls of the first trench T1 may not be exactly vertical but have a slight inclination. The same concept may be applied to other trenches below.

Figure 5A:
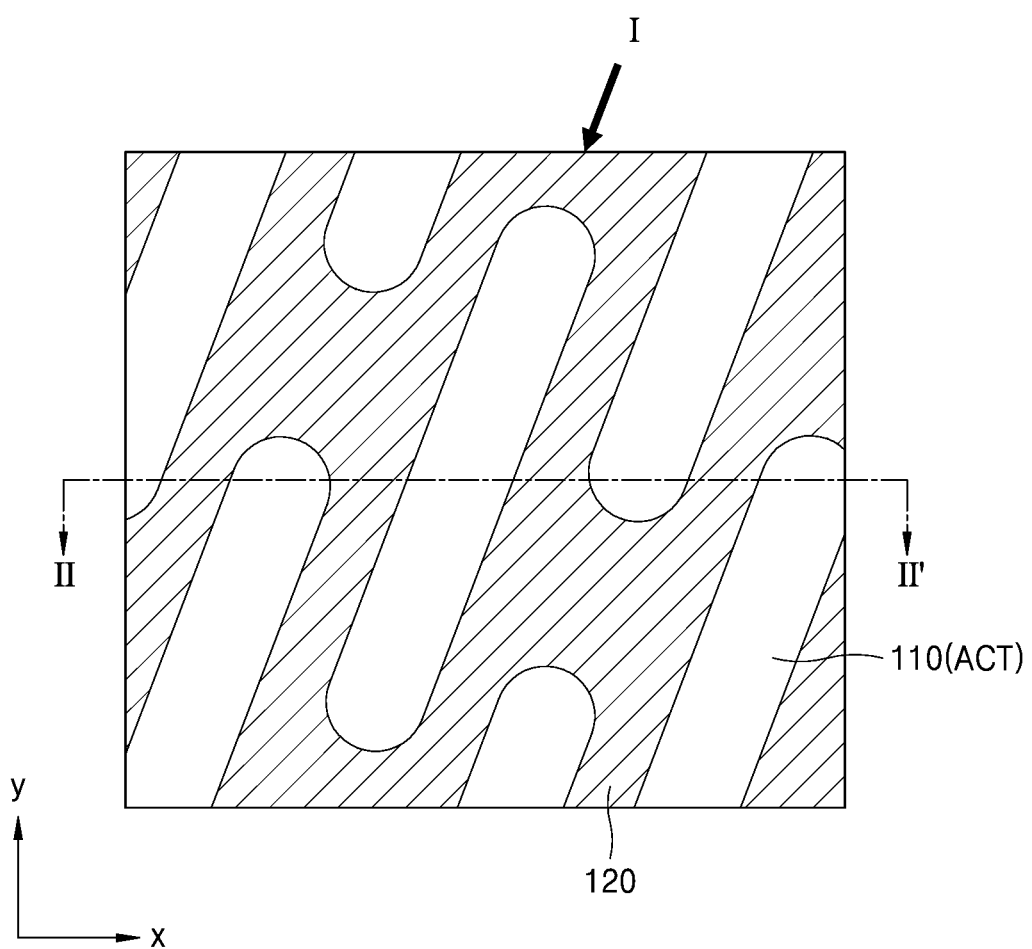
Figure 5B:
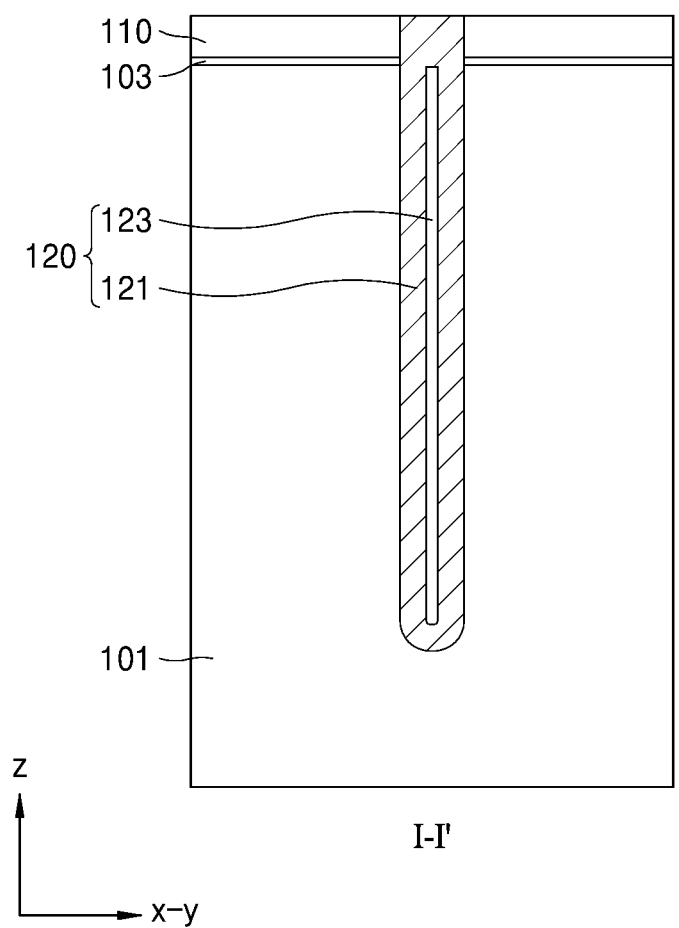
Figure 5C:
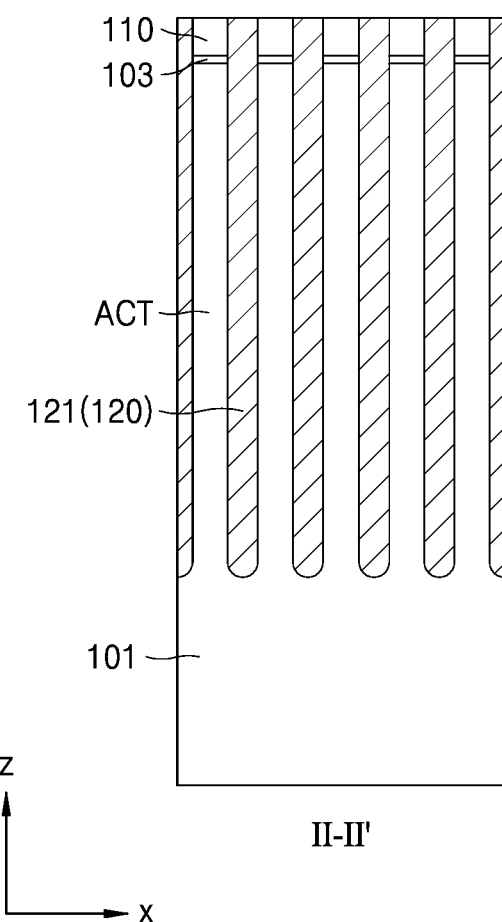

Referring to FIGS. 5A through 5C, the device isolation layer 120 may be formed by filling the first trench T1 with an insulating material. The device isolation layer 120 may have a different layered structure depending on the width of the first trench T1. For example, when the width of the first trench T1 is compared with the width of the active regions ACT, and when the width of the first trench T1 is about the same as or less than the width of the active regions ACT, as illustrated in FIG. 5C, the device isolation layer 120 may have a first structure including only the first insulating layer 121. In addition, when the first trench T1 has a width that is approximately twice that of the active region ACT, as shown in FIG. 5B, the device isolation layer 120 may have a second structure including the first insulating layer 121 and the second insulating layer 123. On the other hand, as illustrated in FIG. 6D, on the periphery of the cell region Cell, which is a boundary portion with respect to the core region Core, the first trench T1 may have a very large width, that is, at least three times the width of the active region ACT. When the first trench T1 has a large width, the device isolation layer 120 may have a third structure in which the third insulating layer 125 is further provided inside the second insulating layer 123. Various layer structures of the device isolation layer 120 according to the width of the first trench T1 may be naturally formed to some extent in the process of filling the first trench T1 with an insulating material.

Referring to FIGS. 6A through 6D, after the device isolation layer 120 is formed, a first protective mask 210 covering the cell region Cell may be formed. The first protective mask 210 may be formed in a photo process using a photoresist (PR). However, the material of the first protective mask 210 is not limited thereto. As illustrated in FIG. 6D, the first protective mask 210 may not cover precisely the cell region Cell, but may also cover a portion of the core region Core. This may be to ensure a process margin in the cell region Cell. Here, a dashed line extending in the third direction (z direction) indicates a boundary between the cell region Cell and the core region Core. In some instances, a boundary between the cell region Cell and the core region Core may be defined by an isolation layer 120 having a greater width than the width of the isolation layer between adjacent active regions (e.g., a width about three times or greater than three times the width between adjacent active regions in the x direction).

Figure 6A:
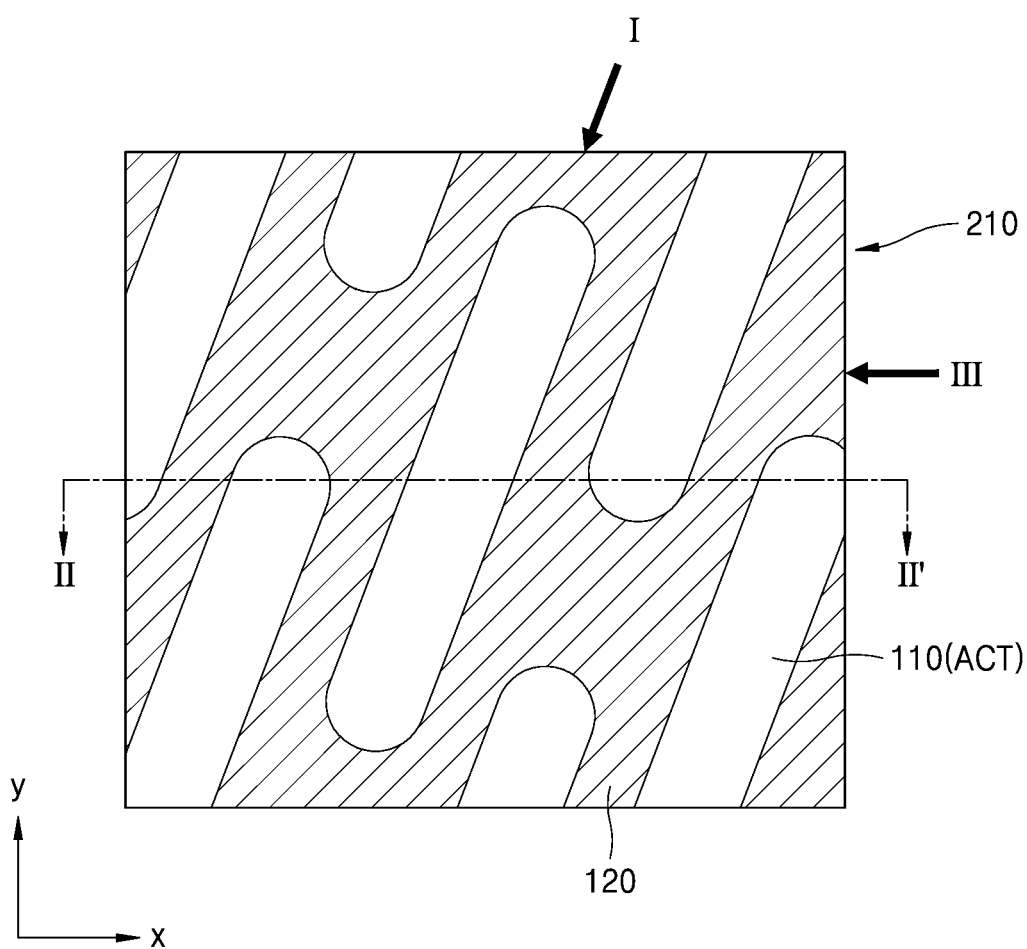
Figure 6B:
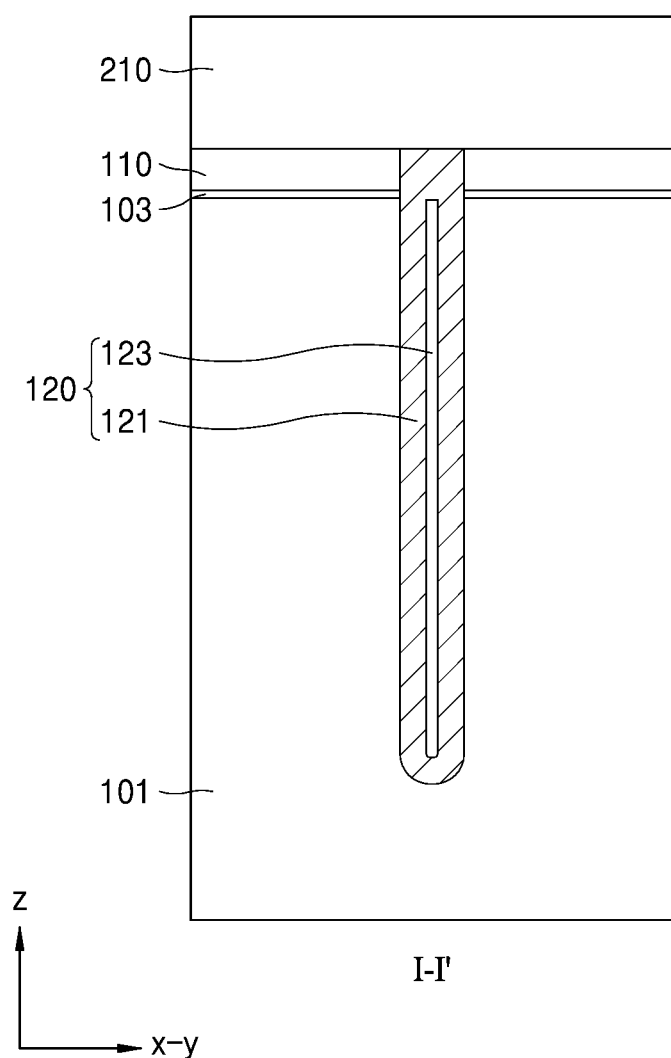
Figure 6C:
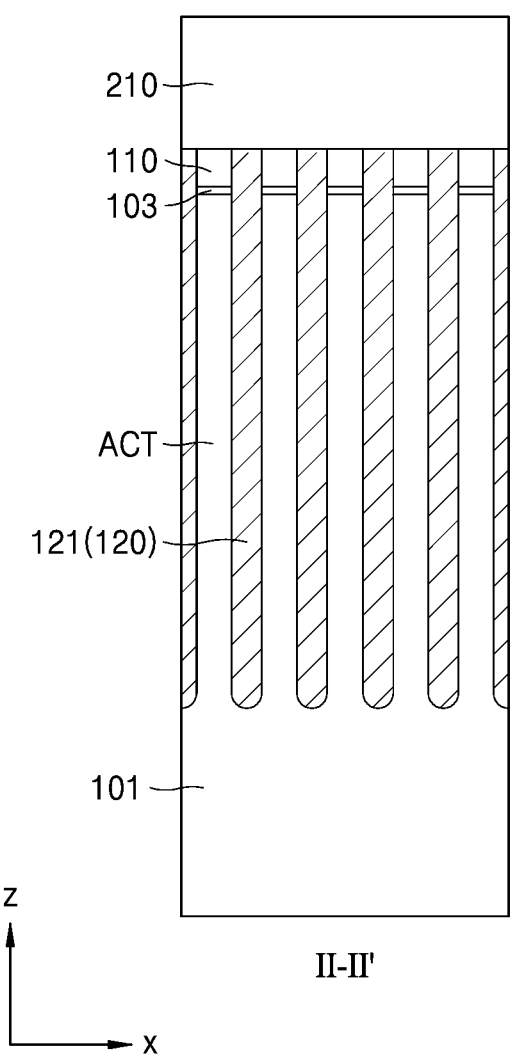
Figure 6D:
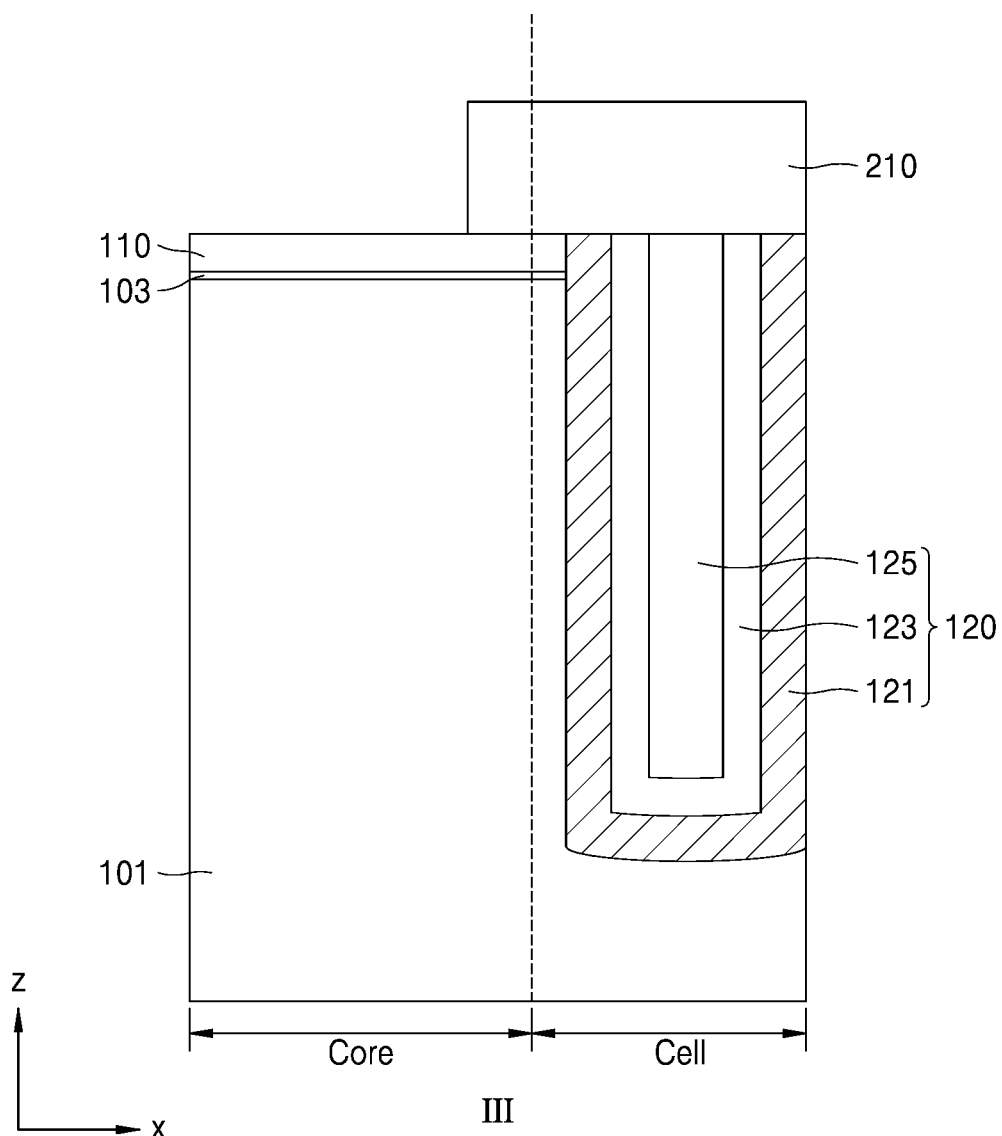

Since the first protective mask 210 is formed in the entirety of the cell region Cell, in FIG. 6A, the first mask 110 and the device isolation layer 120 may be covered by the first protective mask 210 and may not be seen. For convenience, the first protective mask 210 is omitted and only the first mask 110 and the device isolation layer 120 are illustrated.

Figure 7A:
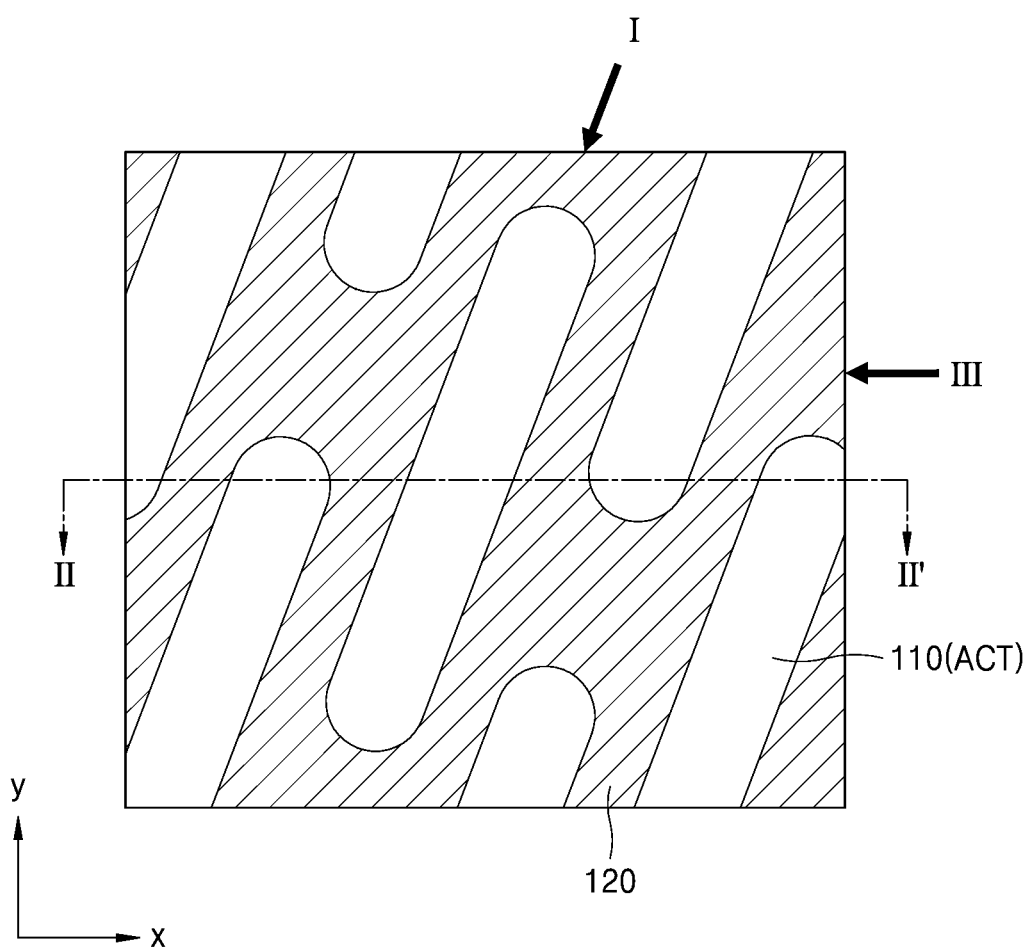
Figure 7B:
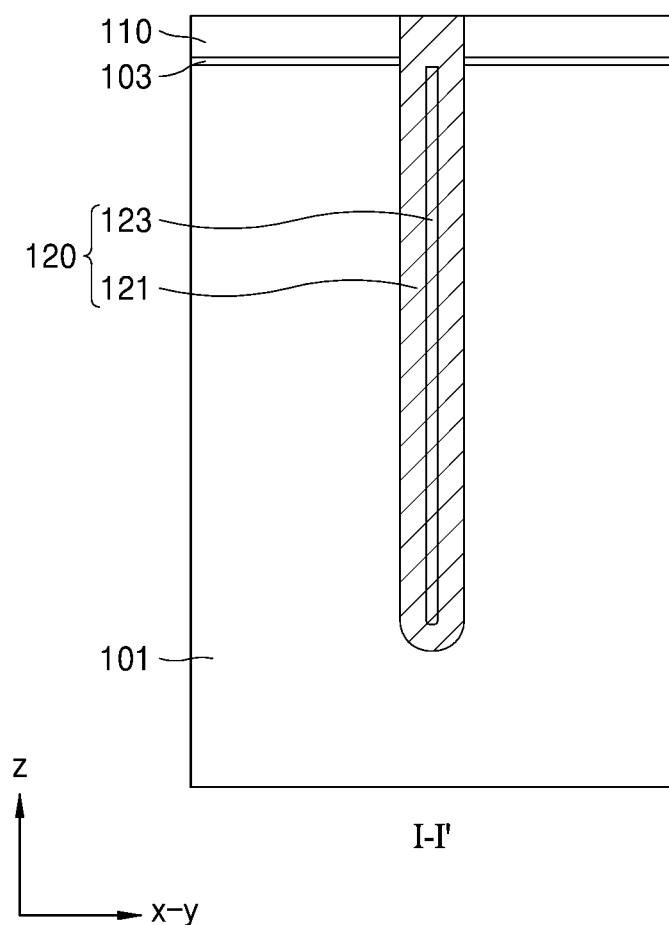
Figure 7C:
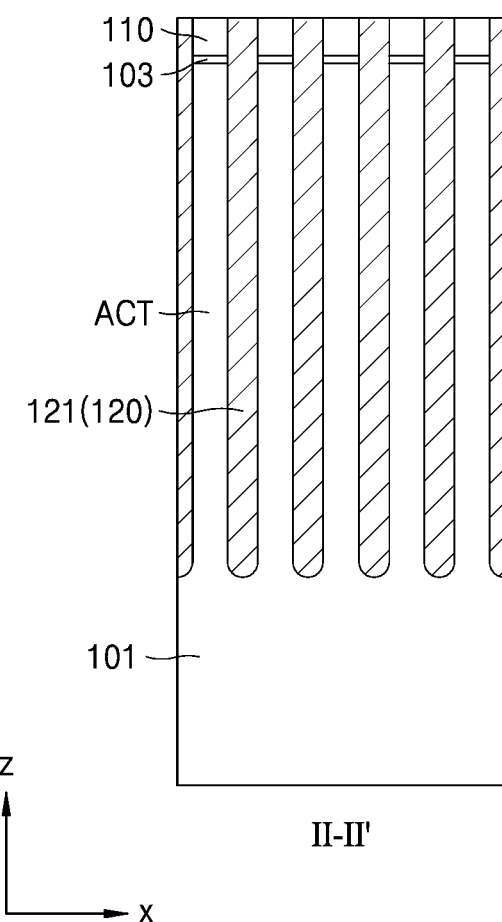
Figure 7D:
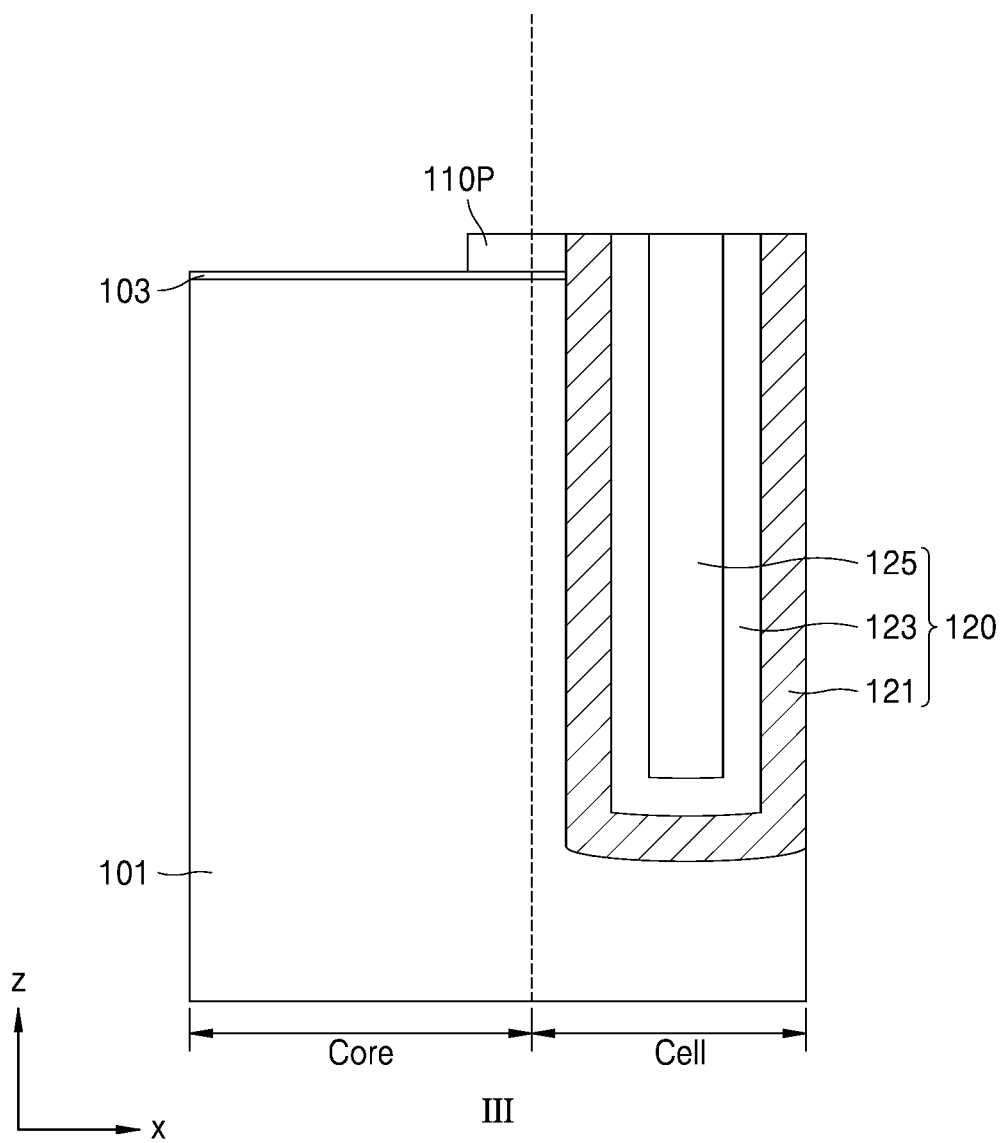

Referring to FIGS. 7A through 7D, the first mask 110 in the core region Core may be removed by using the first protective mask 210. The first mask 110 in the core region Core may be removed in a dry or wet etching process by using the first protective mask 210. For example, when the first mask 110 is removed in a wet etching, the first mask 110 may be etched inwardly concave at the boundary portion covered by the first protective mask 210. In FIG. 7D, the boundary portion is illustrated in a vertical form for convenience.

When the first mask 110 on the core region Core is removed, the protective insulating layer 103 under the first mask 110 may function as an etch stop layer. Accordingly, after the first mask 110 is removed, the protective insulating layer 103 may be exposed on the substrate 101 of the core region Core. After the first mask 110 on the core region Core is removed, the first protective mask 210 on the cell region Cell may be removed. Accordingly, the device isolation layer 120 and the first mask 110 on the active region ACT may be exposed in the cell region Cell. Since the first protective mask 210 is partially formed on the core region Core to secure a process margin, after the first protective mask 210 is removed, the protrusion insulating layer 110P (also described as a protruding insulating layer) derived from the first mask 110 may be formed on the core region Core.

Figure 16A:
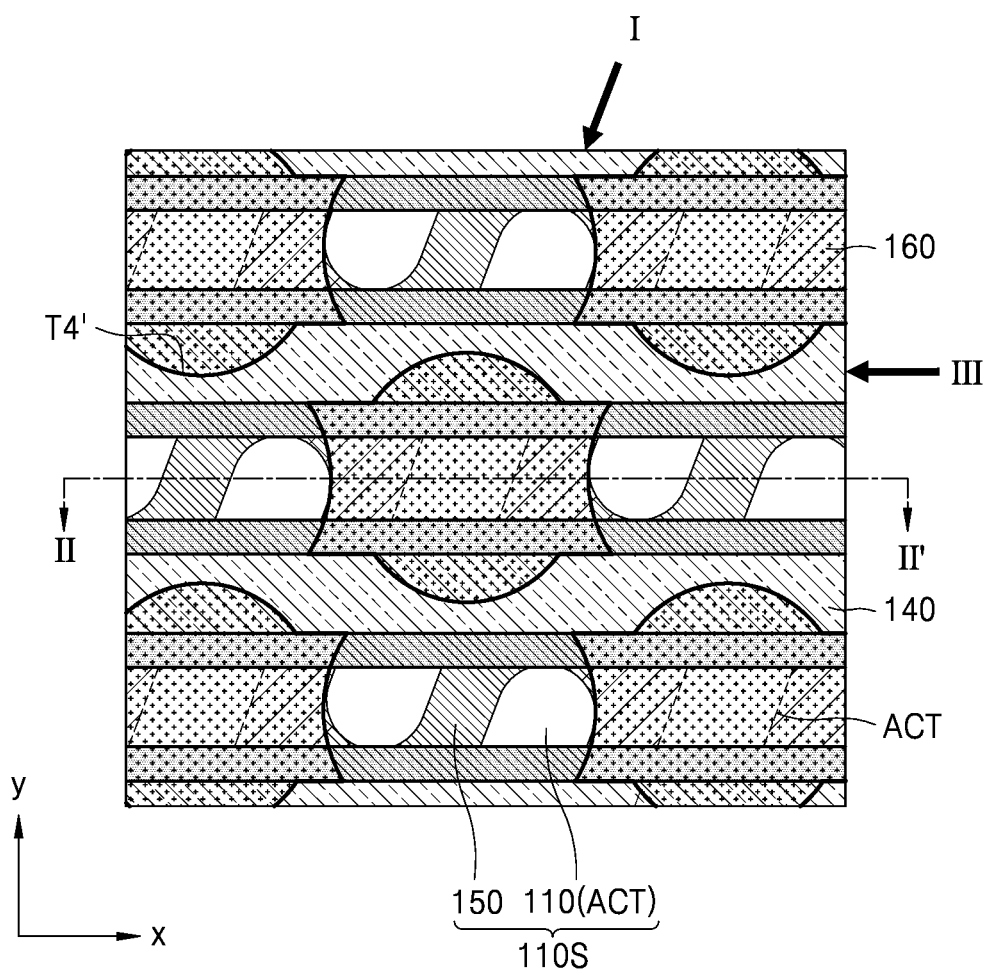
Figure 16B:
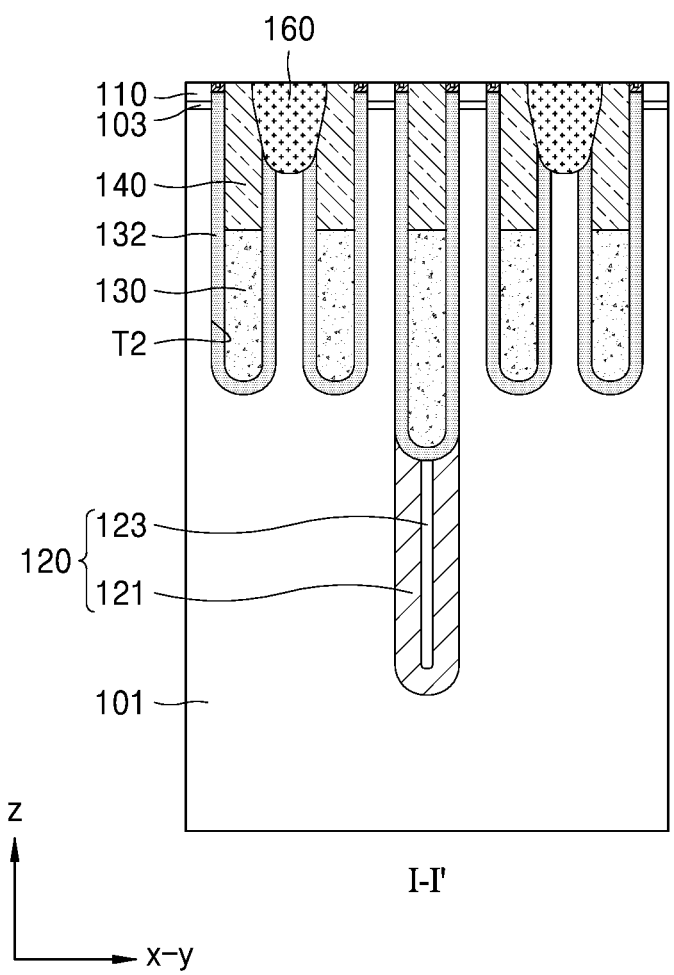
Figure 16C:
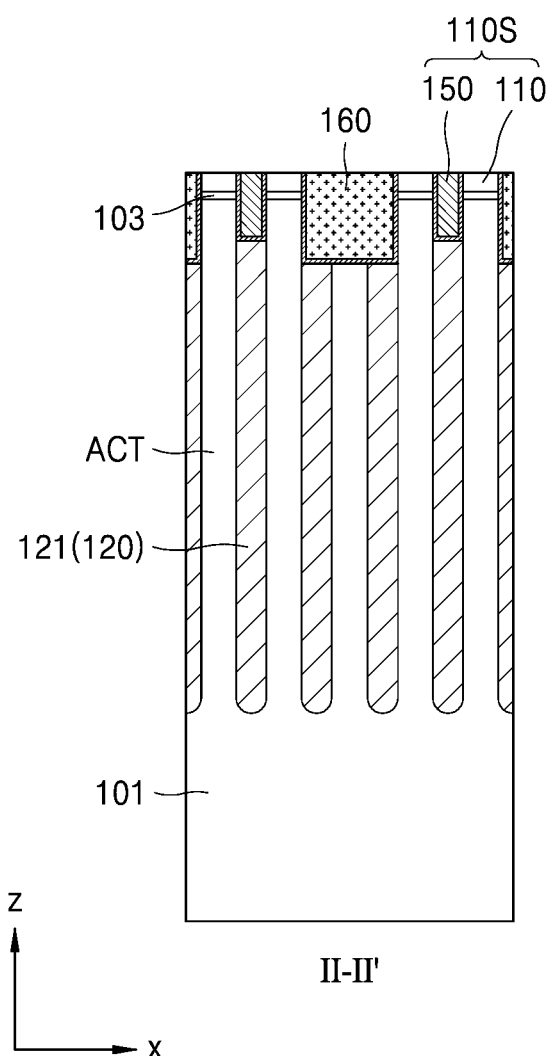
Figure 16D:
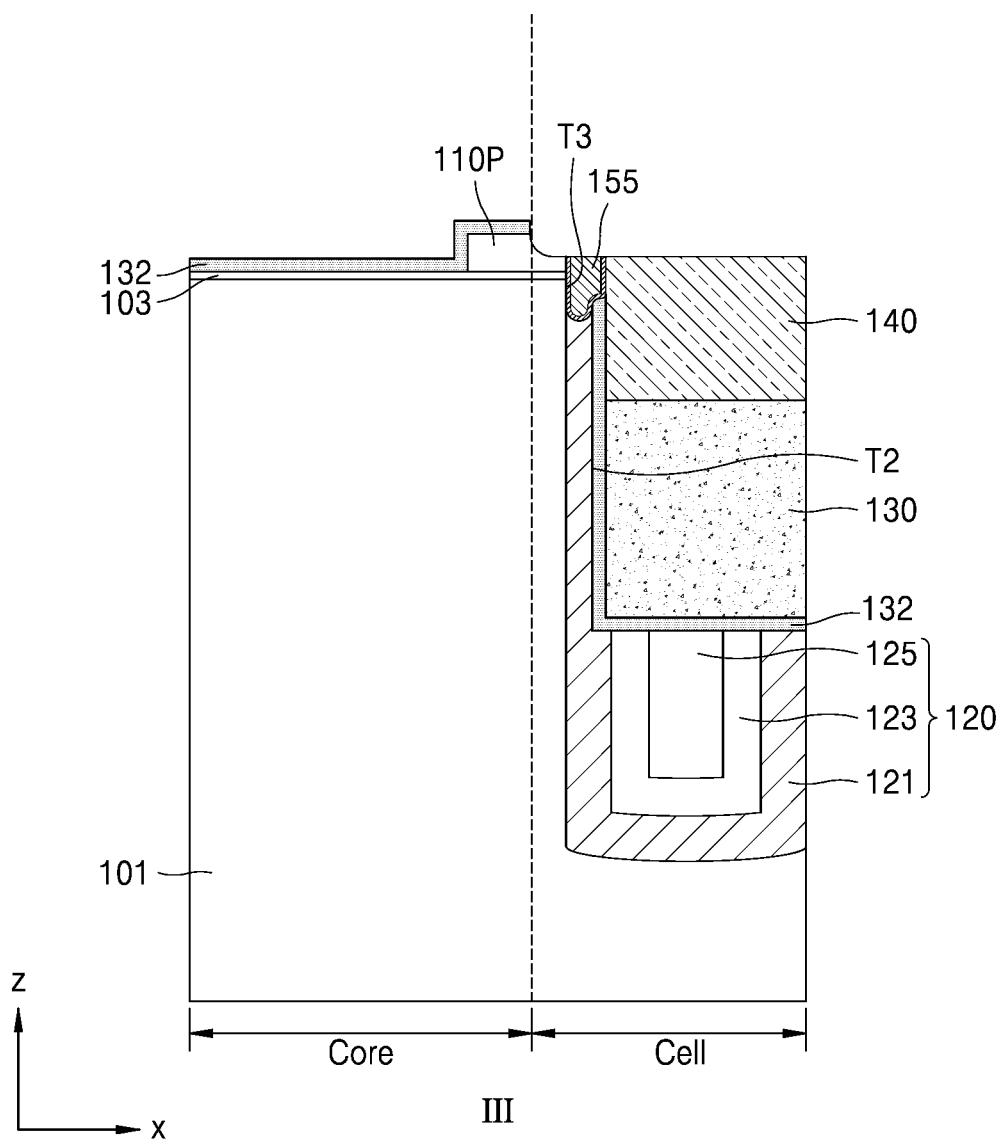

The protrusion insulating layer 110P may have a protruding structure over the substrate 101, and may have a rectangular cross-sectional shape. For example, it may protrude from the cell region Cell, and from a side surface of the device isolation layer 120, in a horizontal direction into the core region Core. However, as described above, in the protrusion insulating layer 110P, a concave shape may be formed on a side surface thereof. In addition, as illustrated in FIG. 16D, in a process of removing a first additional insulating layer 152, a portion of a top surface thereof may be removed to form a concave shape on a portion of the top surface thereof.

Referring to FIGS. 8A through 8D, a plurality of second trenches T2 may be formed in the substrate 101. The second trenches T2 may extend in the first direction (x direction) in parallel with each other, and may be formed to cross the active region ACT. After a resultant in which the second trench T2 is formed on the substrate 101 is cleaned, a gate insulating layer 132, the word line 130, and the second mask 140 may be sequentially formed in the second trench T2.

After the second trench T2 is formed, the gate insulating layer 132 may be formed on the entire surface of the substrate 101. Accordingly, the gate insulating layer 132 may cover an inner wall of the second trench T2 and the first mask 110 of the cell region Cell, and the protective insulating layer 103 of the core region Core. The gate insulating layer 132 may include, for example, at least one of a silicon oxide layer, a silicon nitride layer, a silicon oxynitride layer, an oxide/nitride/oxide (ONO) layer, and a high dielectric layer having a higher dielectric constant than the silicon oxide layer. In the semiconductor device 100 according to the present embodiment, the gate insulating layer 132 may include an oxide layer-based material. The material of the gate insulating layer 132 is not limited thereto.

After the gate insulating layer 132 is formed, the word line 130 having a buried structure may be formed by filling a conductive layer in a bottom portion of the second trench T2. For example, the top surface of the word line 130 may be lower than the top surface of the substrate 101 or the top surface of the active region ACT. In some embodiments, the word line 130 may include at least one of Ti, TiN, Ta, TaN, W, WN, TiSiN, and WSiN. However, the material of the word line 130 is not limited thereto.

Figure 8A:
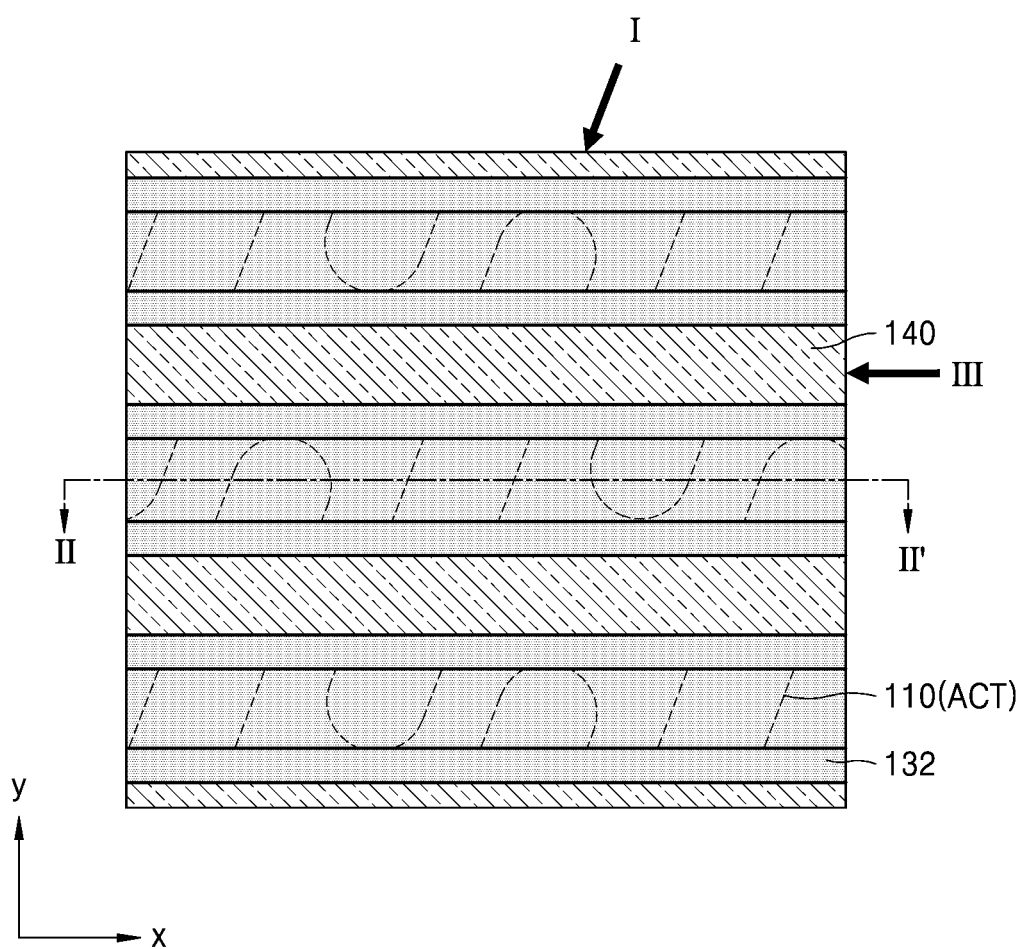
Figure 8B:
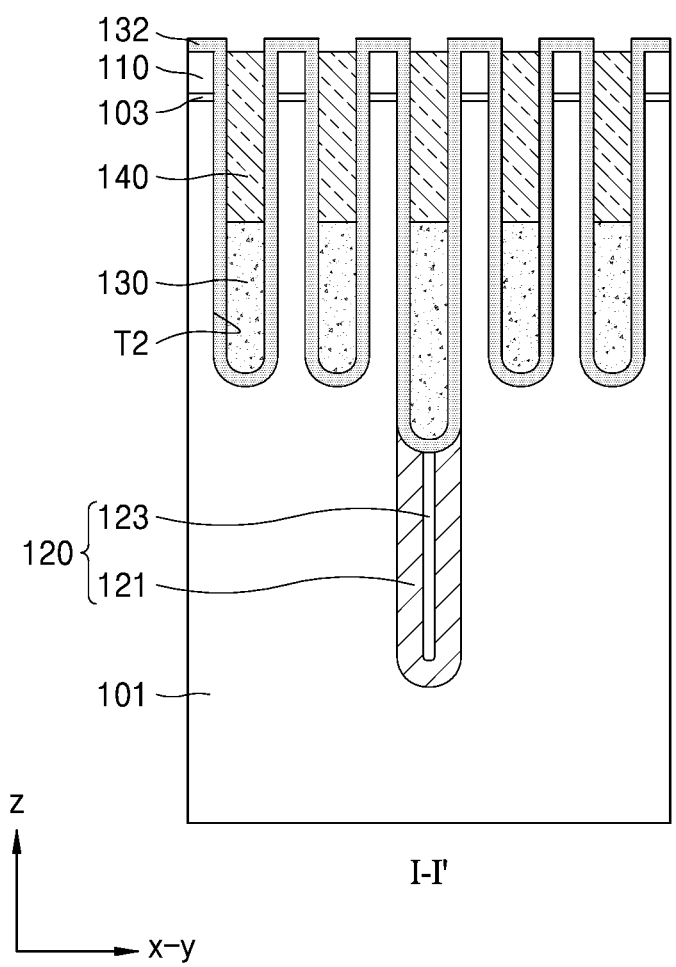
Figure 8C:
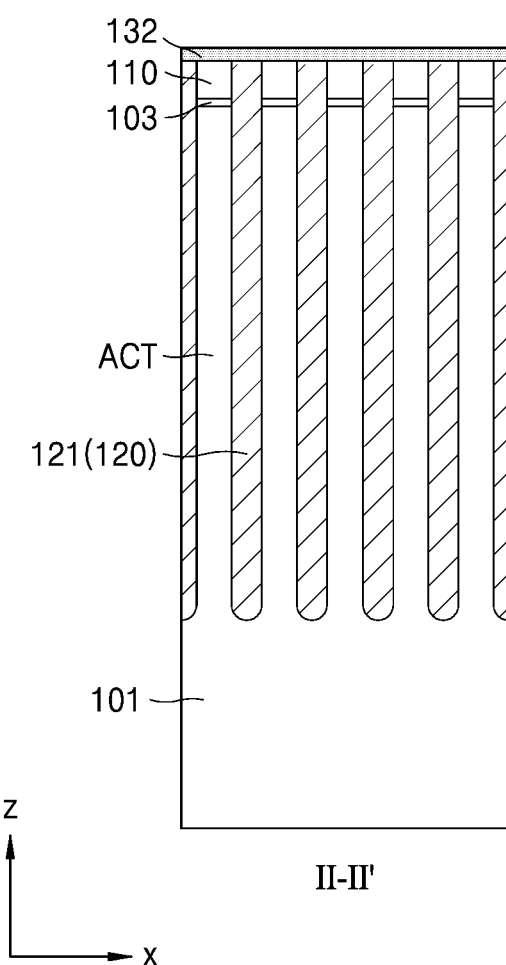
Figure 8D:
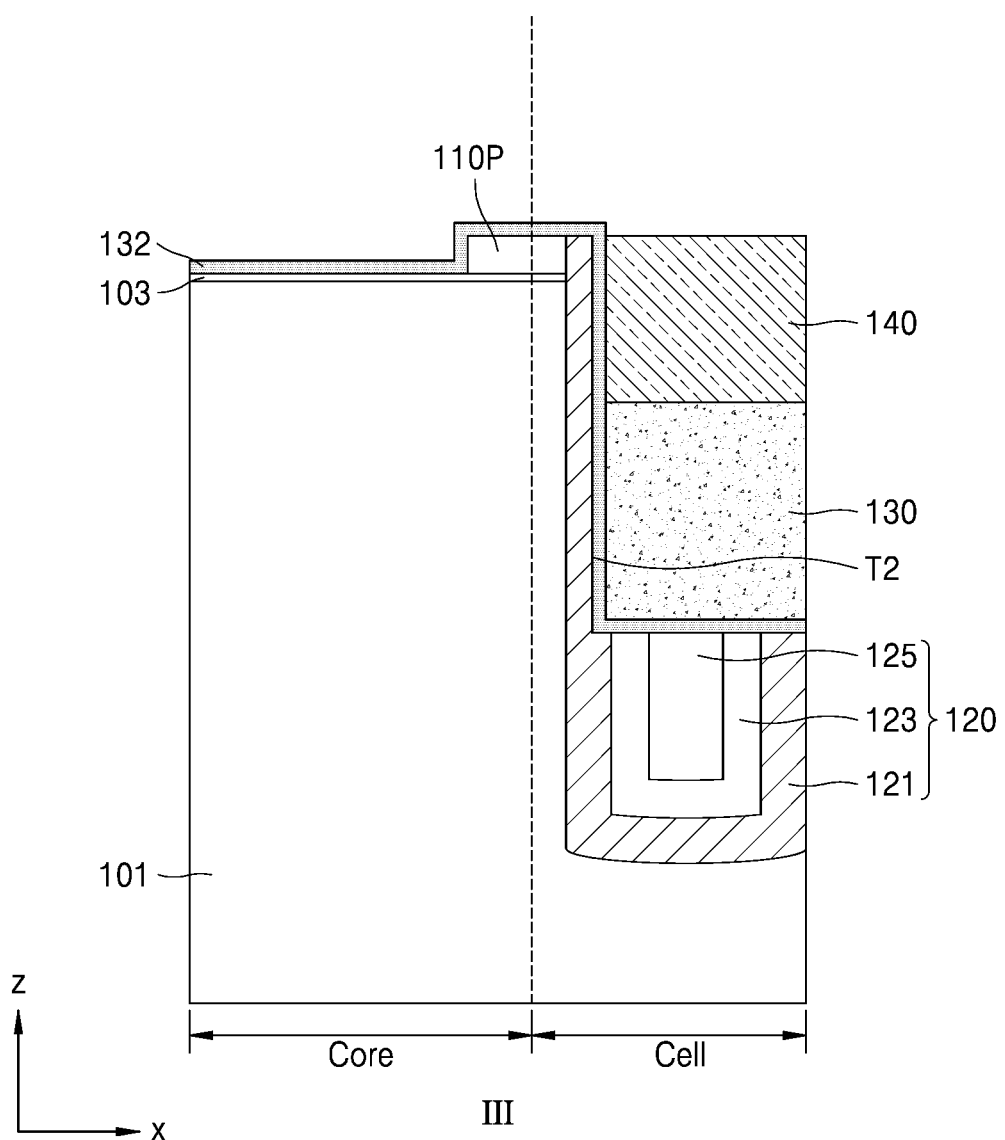
Figure 9A:
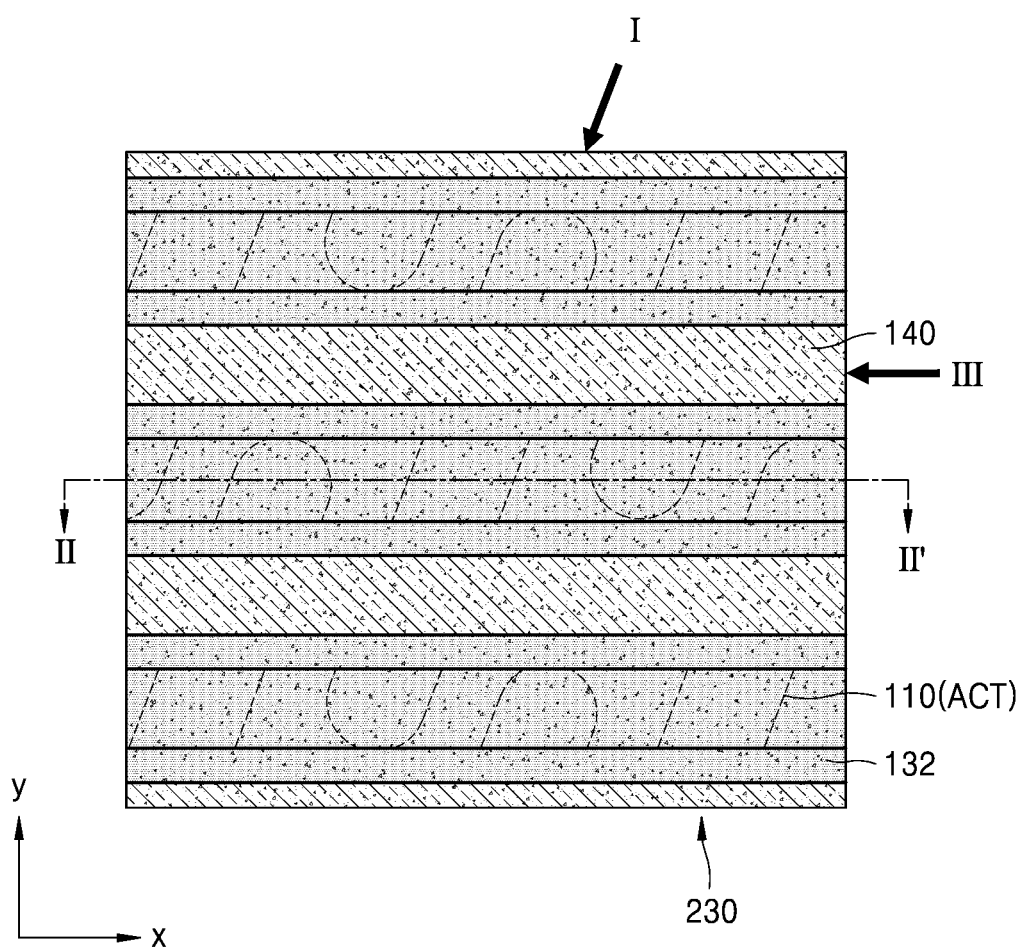
Figure 9B:
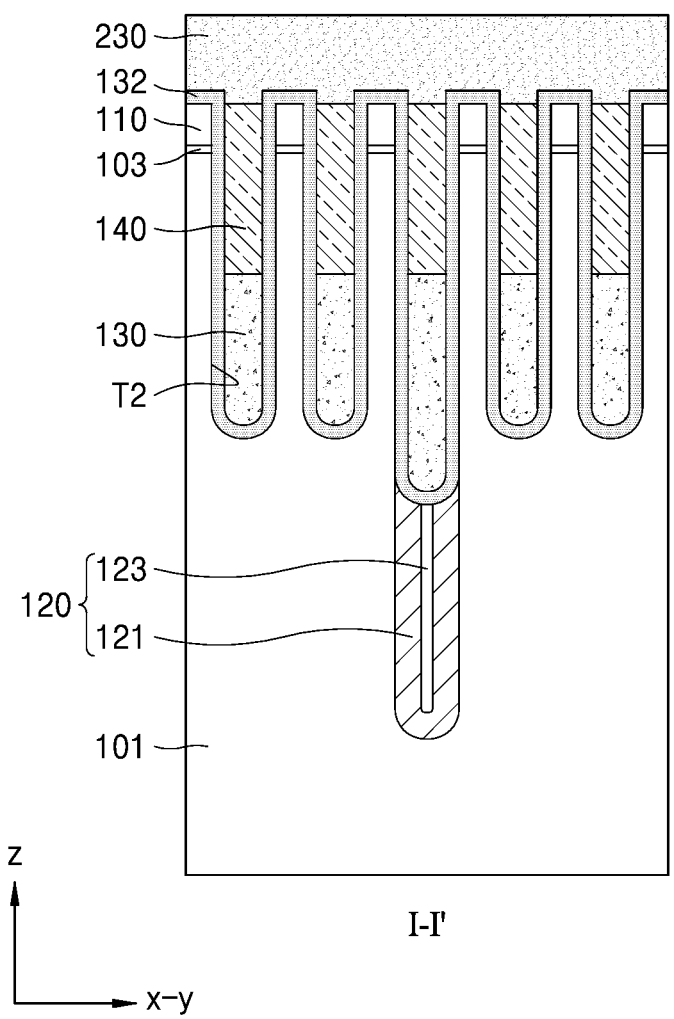
Figure 9C:
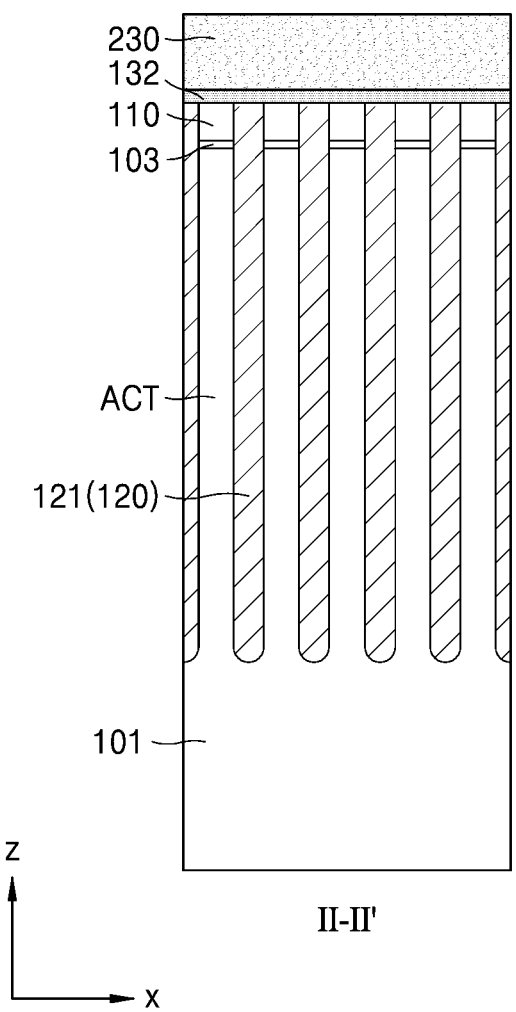
Figure 9D:
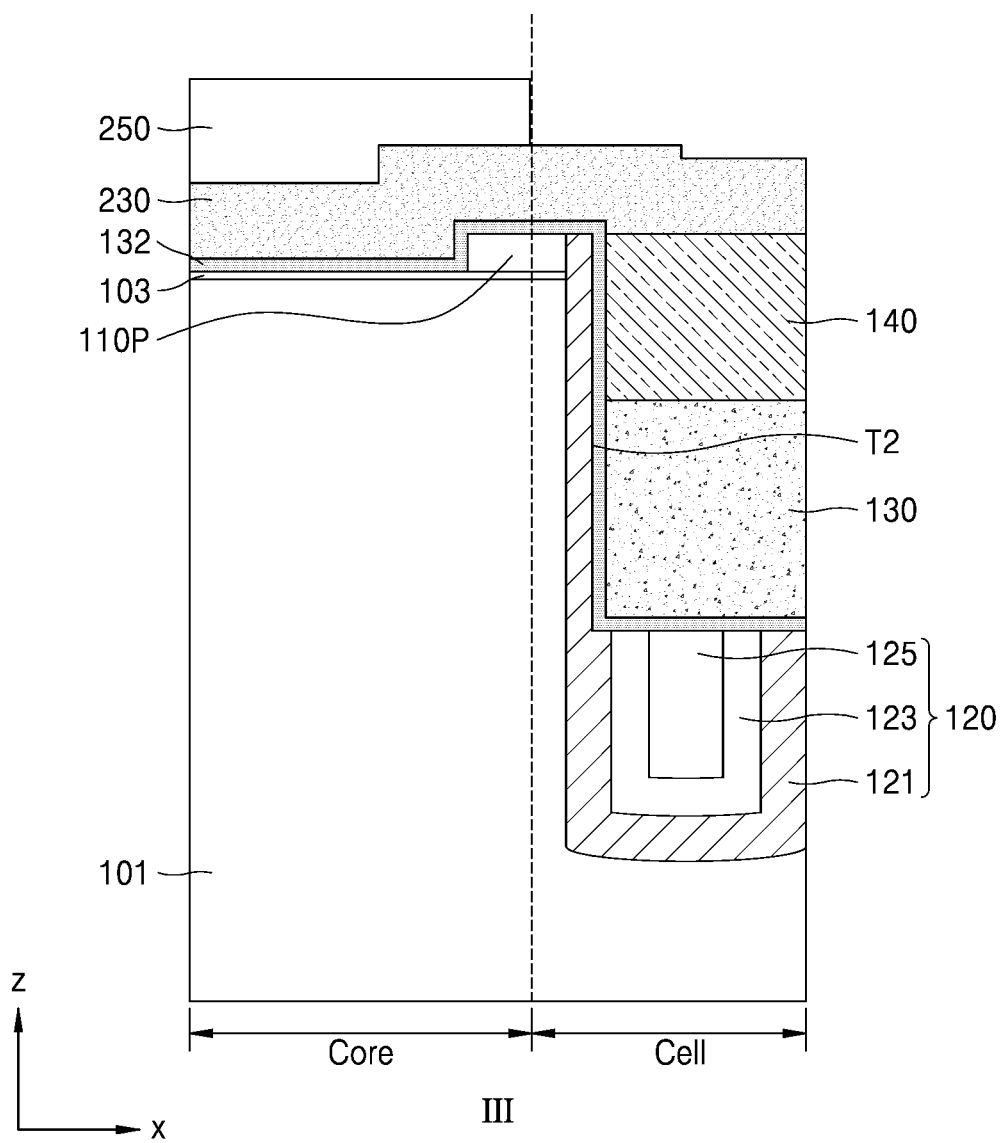

After the word line 130 is formed, the second mask 140 may be formed by filling a top portion of the second trench T2 with an insulating material. Accordingly, the second mask 140 may be formed on the word line 130 in the second trench T2. As illustrated in FIG. 8B, the top surface of the second mask 140 may have substantially the same height as the top surface of the first mask 110. However, the top surface of the second mask 140 may be lower than the top surface of the first mask 110. However, a height of a top surface of the second mask 140 may be equal to or greater than a height of a top surface of the active region ACT. For example, the top surface of the second mask 140 may be between the top surface of the first mask 110 and the top surface of the active region ACT. Due to the height of the top surface of the second mask 140, the structure of the first contact 160 may be variously changed when the first contact 160 is subsequently formed by using the first mask 110 and the second mask 140.

The second mask 140 may include a material similar or identical to that of the first mask 110. For example, the second mask 140 may include a material such as SiN, SiO, SiON, SiOC, and metal oxide, or a combination thereof. In the semiconductor device 100 according to the present embodiment, the second mask 140 may include, for example, a nitride-based material. However, the material of the second mask 140 is not limited thereto.

In some embodiments, after the word line 130 is formed, by implanting impurity ions into the active region ACT on both sides of the word line 130 by using the word line 130 as a mask, a source/drain region may be formed on the top portion of the active region ACT. The first contact 160 may be connected to the source region. In some other embodiments, an impurity ion implantation process for forming the source/drain regions may be performed before the word line 130 is formed.

Referring to FIGS. 9A through 9D, a third mask 230 may be formed relatively thick on the entire surface of the substrate 101. The third mask 230 may include, for example, an oxide-based material. However, the material of the third mask 230 is not limited thereto. After the third mask 230 is formed, a second protective mask 250 exposing a portion of the third mask 230 of the cell region Cell and covering a portion of the third mask 230 of the core region Core may be formed. The second protective mask 250 may be formed by PR in a photo process. However, the material of the second protective mask 250 is not limited thereto.

Figure 10A:
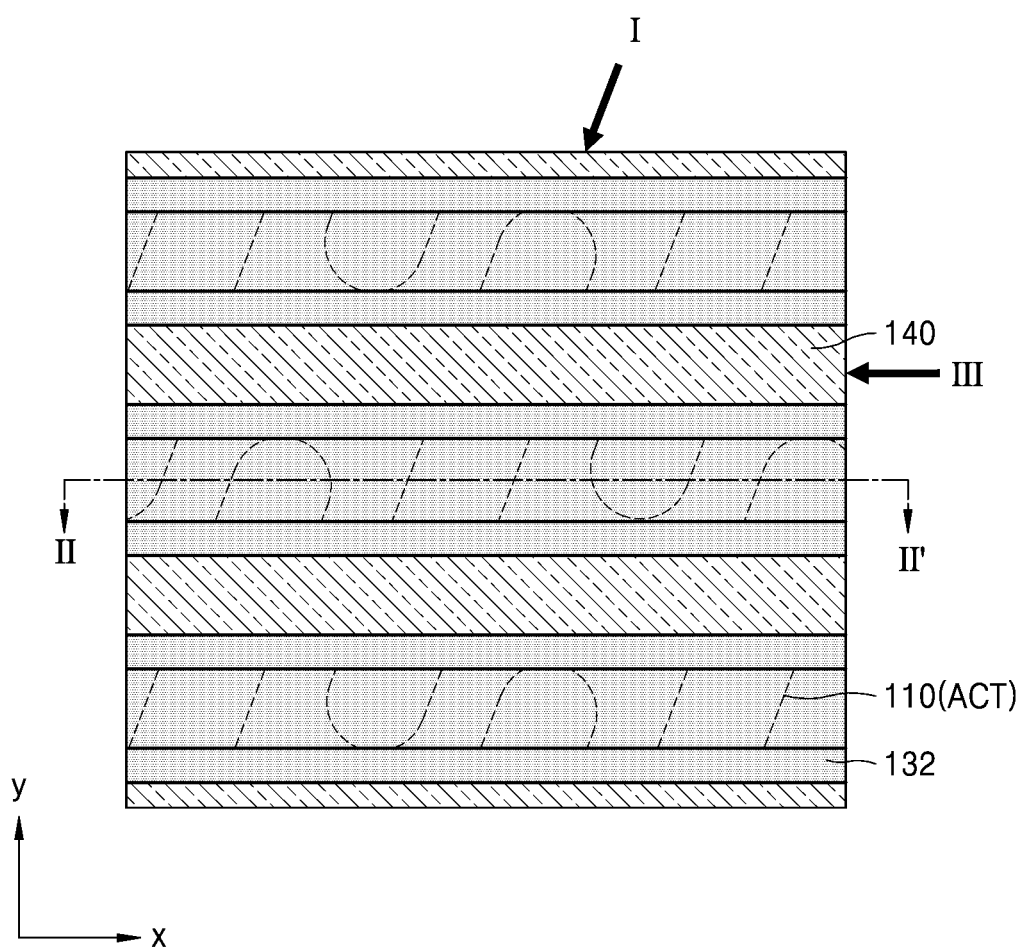
Figure 10B:
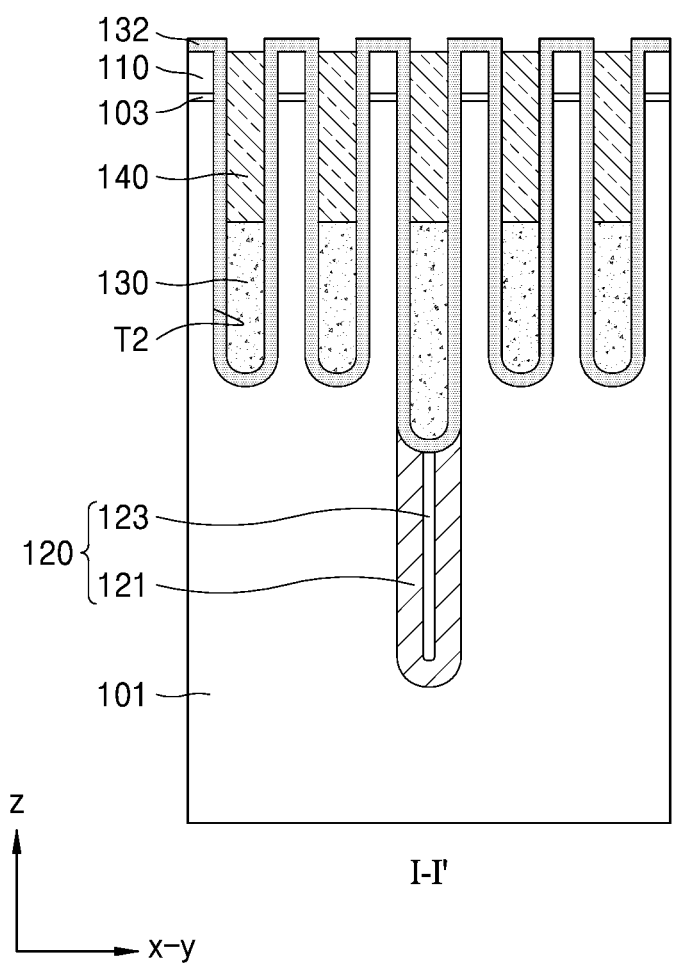
Figure 10C:
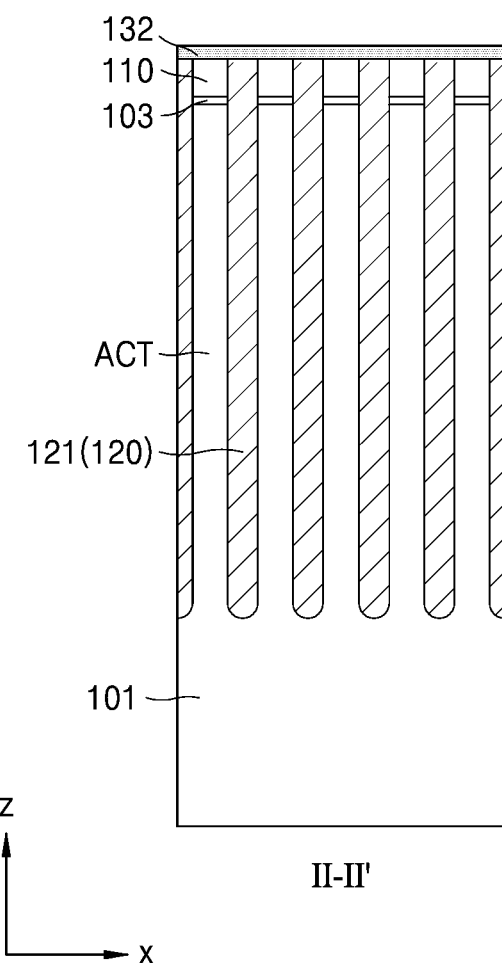
Figure 10D:
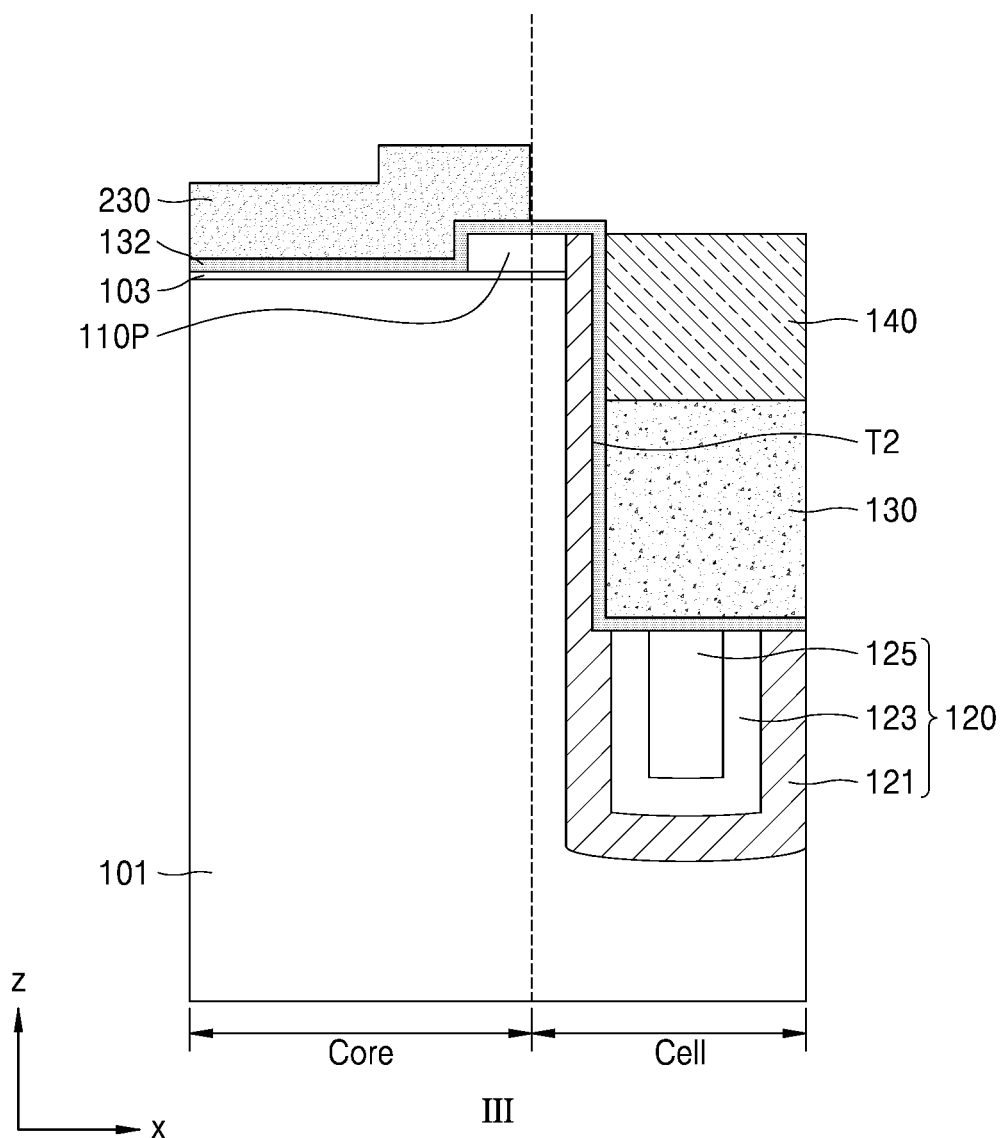

Referring to FIGS. 10A through 10D, the third mask 230 on the cell region Cell may be removed by using the second protective mask 250. The third mask 230 in the cell region Cell may be removed in a dry or wet etching process using the second protective mask 250. For example, in the semiconductor device 100 according to the present example embodiment, the third mask 230 may be removed in a dry etching process. When the third mask 230 is removed, the gate insulating layer 132 and/or the second mask 140 may function as an etch stop layer. In some embodiments, some of the third mask 230 may remain on the second mask 140. After the third mask 230 on the cell region Cell is removed, since the second protective mask 250 is removed, a shape of the third mask 230 as illustrated in FIG. 10D may result.

Figure 11A:
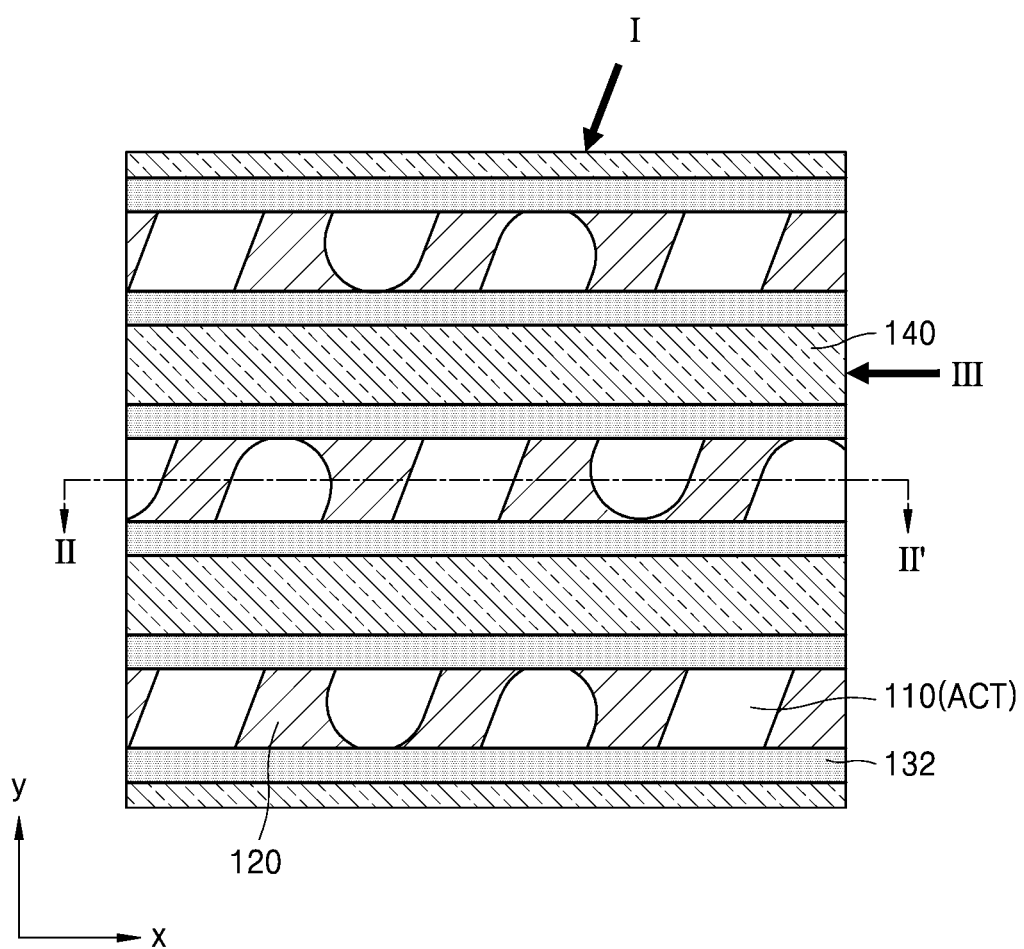
Figure 11B:
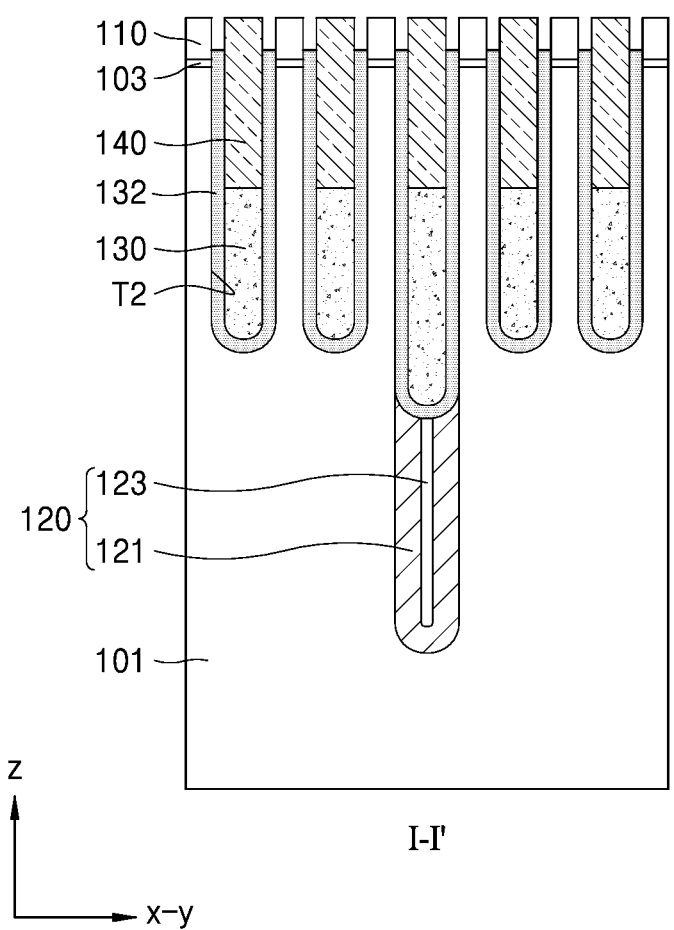
Figure 11C:
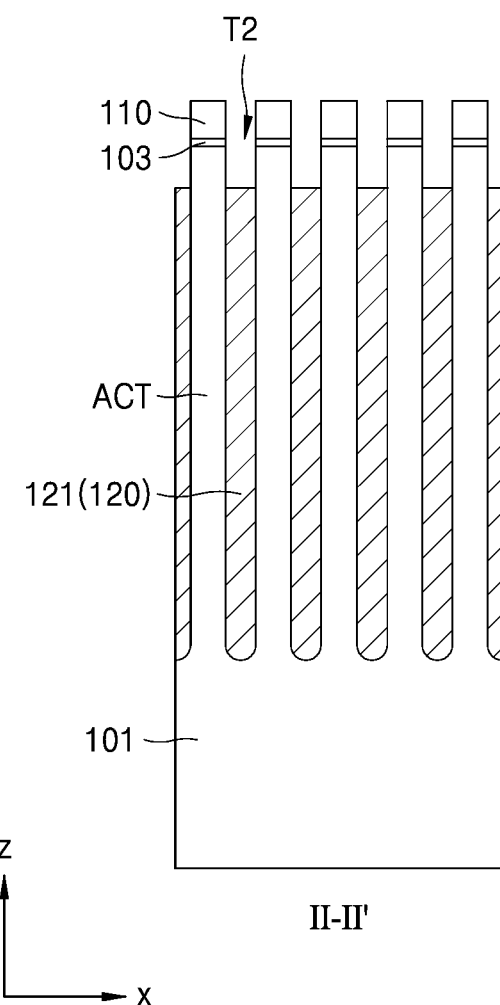
Figure 11D:
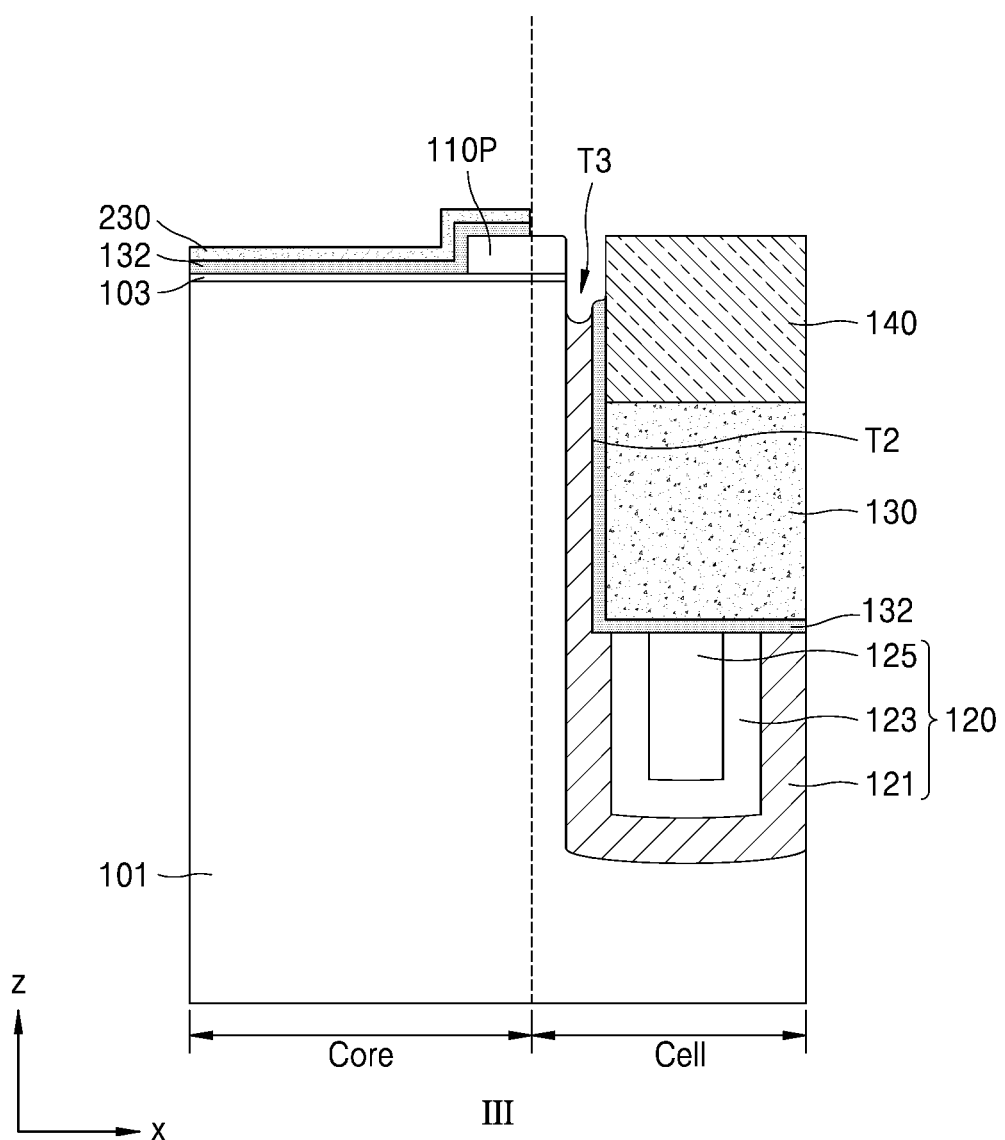

Referring to FIGS. 11A through 11D, after the third mask 230 of the cell region Cell is removed, by removing a top portion of the device isolation layer 120 by using the first mask 110 and the second mask 140 as an etching mask, the device isolation layer 120 may be recessed. In the recess of the device isolation layer 120, a top portion of the gate insulating layer 132 may be removed. Accordingly, as illustrated in FIG. 11B, the top surfaces of the first mask 110 and the second mask 140 may be higher than the top surface of the gate insulating layer 132. In addition, as illustrated in FIG. 11C, the first mask 110 and the active region ACT may protrude from the device isolation layer 120.

A third trench T3 may be formed by removing the gate insulating layer 132 and the device isolation layer 120, at the boundary portion between the core region Core and the cell region Cell. A portion of the device isolation layer 120 may be more etched by the difference in the etch rate between the gate insulating layer 132 and the device isolation layer 120. However, according to an example embodiment, a portion of the device isolation layer 120 may be etched similarly to the gate insulating layer 132 or a portion of the gate insulating layer 132 may be etched more.

For reference, the recess of the device isolation layer 120 may be formed in a wet etching process or a dry etching process. In addition, the recess of the device isolation layer 120 may be configured in various forms due to a difference in selectivity of each material and/or a difference in the etch rate for each CD. For example, etching depths of the gate insulating layer 132 and the device isolation layer 120 may vary, based on the difference in selectivity for the first mask 110 and the second mask 140. In addition, the etching depths of the gate insulating layer 132 and the device isolation layer 120 may vary, based on the widths of the first mask 110 and the second mask 140 and a difference in selectivity depending on the widths of the first mask 110 and the second mask 140.

In the recess of the device isolation layer 120, the third mask 230 of the core region Core may also be removed to a certain thickness. However, since a function of the third mask 230 is to protect the core region Core, after the device isolation layer 120 is recessed, the third mask 230 may be maintained on the core region Core with a certain thickness.

Referring to FIGS. 12A through 12D, the mask pattern 270 may be formed on the entire surface of the substrate 101 by using a photo process. The mask pattern 270 may include a material that can be easily removed in an ashing process. For example, the mask pattern 270 may include PR or a material having high carbon content such as a spin on hard mask (SOH). However, the material of the mask pattern 270 is not limited thereto.

Figure 12A:
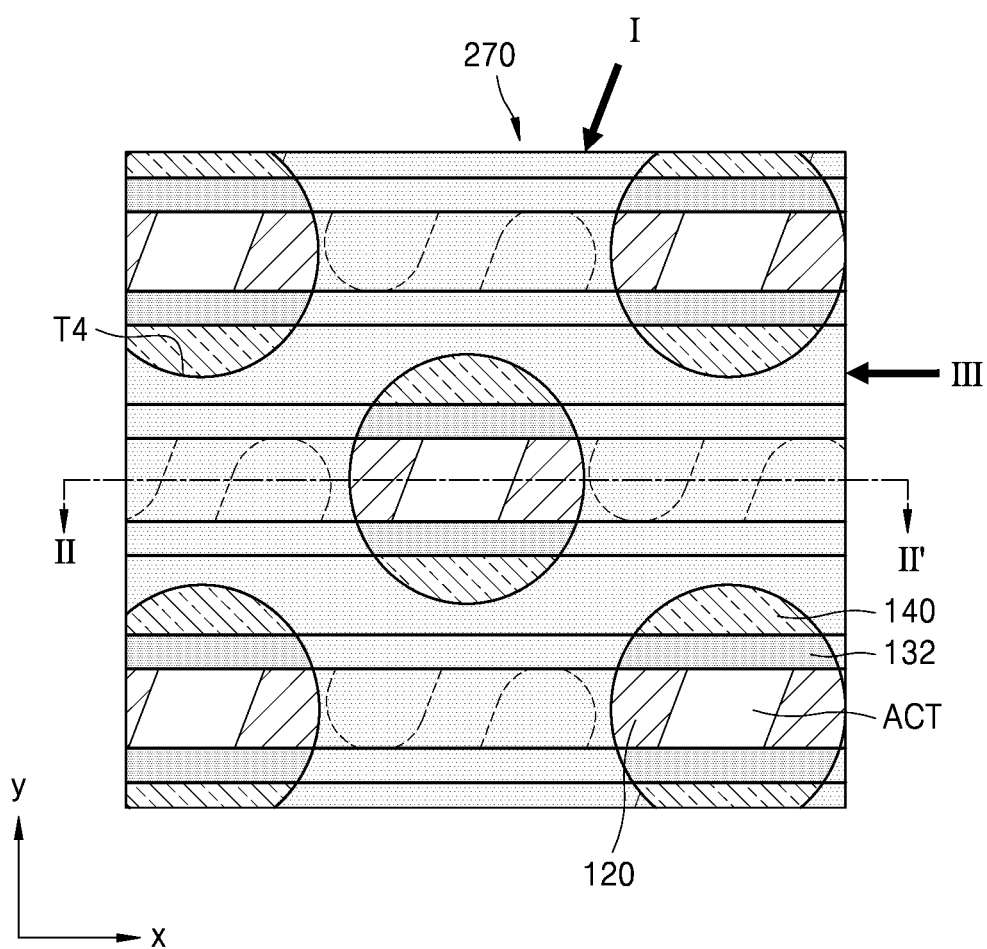

As illustrated in FIG. 12A, the mask pattern 270 may include an open region that exposes a portion corresponding to the center portion of the active region ACT. The center portion of the active region ACT exposed via the open region may correspond to a portion where the first contact 160 is to be formed.

After the mask pattern 270 is formed, by using the mask pattern 270 as an etching mask, the first mask 110 exposed via the open region and the top portion of the active region ACT below the first mask 110 may be removed in an etching process. For example, the etching process may be a dry etching process, and a fourth trench T4 may be formed in the etching process. The fourth trench T4 may have a similar width (e.g., based on only slightly slanted sidewalls) in a bottom and top portions in the first direction (x direction), but may narrow toward the bottom portion in the diagonal direction (x-y direction) in which the active region ACT extends. For example, a width difference in the first direction (x direction) between the width of the fourth trench T4 at a bottom portion at a first vertical height above a bottom-most surface of the trench and the width of the fourth trench T4 at a top portion at a second vertical height higher than the first vertical height may be a first width difference. A width difference in the diagonal direction (x-y direction) between the width of the fourth trench T4 at the bottom portion at the first vertical height above the bottom-most surface of the trench and the width of the fourth trench T4 at the top portion at the second vertical height may be a second width difference, which may be greater than the first width difference.

Figure 12B:
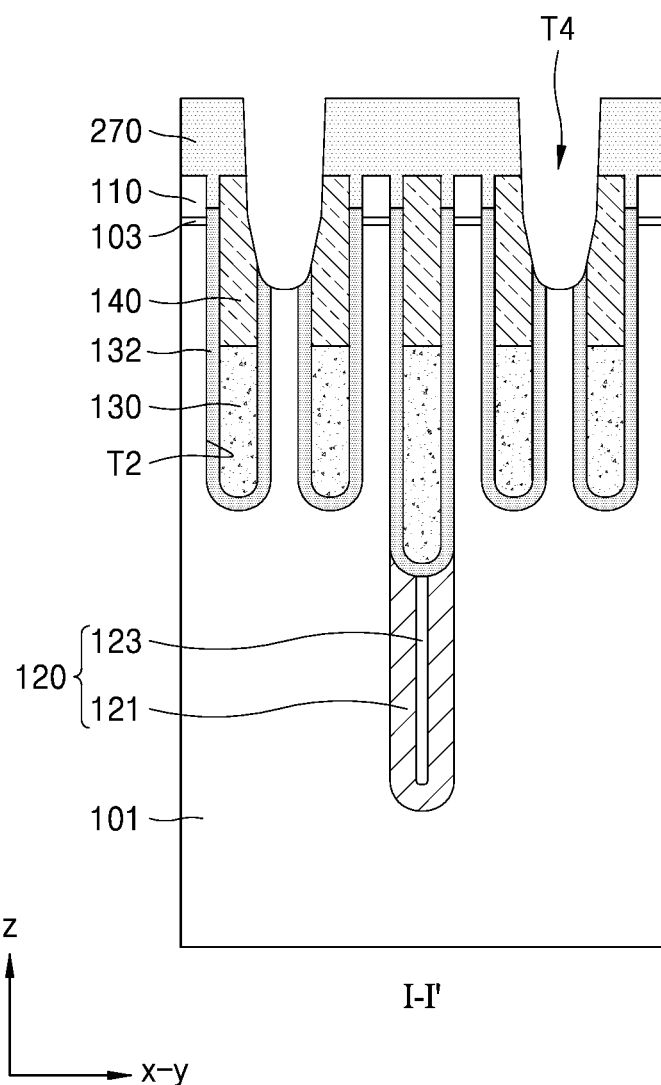
Figure 12C:
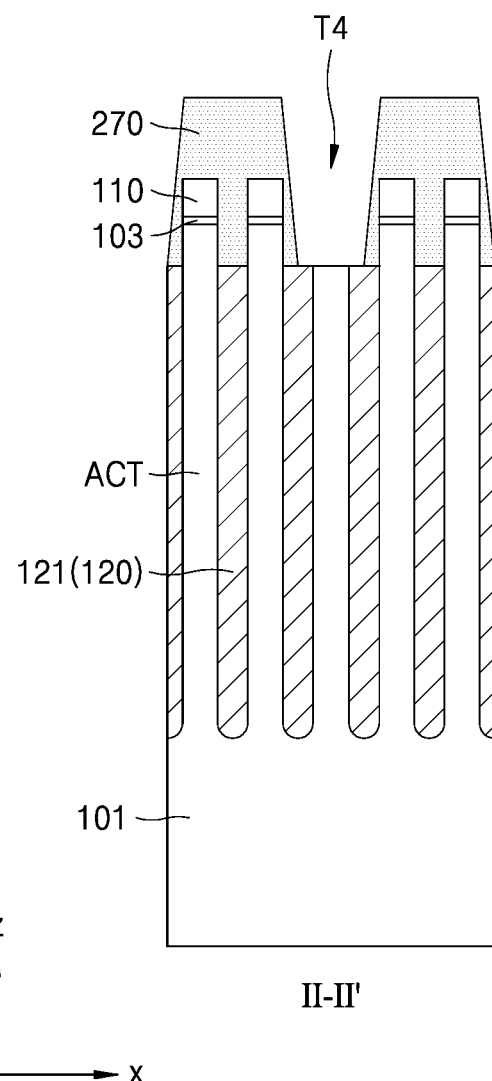
Figure 12D:
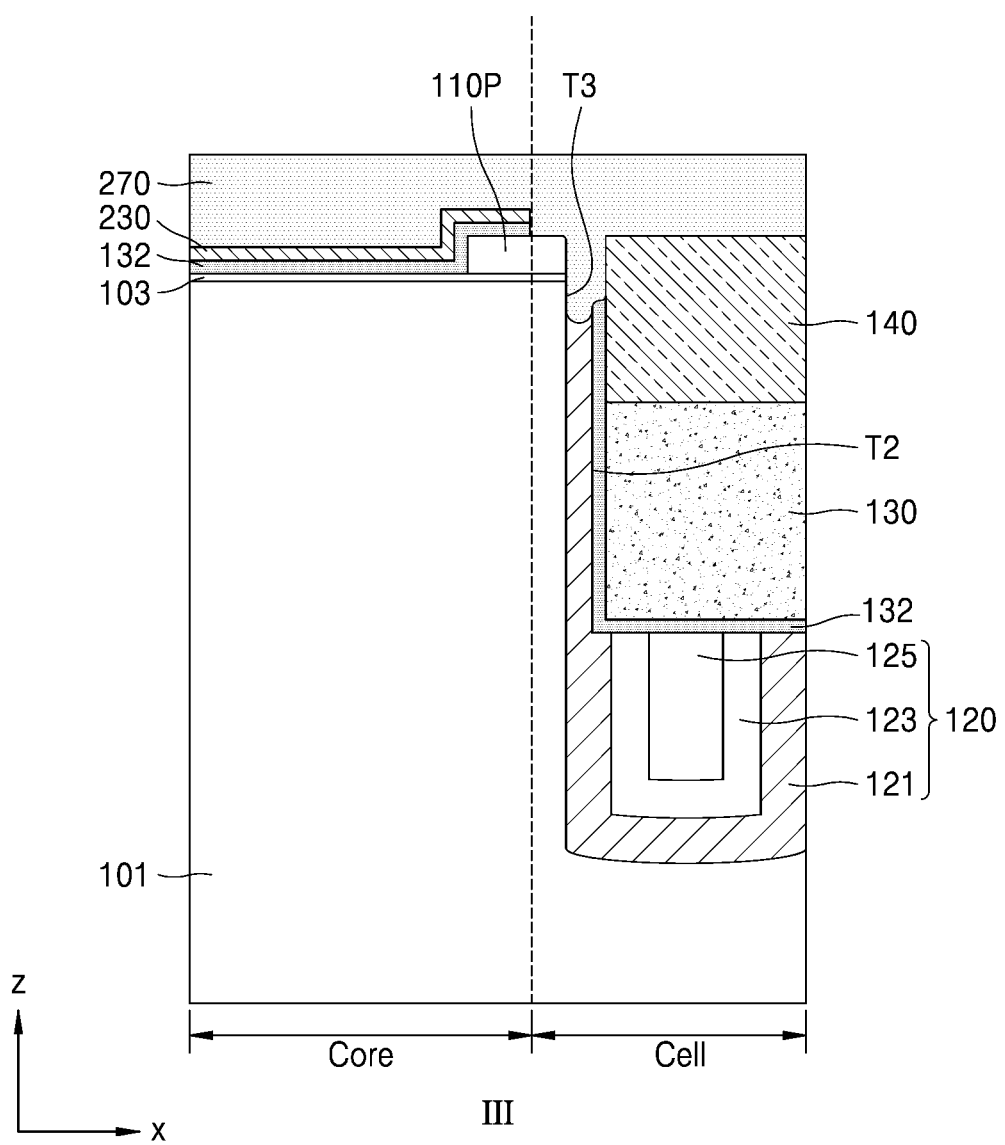
Figure 13A:
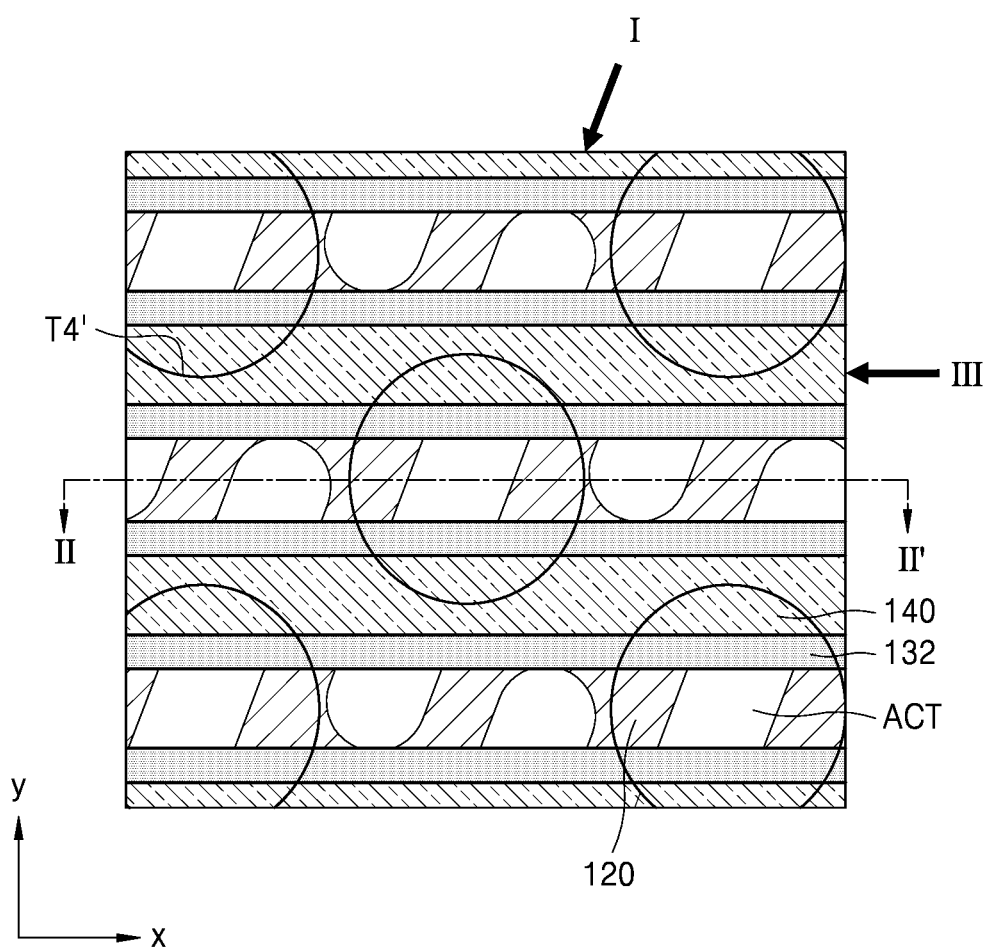
Figure 13B:
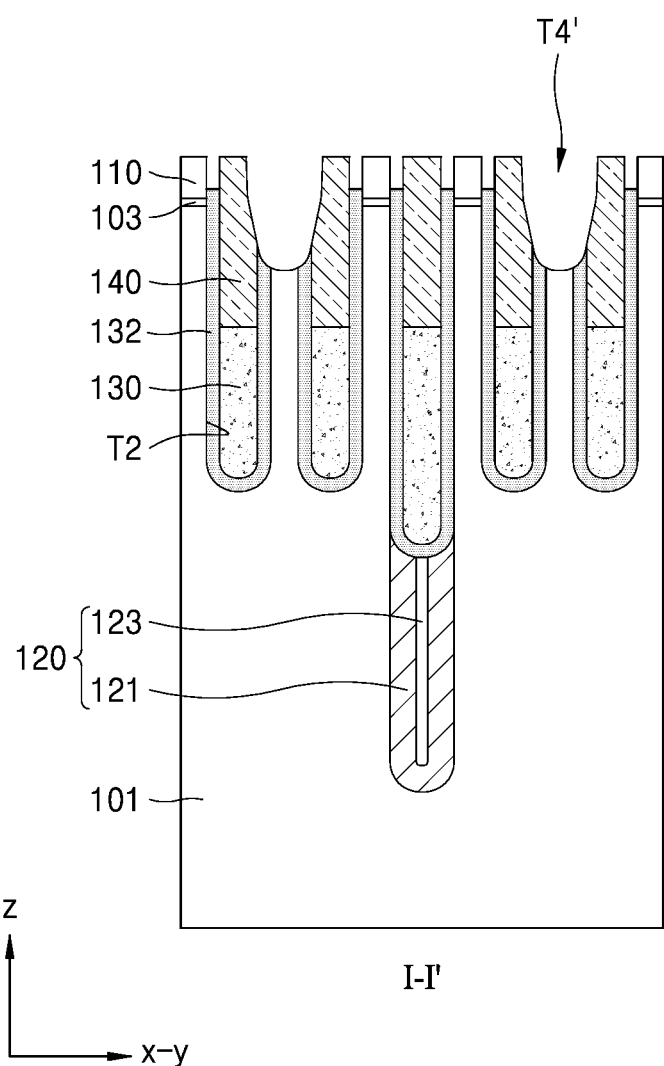
Figure 13C:
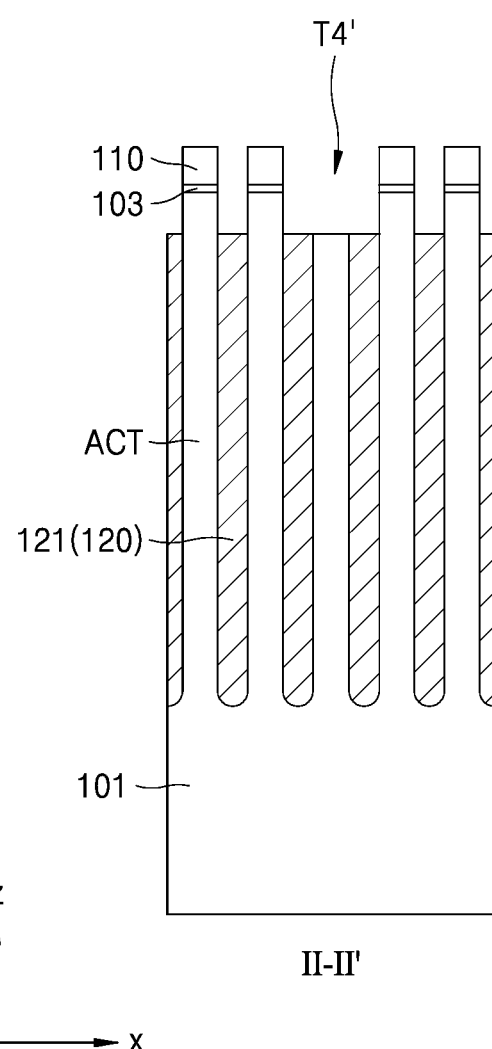
Figure 13D:
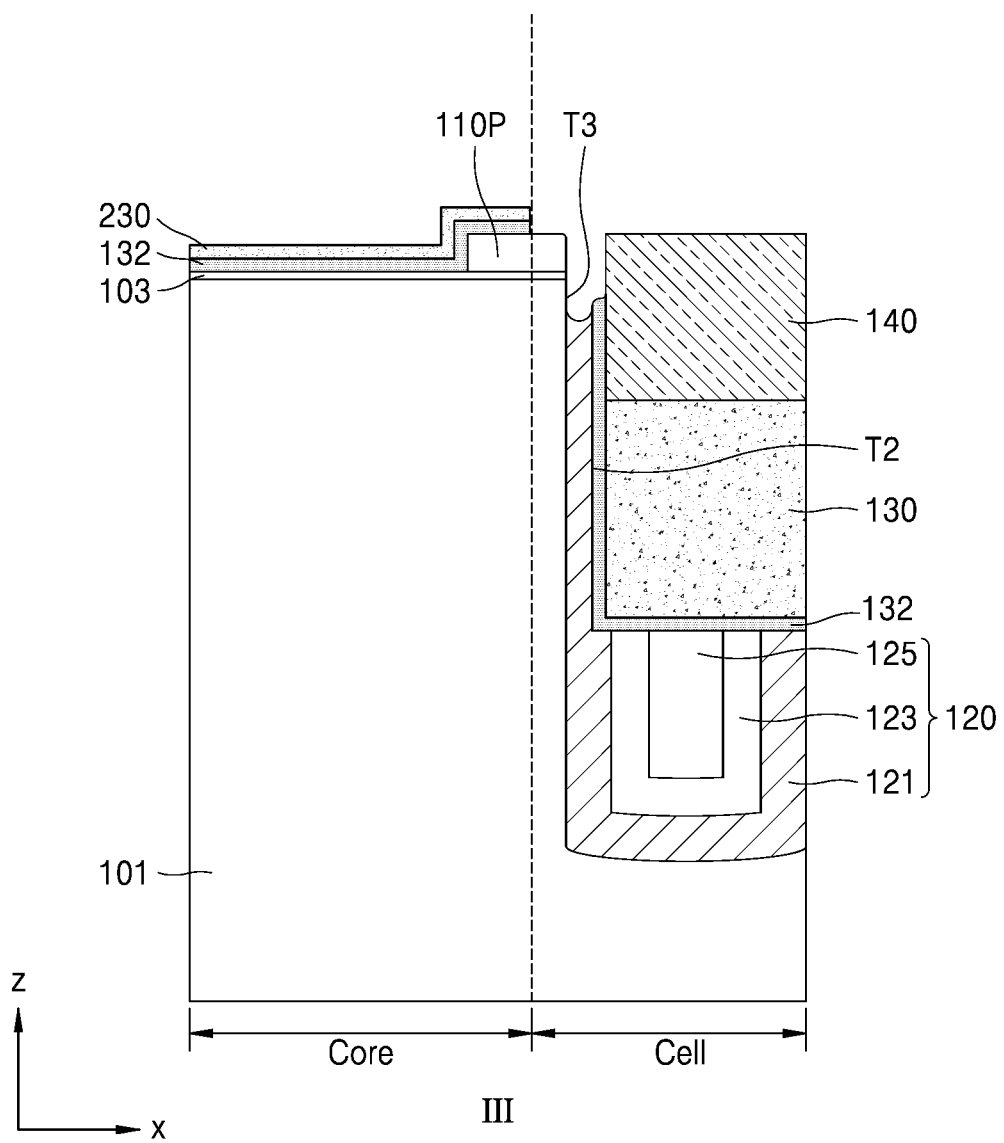

As illustrated in FIG. 12C, the top surface of the active region ACT and a top surface of the device isolation layer 120 may be exposed via the fourth trench T4 in the first direction (x direction). In addition, as illustrated in FIG. 12B, the top surface of the active region ACT, the second mask 140, and the gate insulating layer 132 may be exposed via the fourth trench T4 in the oblique direction (x-y direction). As the fourth trench T4 is formed to have a slope narrowing downward in the oblique direction (x-y direction), the second mask 140 and the gate insulating layer 132 may be exposed to side surfaces, not a bottom-most surface, of the fourth trench T4. The mask pattern 270 may be exposed to the side surfaces of the fourth trench T4 in the first direction (x direction). Side surfaces of the first mask 110 adjacent to the fourth trench T4 and the top portion of the active region ACT under the first mask 110 may be covered by the mask pattern 270.

Depending on a shape of the open region of the mask pattern 270, a shape of the fourth trench T4 and the shape of the first contact 160 to be formed later may be variously changed or selected. For example, when the open region of the mask pattern 270 is formed in a circular shape, the fourth trench T4 and the first contact 160 may be formed in a contact shape having a circular top surface. The shape of the fourth trench T4 may correspond to the shape of the contact hole H1 in FIG. 2. In addition, depending on the shape of the open region of the mask pattern 270, the structure of a fourth trench T4 may correspond to the structures of the contact holes H2 through H4 illustrated in FIGS. 3A through 3C. However, the contact holes H1 through H4 of FIGS. 2 through 3C may, as described below, correspond to the structure of the fourth trench T4' after the mask pattern 270 is removed.

Referring to FIGS. 13A through 13D, after the fourth trench T4 is formed and subsequently, the first mask 110 and the top portions of the active region ACT exposed by the first mask 110 are removed, the mask pattern 270 may be removed. The mask pattern 270 may be easily removed in an ashing process. By removing the mask pattern 270, the fourth trench T4' may have a wider width in the first direction (x direction). For example, as the mask pattern 270 covering the side surfaces of the first mask 110 and the side surfaces of the top portion of the active region ACT under the first mask 110 is removed, a width of the fourth trench T4' may be increased by a thickness of the mask pattern 270 in the first direction (x direction).

For example, when a plurality of active regions ACT are arranged in the first direction (x direction), the fourth trench T4' may have a first width (refer to W1 in FIG. 15C) that corresponds to a distance between the first active region ACT and the third active region ACT in the first direction (x direction). For reference, the width of the fourth trench T4' in the first direction (x direction) may not be entirely related to a size of the open region of the mask pattern 270. For example, when it is possible to remove only the first mask 110 corresponding to the center portion of the active region ACT and the top portion of the active region ACT under the first mask 110 through the open region of the mask pattern 270, regardless of the total size of the open region of the mask pattern 270, after the mask pattern 270 is removed, the fourth trench T4' may have the first width W1 in the first direction (x direction).

Referring to FIGS. 14A through 14D, after the mask pattern 270 is removed, an additional insulating layer may be formed on the entire surface of the substrate 101. The additional insulating layer may include a multiple layer. For example, the additional insulating layer may be formed as a double layer of the first additional insulating layer 152 and a second additional insulating layer 154. In the semiconductor device 100 according to the present example embodiment, the first additional insulating layer 152 may be an oxide layer-based material layer, and the second additional insulating layer 154 may be a nitride layer-based material layer. However, the materials of the first additional insulating layer 152 and the second additional insulating layer 154 are not limited thereto. In addition, the number of layers of the additional insulating layer is not limited to two. However, as described below, the additional insulating layer may include two or more material layers having different selectivity to apply a wet etching process or a pull-back etching process.

Figure 14A:
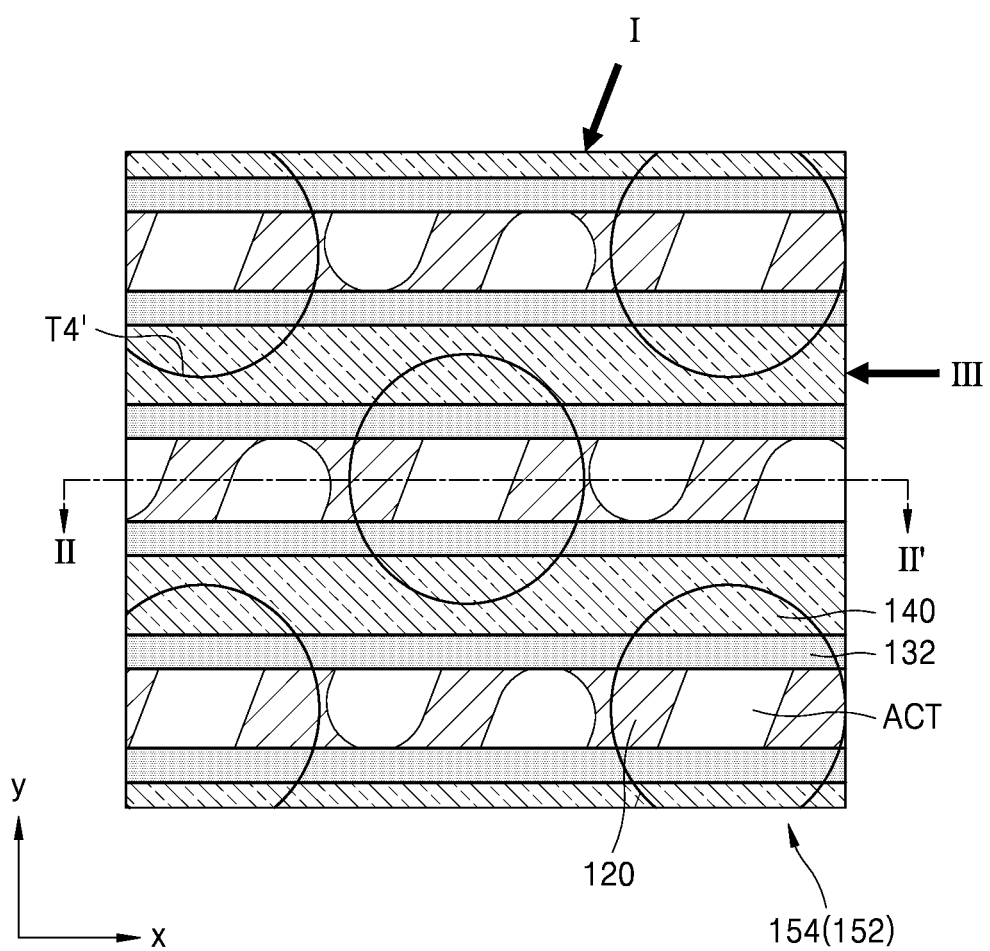
Figure 14B:
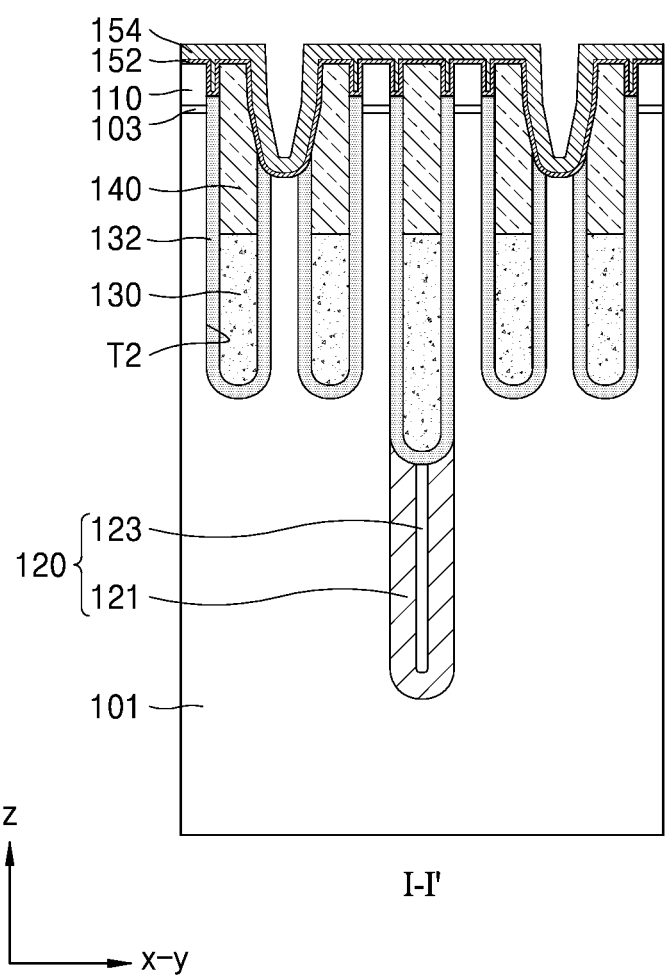
Figure 14C:
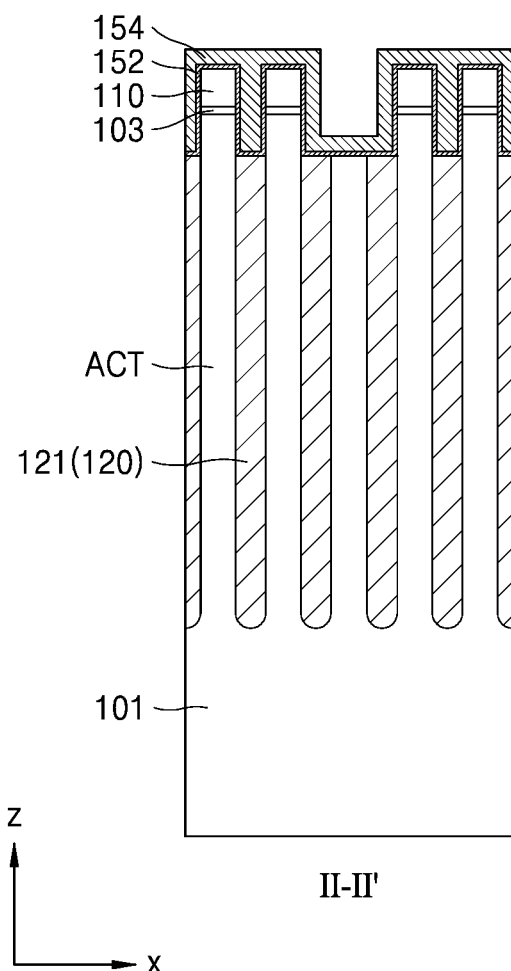
Figure 14D:
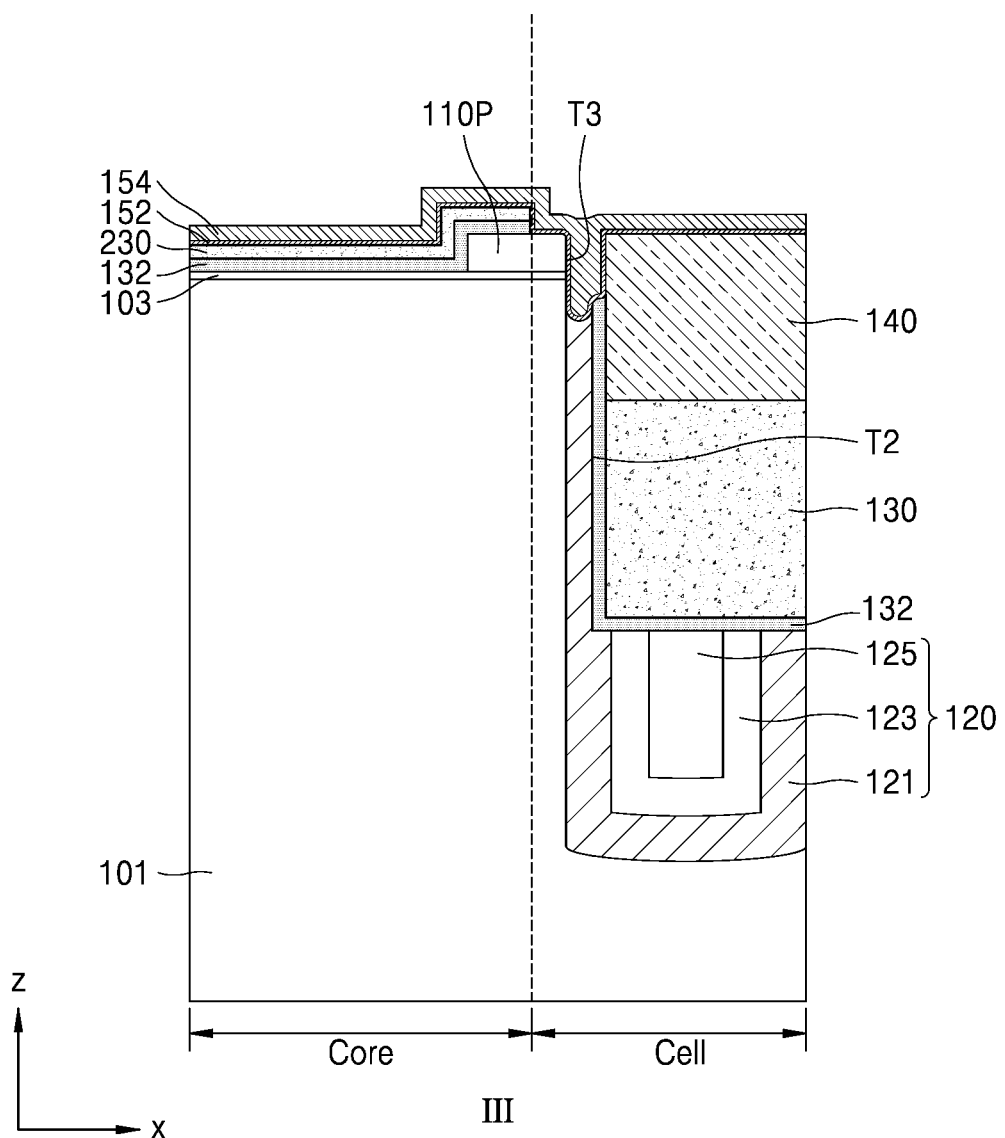

Since the first additional insulating layer 152 and the second additional insulating layer 154 are formed on the entirety of the substrate 101, in FIG. 14A, the components on a bottom portion of the first additional insulating layer 152 may not be seen because they are covered by the first additional insulating layer 152 and the second additional insulating layer 154. However, for convenience of understanding, the components of the first additional insulating layer 152 and the second additional insulating layer 154 are omitted, and corresponding components are illustrated.

Figure 15A:
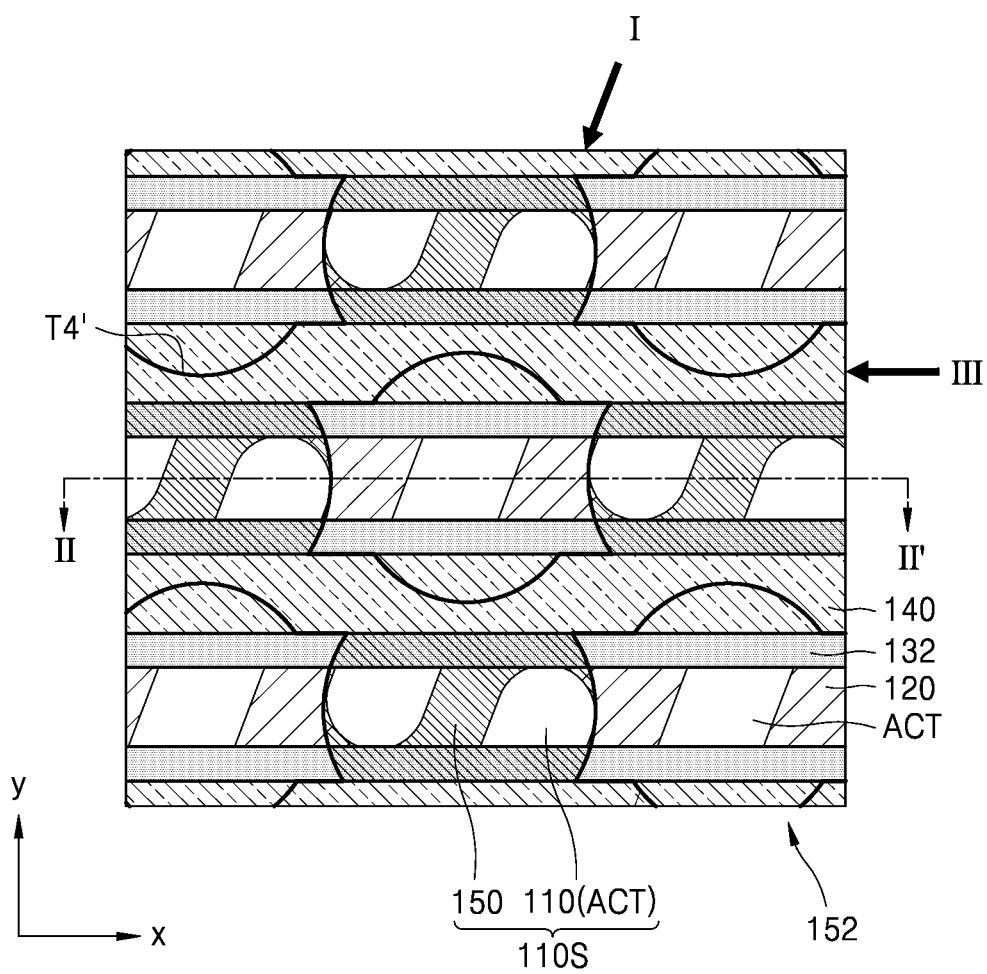
Figure 15B:
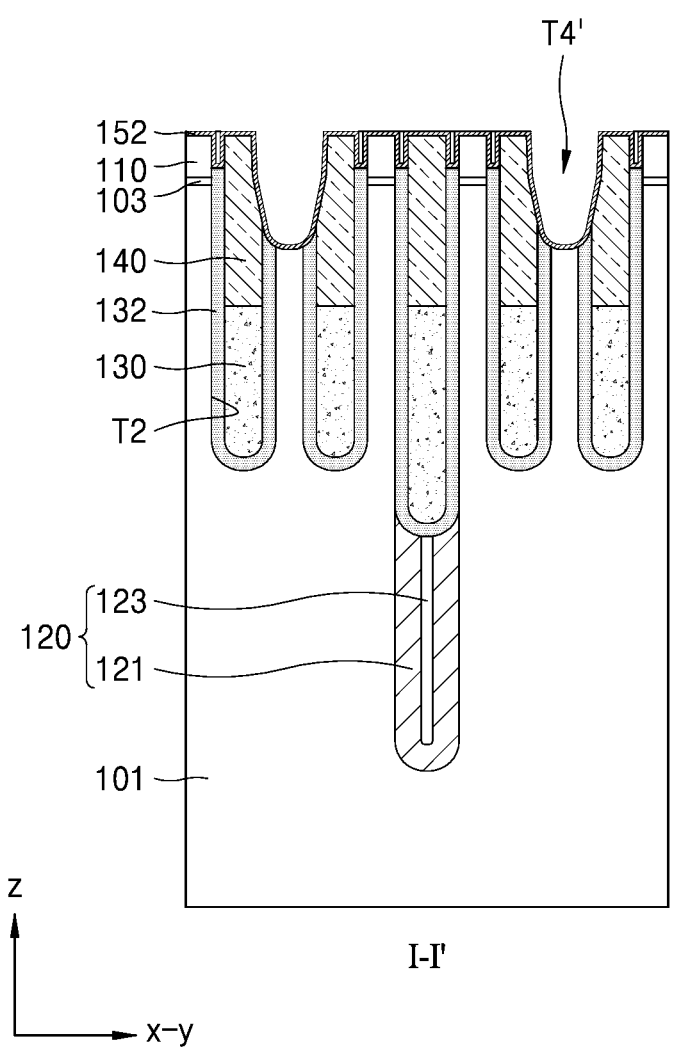

Referring to FIGS. 15A through 15D, after the additional insulating layer is formed, the second additional insulating layer 154 may be removed in a wet etching process. Due to the wet etching characteristics, the portion of the second additional insulating layer 154 that completely fills a narrow portion may not be removed, and only an exposed portion of the second additional insulating layer 154 may be removed. Thus, the portion of the second additional insulating layer 154 filling a space between the two first masks 110 adjacent to each other in the first direction (x direction) may be maintained without being removed. In addition, as illustrated in FIG. 15B, the portion of the second additional insulating layer 154 filling the portion where the gate insulating layer 132 is removed may also be maintained without being removed.

For example, when the first additional insulating layer 152 includes an oxide-based material and the second additional insulating layer 154 includes a nitride-based material, the second additional insulating layer 154 may be removed by a wet etching process using phosphoric acid. The first additional insulating layer 152 may function as an etch stop layer in a wet etching process using phosphoric acid. As a result, the second additional insulating layer 154 may be maintained only between two adjacent first masks 110 and a portion where the gate insulating layer 132 is removed.

A portion of the second additional insulating layer 154 that is not removed but remains may be referred to as the buffer insulating layer 150. As illustrated in FIG. 15A, the buffer insulating layer 150 may constitute the first mask structure 110S together with the first mask 110. When views in a plan view, the first mask structure 110S may include two first masks 110 and a buffer insulating layer 150 therebetween in the first direction (x direction), and include the first mask 110 and the buffer insulating layers 150 outside of both sides of the first mask 110 in the second direction (y direction). When the first contact 160 is formed, the first mask structure 110S may be used for self-alignment with respect to the active region ACT together with the second mask 140. In addition, when the buffer insulating layer 150 is formed, the gap fill insulating layer 155 may be formed by the second additional insulating layer 154 that fills the third trench T3 at the boundary between the core region Core and the cell region Cell.

The gap fill insulating layer 155 may have a shape corresponding to that of the third trench T3. As described above, the third trench T3 may be formed during the process of removing the device isolation layer 120 by using the first mask 110 and the second mask 140 as a mask, and may be removed together with a portion of the gate insulating layer 132 adjacent to the device isolation layer 120. However, the device isolation layer 120 may be deeply etched due to the difference in etch rates. Accordingly, the gap fill insulating layer 155 may have a shape in which a portion thereof corresponding to the gate insulating layer 132 is higher than a portion thereof corresponding to the device isolation layer 120 on a bottom surface thereof.

Since the first additional insulating layer 152 is still maintained throughout the substrate 101, in FIG. 15A, components under the first additional insulating layer 152 may be covered by the first additional insulating layer 152 and may not be seen. However, for convenience of understanding, the first additional insulating layer 152 is omitted and the corresponding components are illustrated.

Referring to FIGS. 16A through 16D, after the first mask structure 110S is formed, a pre-cleaning process may be performed on the entire surface of the substrate 101. The first additional insulating layer 152 covering the entire surface of the substrate 101 may be removed in the pre-cleaning process. Of course, the first additional insulating layer 152 on a side surface and a bottom surface of the buffer insulating layer 150 may be maintained without being removed.

Thereafter, a conductive layer for forming the first contact 160 may be formed on the entire surface of the substrate 101. The conductive layer may include, for example, polysilicon. However, the material of the conductive layer is not limited thereto. The conductive layer may completely fill the fourth trench T4', and may be formed on the first mask structure 110S and the second mask 140 with a certain thickness. Next, a planarization process for the conductive layer may be performed, and by maintaining the conductive layer only inside the fourth trench T4', the first contact 160 may be formed. In the planarization process, the first mask structure 110S and the second mask 140 may function as an etch stop layer.

As described above, the first contact 160 may, by using the first mask structure 110S and the second mask 140 formed in advance, be formed in a shape in which the first contact 160 is self-aligned to the active region ACT, for example, the center portion of the active region ACT. Accordingly, the first contact 160 may reduce misalignment with the active region ACT, and thus, may accurately contact the center portion of the active region ACT.

After the first contact 160 is formed, the pass conductive layer (refer to 165 in FIG. 1B) may be formed to extend in the second direction (y direction). The pass conductive layer 165 may be electrically connected to the first contact 160 thereunder. In the case where the first contact 160 is formed through the contact holes H2 and H4 as illustrated in FIG. 3A or 3C, when the pass conductive layer 165 is formed, the first contacts 160 adjacent to each other in the diagonal direction may be insulated from each other. The first contact 160 and the pass conductive layer 165 may be formed in various layered structures, and more detailed description thereof is provided later with reference to FIGS. 17A through 17C.

After the pass conductive layer 165 is formed, the bit line (170 in FIG. 1B) may be formed on the pass conductive layer 165. In addition, the cap insulating layer 172 may be formed on the bit line 170, and bit line spacers 174 may be formed on both (e.g., opposite) sides of the bit line 170 in the first direction (x direction). The second contact 180 connected to the active region ACT may be formed, and the fence insulating layers 185 may be formed on the side surfaces of the second contact 180 in the second direction (y direction). The landing pad 190 may be formed on the second contact 180, and a capacitor (not illustrated) may be formed on the landing pad 190.

A gate structure 300 of a planar shape may be formed at the core region Core or an outer portion of the cell region Cell. The gate structure (300 in FIG. 1D) of the planar shape may include an electrode structure (310 in FIG. 1D), a planar gate insulating layer (320 in FIG. 1D), a gate spacer (330 in FIG. 1D), and a gate cap insulating layer (350 in FIG. 1D). In addition, the electrode structure 310 may include three electrode layers (312, 314, and 316 in FIG. 1D). However, the number of the electrode layers of the electrode structure 310 is not limited thereto. Meanwhile, conductive layers (190A and 190B in FIG. 1D) may be formed on the gate structure 300.

In addition, when the electrode structure 310 of the gate structure 300 includes polysilicon, according to an example embodiment, a process of forming the electrode structure 310 of the gate structure 300 of the core region Core and a process of forming components including polysilicon in the cell region Cell may be performed simultaneously. However, even when the processes are performed together, thicknesses of the corresponding layers may be identical to or different from each other. For example, the pass conductive layer 165 of the cell region Cell and the second electrode layer 314 of the electrode structure 310 of the core region Core may be formed together. Accordingly, the pass conductive layer 165 and the second electrode layer 314 of the electrode structure 310 may include the same material. However, the pass conductive layer 165 and the second electrode layer 314 may be formed to have the same thickness or different thicknesses.

Figure 17A:
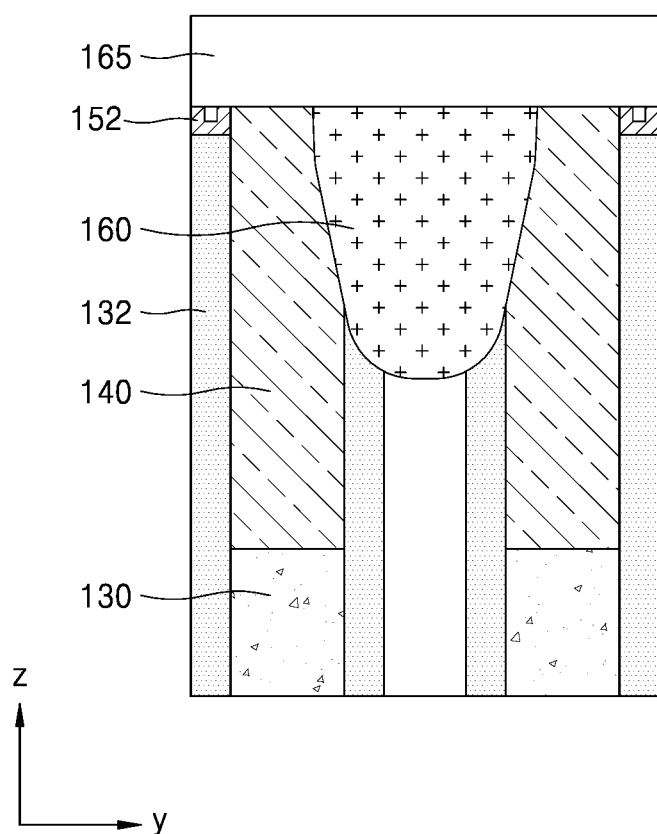
FIGS. 17A through 17C are cross-sectional views illustrating various layered structures of a first contact and a pass conductive layer in the semiconductor device of FIG. 1A.
Figure 17B:
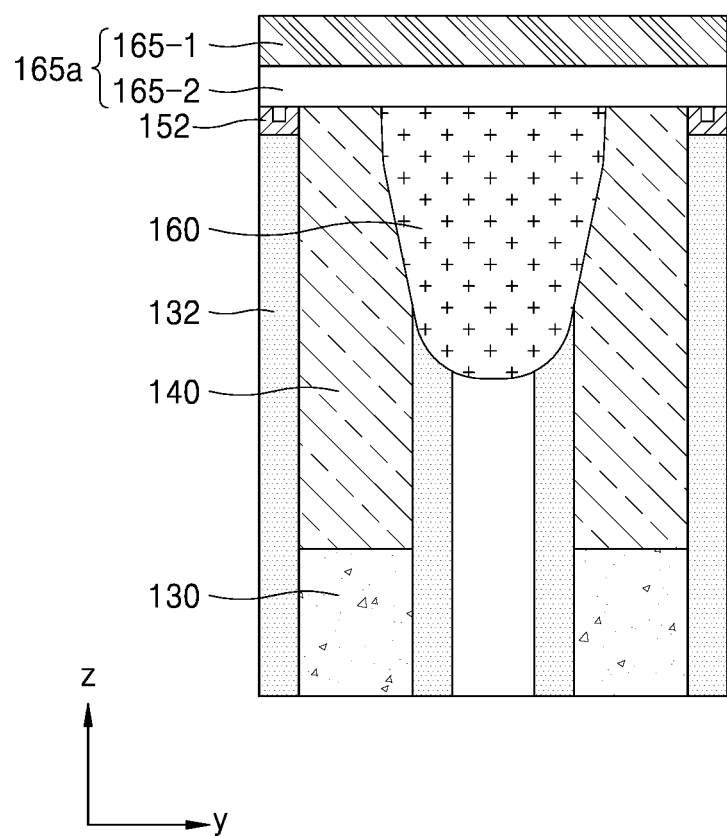
Figure 17C:
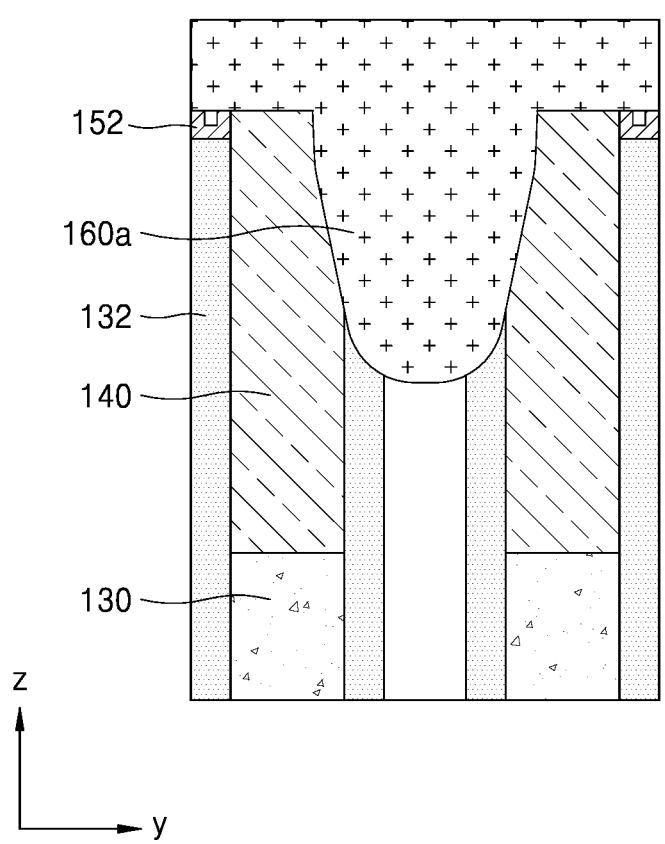

FIGS. 17A through 17C are cross-sectional views illustrating various layered structures of the first contact 160 and the pass conductive layer 165 in the semiconductor device 100 of FIG. 1A, and are cross-sectional views taken along line IV-IV' in FIG. 1A.

Referring to FIGS. 17A through 17C, the first contact 160 and the pass conductive layer 165 may be formed in various layered structures. For example, as illustrated in FIG. 17A, the first contact 160 and the pass conductive layer 165 may include two different conductive layers and may have double layer structures. In addition, as illustrated in FIG. 17B, a pass conductive layer 165a may have a structure in which two conductive layers (165-1 and 165-2) are stacked. Accordingly, the first contact 160 and the pass conductive layer 165a may have a triple layer structure. The pass conductive layer 165a is not limited thereto, and may include three or more conductive layers.

The first contact 160 and the pass conductive layer 165 may have a mono block structure including one conductive layer, as illustrated in FIG. 17C. When the first contact 160 is formed, after the conductive layer is formed with a relatively large thickness, and after a planarization process is performed such that a certain thickness is maintained on the first mask structure 110S and the second mask 140, the mono block structure may be implemented in a process of patterning the pass conductive layer 165.

Although three structures have been exemplified above for the layered structure of the first contact 160 and the pass conductive layer 165, the layered structure of the first contact 160 and the pass conductive layer 165 may have more various structures. In addition, when the layered structure of the first contact 160 and the pass conductive layer 165 is formed, the layered structure may be formed together with the conductive layers in the gate structure 300 of the core region Core or may be formed separately.

Figure 15C:
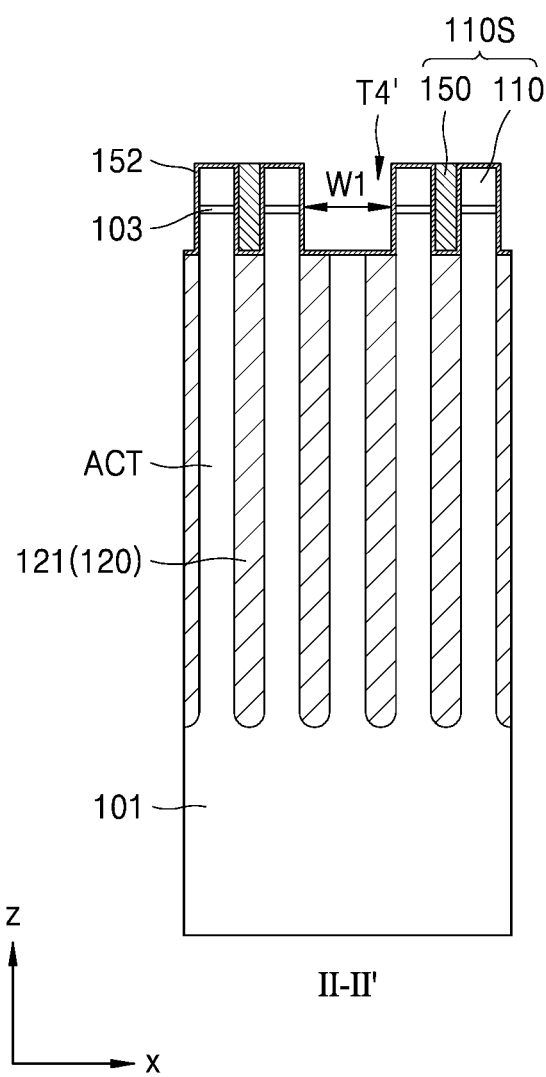
Figure 15D:
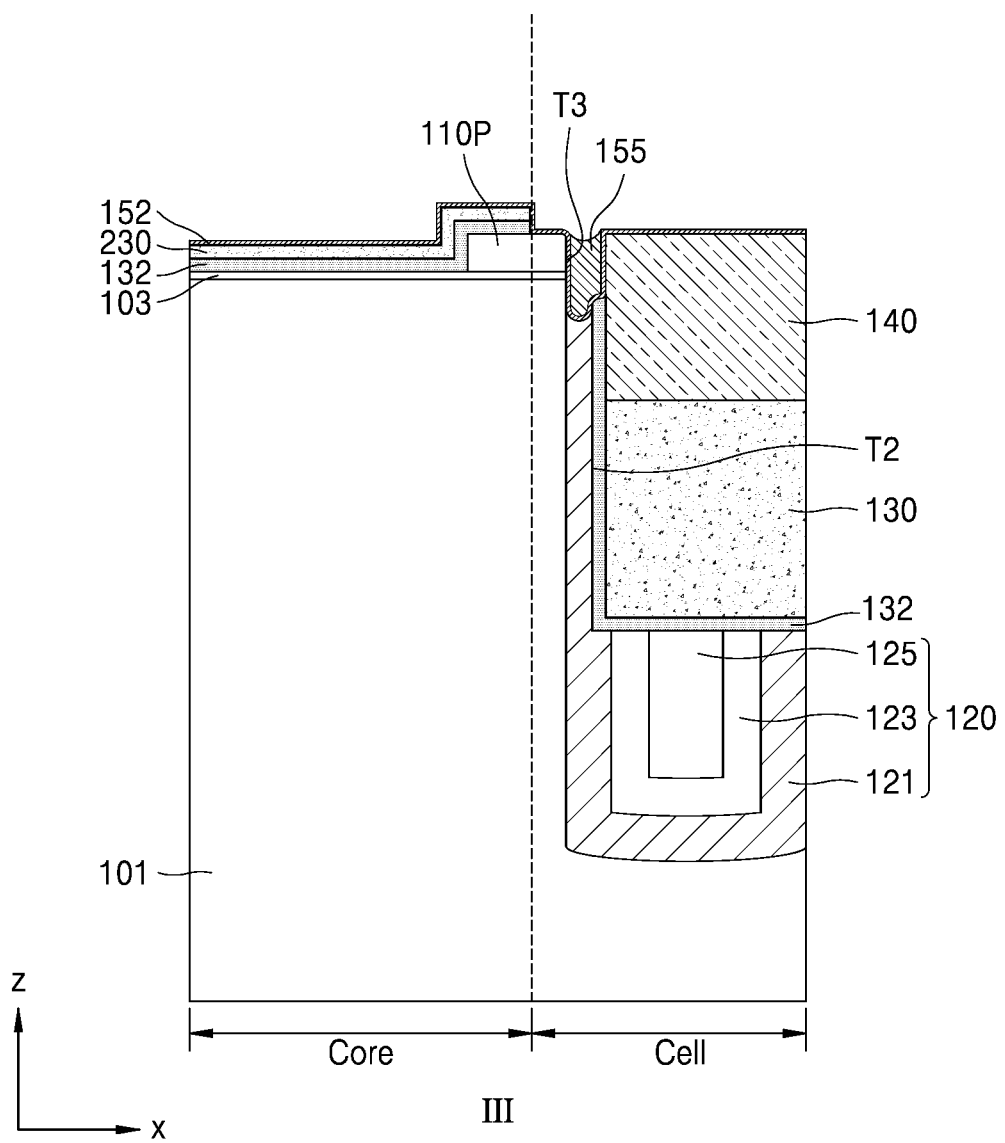
Figure 18A:
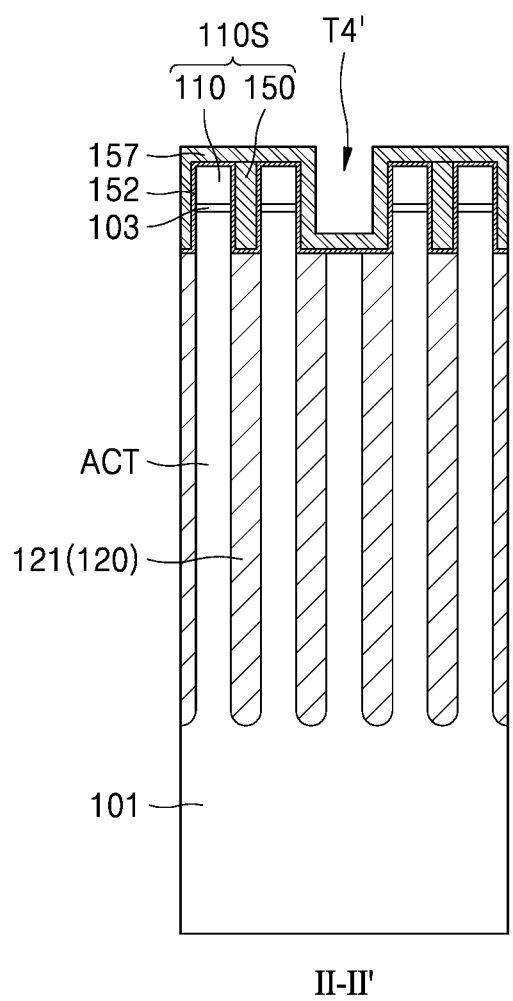
FIGS. 18A and 18B are cross-sectional views illustrating a process of manufacturing a semiconductor device, according to embodiments of the inventive concept.
Figure 18B:
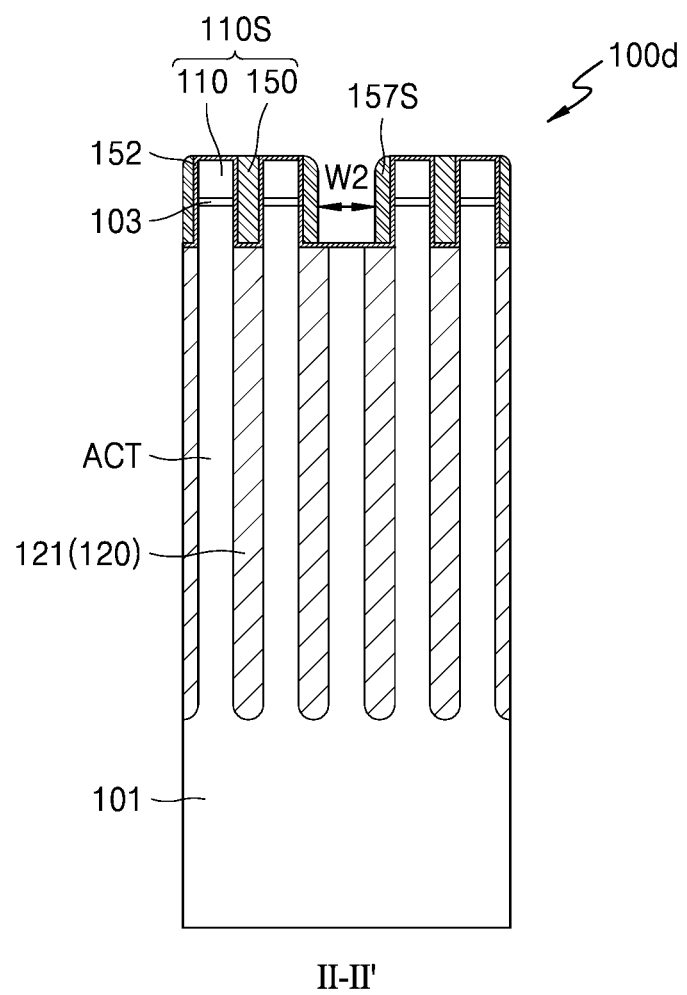

FIGS. 18A and 18B are cross-sectional views illustrating a process of manufacturing a semiconductor device 100d, according to an embodiment of the inventive concept, and are cross-sectional views corresponding to FIG. 15C. The descriptions already given with reference to FIGS. 4A through 16D are briefly provided or omitted.

Referring to FIG. 18A, in a method of manufacturing the semiconductor device 100d according to the present example embodiment, in FIGS. 15A through 15D, after the second additional insulating layer 154 is removed in a wet etching and the buffer insulating layer 150 is formed, the third additional insulating layer 157 may be further formed on the entire surface of the substrate 101. The third additional insulating layer 157 may cover a top surface of the first mask structure 110S and the inside of the fourth trench T4'.

Referring to FIG. 18B, after the third additional insulating layer 157 is formed, the spacer 157S may be formed on the side surfaces of the first mask structure 110S in an etching process, for example, a dry etching process. In the process of forming the spacer 157S, both the third additional insulating layers 157 on the top surface of the first mask structure 110S and on a bottom portion of the fourth trench T4' may be removed. Thus, the first additional insulating layer 152 may be exposed on the top surface of the first mask structure 110S and the bottom surface of the fourth trench T4'.

Thereafter, as described in the description with respect to FIGS. 16A through 16D, the first contact 160 may be formed by performing the pre-cleaning process, the electrode film forming process, and the planarization process. Due to the presence of the spacer 157S, the width of the fourth trench T4' in the first direction (x direction) may be reduced to the second width W2, and accordingly, the width of the first contact 160 in the first direction (x direction) may be reduced. As a result, the width of the first contact 160 in the first direction (x direction) may be adjusted based on the thicknesses of the third additional insulating layer 157 and a subsequent thickness of the spacer 157S.

While the inventive concept has been particularly shown and described with reference to embodiments thereof, it will be understood that various changes in form and details may be made therein without departing from the spirit and scope of the following claims.

What is claimed is:

1. A semiconductor device comprising:
an active region defined by a device isolation layer formed in a substrate;
a word line configured to cross the active region, the word line extending in a first direction and being formed in the substrate;
a bit line extending in a second direction perpendicular to the first direction on the word line;
a first contact connecting the bit line to the active region;
a first mask for forming the active region, the first mask being formed on the active region; and
a second mask of which a height of a top surface thereof is equal to or greater than a height of a top surface of the active region, the second mask covering the word line,
wherein the active region has a bar shape that extends in an oblique direction to form an acute angle with respect to the first direction.

2. The semiconductor device of claim 1, wherein:
the first contact has a shape in which a width in the oblique direction narrows toward a bottom portion of the first contact.

3. The semiconductor device of claim 1, further comprising:
an additional first mask for forming an additional active region, the additional first mask being formed on the additional active region; and
a buffer insulating layer on the device isolation layer between the first mask and the additional first mask, which are adjacent masks in the first direction.

4. The semiconductor device of claim 3, wherein:
the semiconductor device comprises a cell region in which a plurality of active regions having the bar shape are disposed, and a core region around the cell region,
at a boundary between the cell region and the core region,
a protrusion insulating layer corresponding to the first mask and a gap fill insulating layer corresponding to the buffer insulating layer are arranged adjacent to each other,
the protrusion insulating layer is formed on the substrate and has a concave shape on a portion of a top surface thereof, and
the gap fill insulating layer is formed on the device isolation layer and a gate insulating layer, wherein a bottom surface of the gap fill insulating layer on the gate insulating layer is higher than a bottom surface of the gap fill insulating layer on the device isolation layer.

5. The semiconductor device of claim 3, further comprising a spacer covering side surfaces of the first mask and the active region under the first mask.

6. The semiconductor device of claim 3, further comprising a second contact penetrating the first mask adjacent to the buffer insulating layer, the second contact being connected to the active region,
wherein the active region is connected to a capacitor above the bit line via the second contact.

7. The semiconductor device of claim 3, wherein:
the buffer insulating layer is also arranged on a gate insulating layer adjacent to the device isolation layer and the active region in the second direction, and
the first mask, the additional first mask, and the buffer insulating layer constitute a first mask structure.

8. The semiconductor device of claim 1, wherein:
the first contact, when viewed from a top surface thereof, has any one shape of a circular type, an elliptical type, a parallelogram type, and a line type.

9. The semiconductor device of claim 8, wherein the first contact, when viewed from a top surface thereof, has one of the following shapes:
a circular type or an elliptic type shape,
a shape concaved inwardly at both ends in the first direction,
a shape that extends in an extending direction of the active region while extending to a portion of the word line in two opposite directions, and
a shape that extends in the extending direction of the active region while extending to cover an entirety of two word lines in the second direction.

10. The semiconductor device of claim 1, further comprising a pass conductive layer extending in the second direction while covering the first contact,
wherein the pass conductive layer is integrally formed with the first contact or is formed as a layer separate from the first contact.

11. The semiconductor device of claim 10, wherein:
the semiconductor device comprises a cell region in which the active region of the bar shape is included and a core region around the cell region, and
a transistor in the core region comprises a gate electrode layer corresponding to the pass conductive layer.

12. A semiconductor device comprising:
an active region defined by a device isolation layer formed in a substrate;
a word line configured to cross the active region, the word line including a buried structure extending in a first direction;
a bit line extending in a second direction perpendicular to the first direction on the word line;
a first contact connecting the bit line to the active region;
a second contact connecting the active region to a capacitor above the bit line;
a first mask for forming the active region, at least a portion of the first mask remaining on the active region; and a second mask of which a height of a top surface thereof is equal to or greater than a top surface of the active region, the second mask covering the word line, wherein the active region has a shape extending in an oblique direction with respect to the first direction, and the first contact has a shape in which a width in the oblique direction narrows toward a bottom portion of the first contact.

13. The semiconductor device of claim 12, further comprising a buffer insulating layer on the device isolation layer between the first mask and an additional first mask adjacent to the first mask in the first direction, wherein the buffer insulating layer is one of a plurality of buffer insulating layers alternately arranged with a plurality of first contacts in the first direction and the second direction, the second contact is arranged between the first contact and the buffer insulating layer in the first direction, and the word line is arranged between the first contact and the buffer insulating layer in the second direction.

14. The semiconductor device of claim 12, wherein:

the first contact, when viewed from a top surface thereof, has any one shape of a circular type, an elliptical type, a parallelogram type, and a line type.

15. The semiconductor device of claim 12, further comprising a pass conductive layer extending in the second direction while covering the first contact, wherein the pass conductive layer is integrally formed with the first contact or is formed as a layer separate from the first contact.

16. The semiconductor device of claim 12, further comprising:

a bit line spacer covering opposite side surfaces of the bit line in the first direction, and a fence insulating layer covering opposite side surfaces of the second contact in the second direction.

\* \* \* \* \*